(12) United States Patent
Kenney et al.

(10) Patent No.: US 11,193,722 B2
(45) Date of Patent: Dec. 7, 2021

(54) HEAT EXCHANGER WITH MULTI-ZONE HEAT TRANSFER SURFACE

(71) Applicant: Dana Canada Corporation, Oakville (CA)

(72) Inventors: Benjamin A. Kenney, Toronto (CA); Benjamin M. Lowry, Almonte (CA); Andreas Michalke, Ulm (DE); Robert Blersch, Baltringen (DE); Harald Rebien, Neu-Ulm (DE)

(73) Assignee: Dana Canada Corporation, Oakville (CA)

( * ) Notice: Subject to any disclaimer, the term of this patent is extended or adjusted under 35 U.S.C. 154(b) by 240 days.

(21) Appl. No.: 16/400,577

(22) Filed: May 1, 2019

(65) Prior Publication Data

US 2019/0360766 A1  Nov. 28, 2019

Related U.S. Application Data

(60) Provisional application No. 62/665,236, filed on May 1, 2018, provisional application No. 62/748,071, filed on Oct. 19, 2018.

(51) Int. Cl.
*F28F 7/00* (2006.01)
*F28F 3/02* (2006.01)

(52) U.S. Cl.
CPC .......... *F28F 3/027* (2013.01); *F28F 2210/10* (2013.01)

(58) Field of Classification Search
CPC ......... F28F 3/025; F28F 3/027; F28F 2210/10
(Continued)

(56) References Cited

U.S. PATENT DOCUMENTS 2,360,123 A * 10/1944 Gerstung ............... F01M 5/007
165/298
3,542,124 A * 11/1970 Bridgnell ................ F28F 3/027
165/166
(Continued)

FOREIGN PATENT DOCUMENTS

WO     2006100690      9/2006

OTHER PUBLICATIONS

Canadian Intellectual Property Office, International Search Report and Written Opinion in Application No. PCT/CA2019/050569, dated Jul. 24, 2019, 8 pages, Gatineau, Quebec, Canada.

*Primary Examiner* — Claire E Rojohn, III
(74) *Attorney, Agent, or Firm* — Ridout and Maybee LLP

(57) ABSTRACT

A heat exchanger with a multi-zone heat transfer surface is disclosed. The heat exchanger includes a fluid flow passage extending between and interconnecting a fluid inlet and a fluid outlet. A heat transfer surface is disposed within the fluid flow passage wherein the heat transfer surface includes at least one heat transfer-reducing zone disposed in thermal contact with a portion of at least one of the walls of the fluid flow passage and at least one heat transfer-augmenting zone disposed in thermal contact with a portion of the at least one of the walls of the fluid flow passage. The configuration of the heat transfer-augmenting zones with the heat-transfer-reducing zones is such that heat transfer across the surface of the heat exchanger in contact with the heat transfer-augmenting zones is increased relative to the heat transfer across the surface of the heat exchanger in contact with the heat transfer-reducing zones.

24 Claims, 34 Drawing Sheets
(5 of 34 Drawing Sheet(s) Filed in Color)

(58) Field of Classification Search
USPC .......................................................... 165/80.4
See application file for complete search history.

(56) References Cited

U.S. PATENT DOCUMENTS

| | | | | |
|---|---|---|---|---|
| 3,612,494 A * | 10/1971 | Toyama | ................... | B01J 19/32 261/102 |
| 3,768,149 A * | 10/1973 | Swaney, Jr. | ............. | B23P 15/26 29/527.2 |
| 4,705,105 A * | 11/1987 | Cur | ......................... | F28F 1/325 165/151 |
| 4,804,041 A * | 2/1989 | Hasegawa | ............. | F28D 1/0366 165/166 |
| 4,923,002 A * | 5/1990 | Haussmann | .............. | F28F 1/32 165/151 |
| 5,107,922 A * | 4/1992 | So | ........................ | F28F 1/105 165/109.1 |
| 5,625,229 A * | 4/1997 | Kojima | ................... | F28F 3/025 257/712 |
| 6,032,503 A * | 3/2000 | Grippe | ................... | B21D 13/04 72/186 |
| 6,273,183 B1 * | 8/2001 | So | ........................ | F28D 1/0333 165/109.1 |
| 6,415,855 B2 * | 7/2002 | Gerard | ................... | F28F 3/027 165/166 |
| 6,457,514 B1 * | 10/2002 | Fumi | ..................... | H01L 23/473 165/170 |
| 6,983,790 B2 * | 1/2006 | Ippoushi | ............. | F28D 15/0233 165/104.13 |
| 7,063,047 B2 * | 6/2006 | Reinke | ................... | F28D 9/005 122/31.1 |
| 7,218,519 B2 * | 5/2007 | Prasher | ................ | H01L 23/473 165/104.33 |
| 7,686,070 B2 * | 3/2010 | Chu | ........................ | F28F 3/025 165/109.1 |
| 8,418,752 B2 * | 4/2013 | Otahal | ................... | F28F 13/12 165/109.1 |
| 8,474,516 B2 * | 7/2013 | Valenzuela | ............... | F28F 3/12 165/166 |
| 8,541,875 B2 * | 9/2013 | Bennion | ................ | H01L 23/36 257/706 |
| 9,291,403 B2 * | 3/2016 | Hisanaga | ............. | B21C 37/225 |
| 9,502,330 B1 | 11/2016 | Gupta | | |
| 9,721,871 B2 * | 8/2017 | Frey | ........................ | H01L 24/17 |
| 10,094,624 B2 * | 10/2018 | Somhorst | ................ | F28F 1/128 |
| 10,220,431 B2 * | 3/2019 | Mitsukawa | ............ | B21D 13/08 |
| 10,371,465 B2 * | 8/2019 | Richter | ................... | F28F 1/128 |
| 10,422,588 B2 * | 9/2019 | Smith | ..................... | F25B 39/00 |
| 10,823,511 B2 * | 11/2020 | Vargas | .................. | F28D 9/0093 |
| 10,962,307 B2 * | 3/2021 | Takahashi | ................ | F28F 3/027 |
| 2001/0011586 A1 * | 8/2001 | Yamaguchi | .......... | B21D 31/046 165/109.1 |
| 2002/0011331 A1 * | 1/2002 | Lehman | ................ | F28D 9/0068 165/166 |
| 2002/0162646 A1 * | 11/2002 | Haasch | ................. | F28F 3/027 165/109.1 |
| 2003/0066635 A1 * | 4/2003 | Rhodes | ............... | F28D 1/05366 165/148 |
| 2005/0087330 A1 * | 4/2005 | Kang | ........................ | F02C 7/08 165/166 |
| 2008/0011464 A1 * | 1/2008 | Oofune | ................ | F02M 26/38 165/157 |
| 2008/0202731 A1 * | 8/2008 | Brunner | ................ | F28F 3/027 165/109.1 |
| 2008/0230212 A1 * | 9/2008 | Crayssac | ................ | F28F 3/025 165/166 |
| 2011/0052960 A1 | 3/2011 | Kwon | | |
| 2011/0189525 A1 * | 8/2011 | Palanchon | .......... | H01M 10/613 429/120 |
| 2012/0261106 A1 | 10/2012 | Kelly | | |
| 2015/0198372 A1 * | 7/2015 | Desikan | ................ | F28F 3/027 165/151 |
| 2015/0241142 A1 * | 8/2015 | Vallee | ................... | F28D 1/0341 165/185 |
| 2016/0036104 A1 * | 2/2016 | Kenney | ............ | H01M 10/6557 429/120 |
| 2018/0252479 A1 * | 9/2018 | Kenney | ................ | F28D 1/0325 |

\* cited by examiner

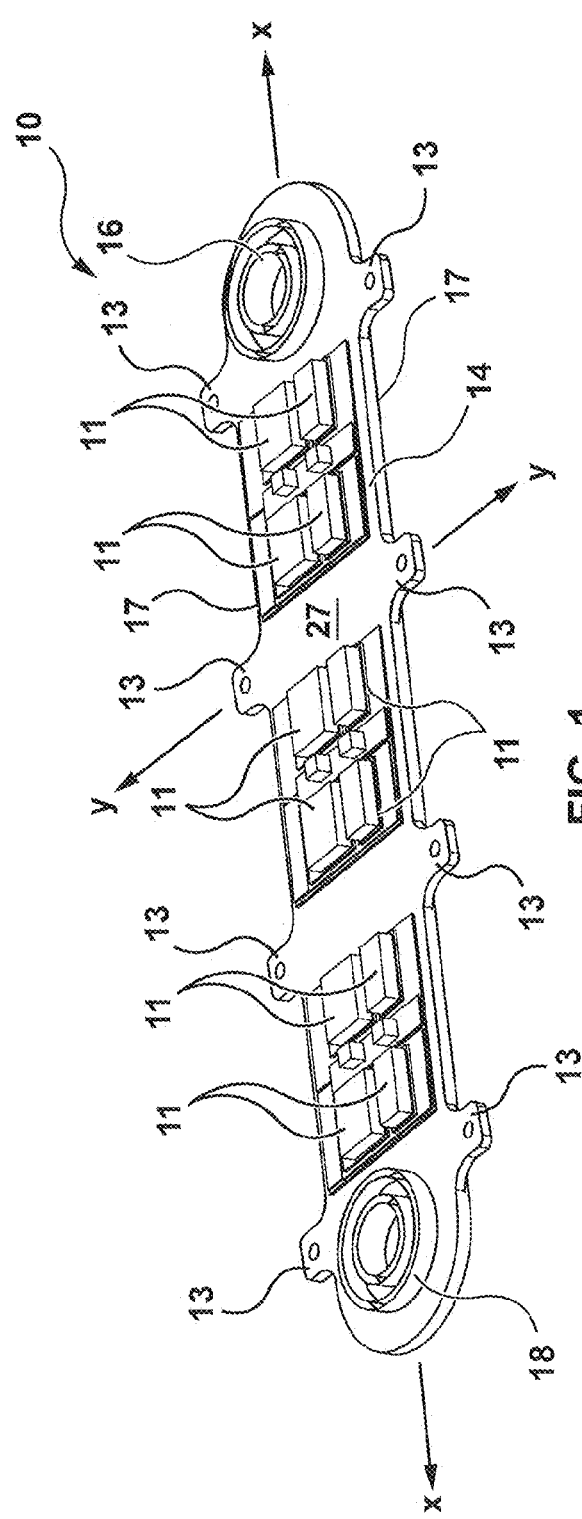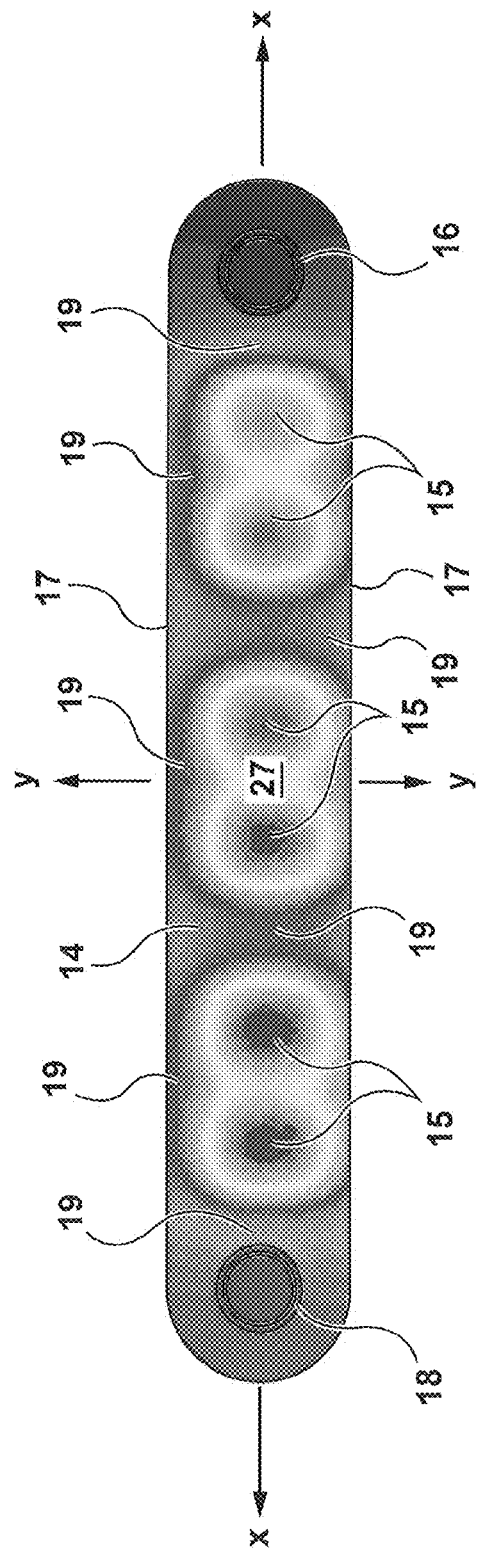

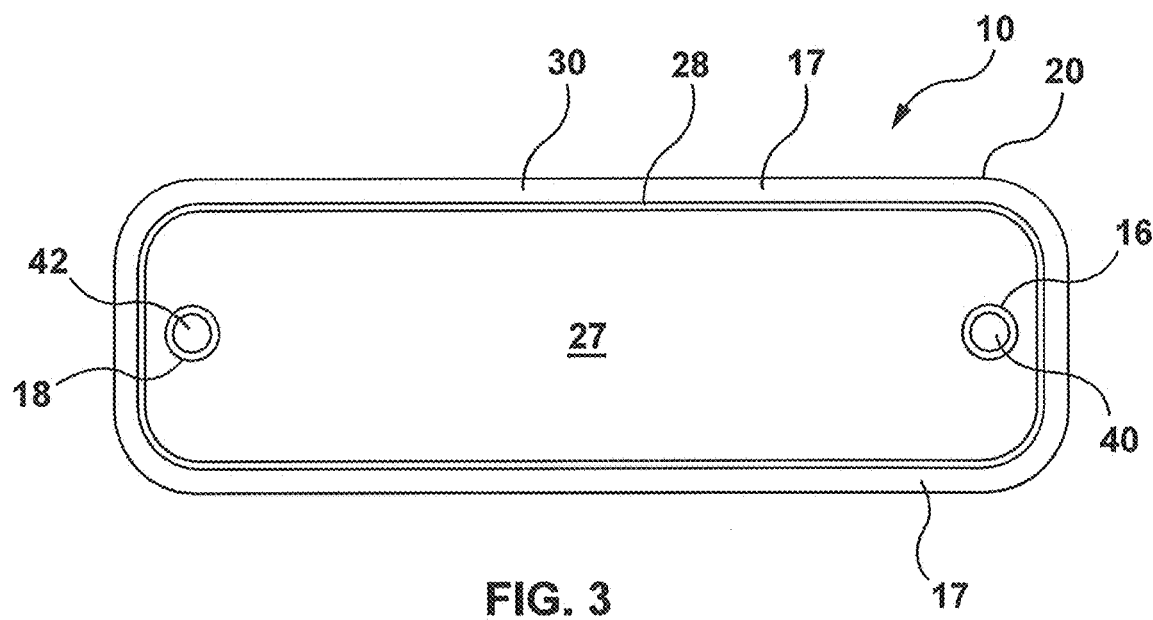
FIG. 3
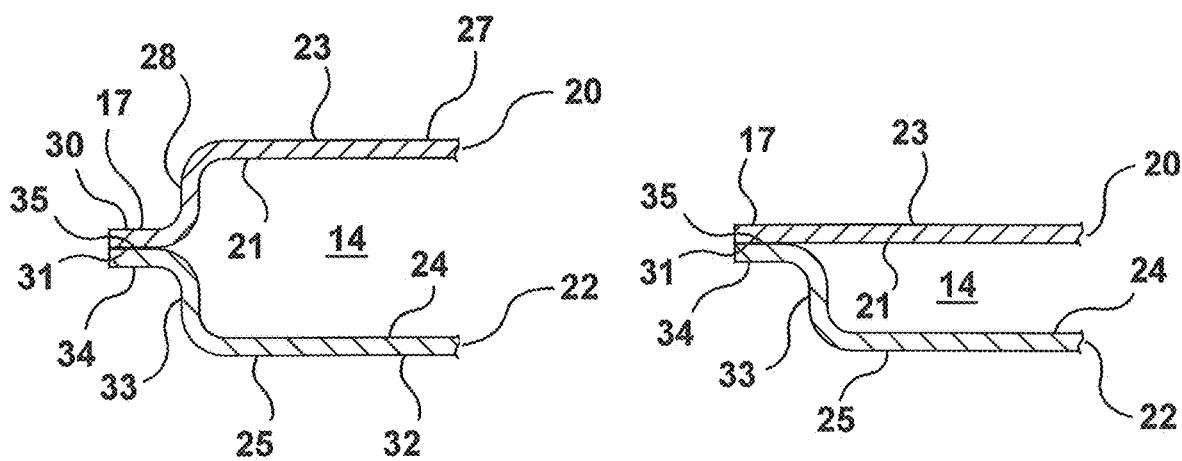
FIG. 4
FIG. 5
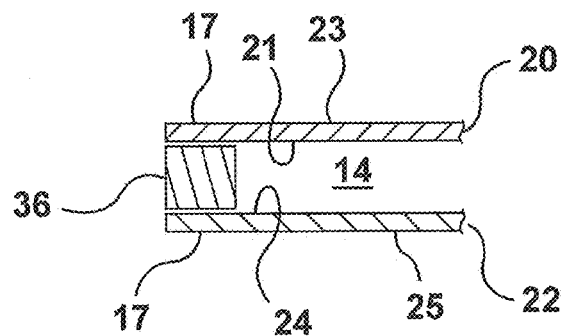
FIG. 6

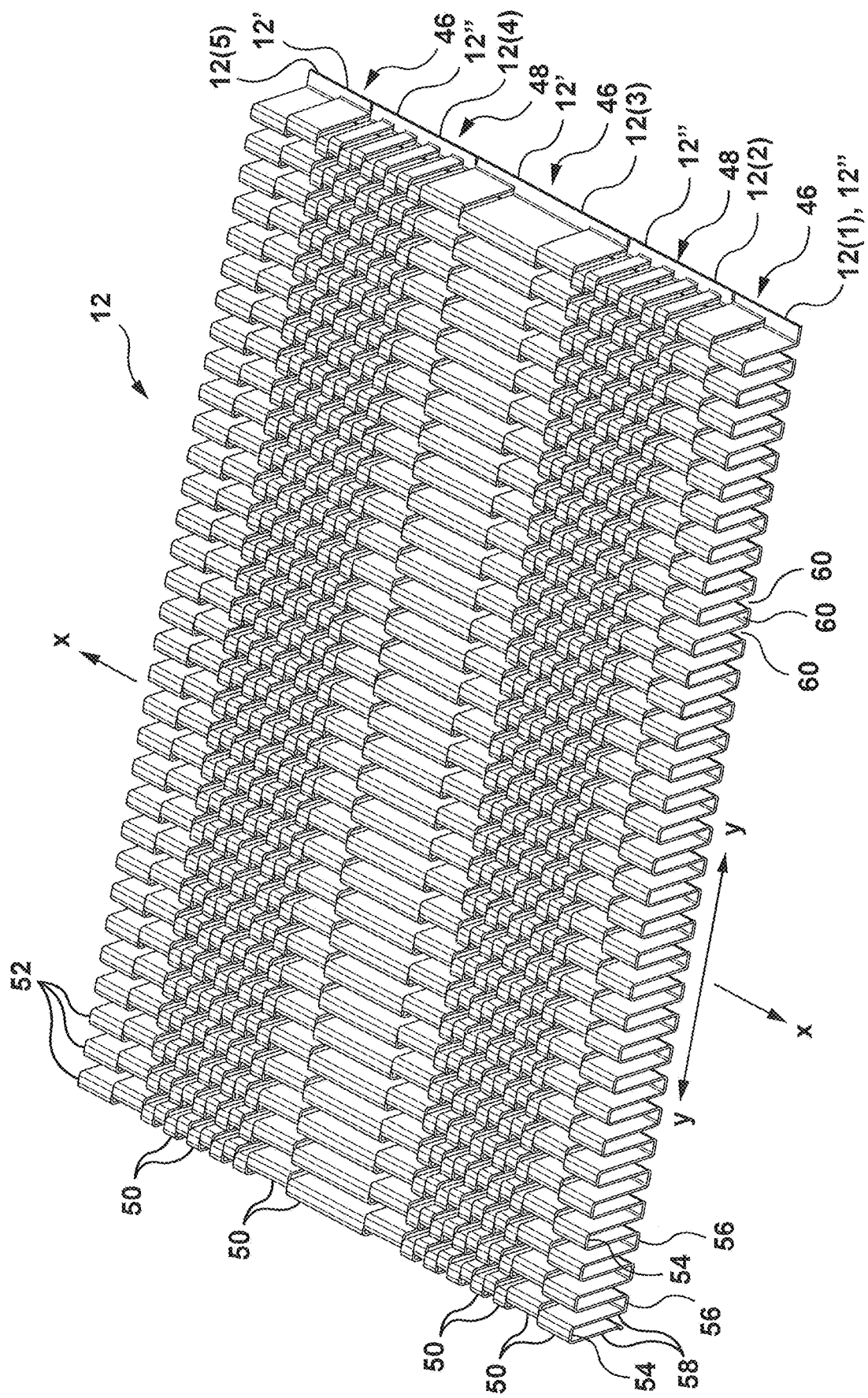

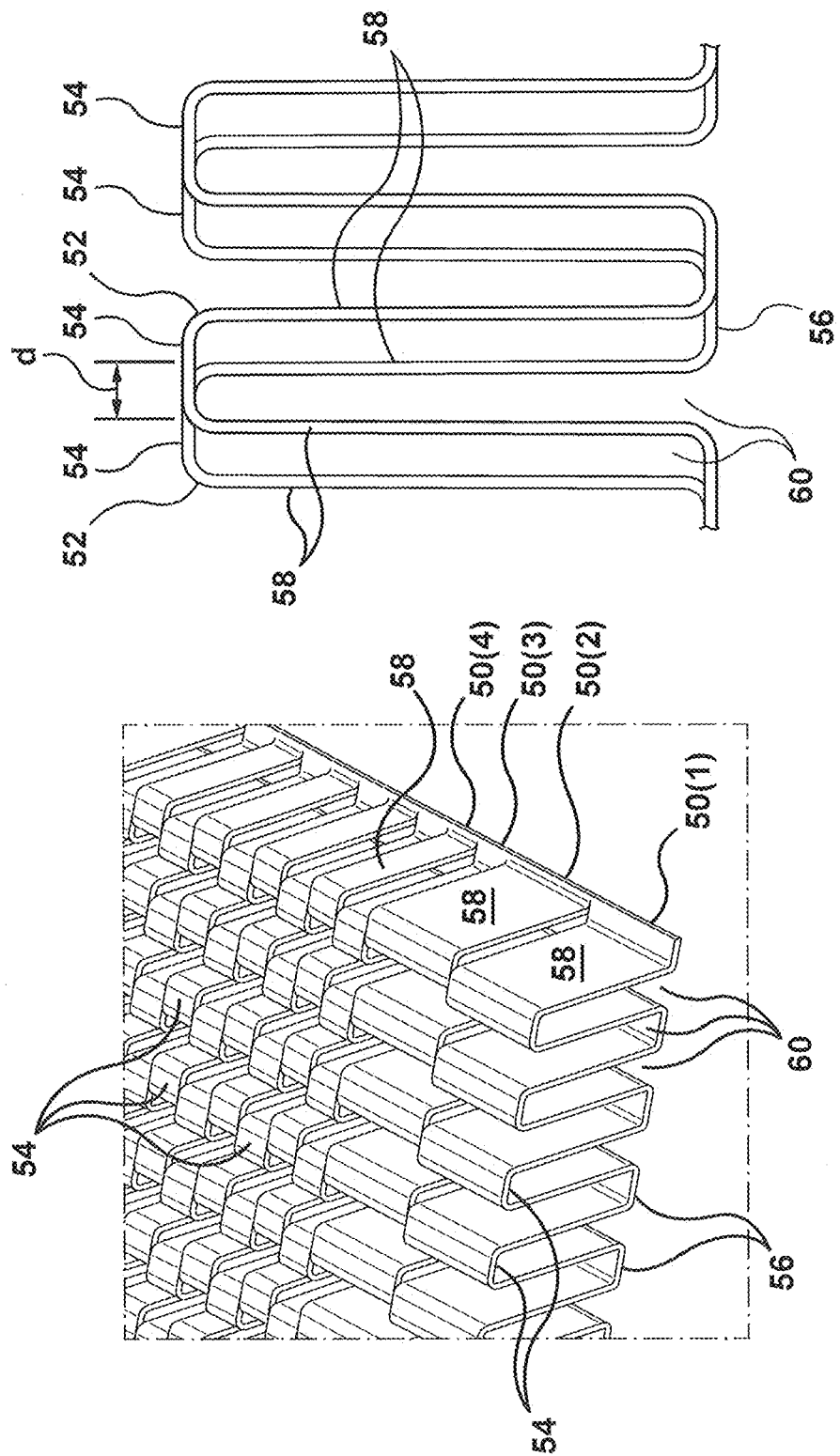

1

HEAT EXCHANGER WITH MULTI-ZONE HEAT TRANSFER SURFACE

CROSS-REFERENCE TO RELATED APPLICATIONS

This application claims priority to and the benefit of U.S. Provisional Patent Application No. 62/665,236 filed May 1, 2018 and U.S. Provisional Patent Application No. 62/748,071 filed Oct. 19, 2018, and the contents of both documents are incorporated herein by reference in their entirety.

TECHNICAL FIELD

The present disclosure relates to a heat exchanger for a vehicle, such as a battery electric vehicle (BEV) or hybrid electric vehicle (HEV), that may be particularly suited for cooling power electronic components relating to the operation of the BEV or HEV such as, for example, controlling the power to battery packs.

BACKGROUND

In typical heat exchanger applications, heat is transferred over a relatively large projected area. Although the heat transfer from a compact engine oil cooler can be very high, the heat flux is relatively low due to the fact that the heat is transferred over a large area.

With the emergence of electric and hybrid-electric vehicles, the demand for cooling power electronics, which control the power to battery packs with electronic chips such as metal-oxide-semiconductor field-effect transistors (MOSFTs) and insulated-gate bipolar transistor (IGBTs), has increased. Each individual chip produces a relatively small amount of heat, but the heat is concentrated in a very small volume. Due to the small cross-sectional area of the MOSFT and/or IGBT heat generating sources, the heat flux from these devices is much higher than in traditional engine cooling or from a battery pack. In addition to high heat fluxes, the heat sources are typically located in discrete, rather than continuous, regions over the heat exchanger. This type of heat source results in very localized hot spots that need to be cooled.

Accordingly, compact heat exchangers particularly suited for cooling electronic devices that produce high heat fluxes in very localized or small, discrete areas are desirable.

SUMMARY

In accordance with an aspect of the present disclosure, there is provided a heat exchanger, comprising at least one fluid flow passage extending between and interconnecting a fluid inlet and a fluid outlet wherein the at least one fluid passage is defined between a pair of spaced apart walls. A heat transfer surface disposed within the at least one fluid flow passage; wherein the heat transfer surface comprises at least one heat transfer-reducing zone disposed in thermal contact with a portion of at least one of the spaced-apart walls of the fluid flow passage; and at least one heat transfer-augmenting zone disposed in thermal contact with a portion of the at least one of the spaced-apart walls of the fluid flow passage. While a heat exchange fluid is flowing through the at least one fluid flow passage between the inlet and the outlet, heat transfer across the portion of the at least one of the spaced apart walls disposed in thermal contact with the at least one heat transfer-augmenting zone is increased relative to heat transfer across the portion of the at least one of the spaced apart walls disposed in thermal contact with the at least one heat transfer-reducing zone.

According to an aspect of the present disclosure, the heat transfer surface comprises a plurality of transverse rows of corrugations disposed adjacent to one another and extending in an axial direction such that each row of corrugations is disposed offset relative to an adjacent row or adjacent rows of corrugations. The at least one heat transfer-reducing zone includes one or more rows of the plurality of transverse rows of corrugations, and the at least one heat transfer-augmenting zone includes one or more rows of the plurality of transverse rows of corrugations, wherein the corrugations in the one or more rows of the at least one heat transfer-reducing zone each have a length extending in the axial direction that is greater than a length of each of the corrugations in the one or more rows of the at least one heat transfer-reducing zones.

According to an aspect of the present disclosure, the at least one heat transfer-reducing zone includes a plurality of heat transfer-reducing zones, and the at least one heat transfer-augmenting zones includes a plurality of heat transfer-augmenting zones, wherein the plurality of heat transfer-reducing zones and the plurality of heat transfer-augmenting zones are disposed in an alternating series.

According to an aspect of the present disclosure, the length of the corrugations in each row of corrugations of the at least one heat transfer-reducing zone is the same.

According to an aspect of the present disclosure, the length of the corrugations in each of the rows of corrugations of the at least one heat transfer-reducing zone are different.

According to an aspect of the present disclosure, the heat exchanger includes flow blocking zones disposed with the fluid flow passage in mating relationship with the heat transfer surface such that while a heat exchange fluid is flowing through the at least one fluid flow passage between the inlet and the outlet through the heat transfer surface, fluid flow through the flow-blocking zones is prevented, or substantially prevented.

According to an aspect of the present disclosure, wherein the flow-blocking zones include flow-blocking inserts disposed within the at least one fluid flow passage such that the flow blocking inserts are disposed within apertures defined by the corrugations of the heat transfer surface.

According to an aspect of the present disclosure, the flow-blocking inserts include pin fins extending from an inner surface of each of the first and second walls defining the at least one fluid flow passage.

According to an aspect of the present disclosure, the flow-blocking zones are spaced apart transversely across the heat transfer surface and extend along the axial length of the heat transfer surface.

According to an aspect of the present disclosure, a plurality of electronic components are mounted on the outer surface of at least one of the spaced apart walls of the heat exchanger such that the electronic components are disposed in thermal contact with the portion of the one of the spaced apart walls that is disposed in thermal contact with the at least one heat transfer-augmenting zones.

According to an aspect of the present disclosure, the portion of the one of the spaced apart walls disposed in thermal contact with the heat transfer-reducing zones include areas disposed between the plurality of electronic components.

According to an aspect of the present disclosure, the electronic components include but are not limited to metal-oxide-semiconductor field-effect transistors (MOSFTs) and insulated-gate bipolar transistors (IGBTs).

According to an aspect of the present disclosure, the at least one fluid flow passage and the heat transfer surface include flow-permitting zones interposed with flow-blocking zones.

According to an aspect of the present disclosure, the flow-permitting zones include heat transfer-reducing zones and heat transfer-augmenting zones.

In accordance with another aspect of the present disclosure, there is provided a heat transfer surface for disposition within a fluid flow passage of a heat exchanger, comprising a plurality of transverse rows of corrugations disposed adjacent to one another and extending in an axial direction such that each row of corrugations is disposed offset relative to an adjacent row or adjacent rows of corrugations such that the corrugations in one row partially overlap the corrugations in an adjacent row; a plurality of heat transfer-reducing zones including a plurality of rows of corrugations wherein the corrugations have a first length extending in an axial direction; a plurality of heat transfer-augmenting zones including a plurality of rows of corrugations wherein the corrugations have a second length extending in an axial direction; wherein the plurality of rows of corrugations in each of the heat transfer-augmenting zones is greater than the plurality of rows of corrugations in the heat transfer-reducing zones; and wherein the first length is greater than the second length.

According to an aspect of the present disclosure, the first length is about double the second length.

According to an aspect of the present disclosure, the plurality of heat-transfer reducing zones, and the plurality of heat transfer-augmenting zones are disposed in an alternating series.

According to an aspect of the present disclosure, each row of corrugations of the heat transfer surface includes a plurality of spaced apart upper and lower web portions, and a plurality of fin surface portions extending between and interconnecting the spaced apart upper and lower web portions; wherein the plurality of spaced apart upper and lower web portions and the plurality of fin surface portions are co-operatively configured such that an alternating series of upper and lower web portions interconnected by fin surface portions is formed, the upper web portions of one row of corrugations are offset relative to the upper web portions of the adjacent row of corrugations by a predetermined distance.

According to an aspect of the present disclosure, wherein each row defines a leading edge and each corrugation defines a fluid passageway.

According to an aspect of the present disclosure, the heat transfer surface may further comprise a plurality of flow-blocking inserts, wherein one flow-blocking insert is disposed within one or more fluid passageways of one or more corrugations of the heat transfer surface thereby forming one or more flow-blocking zones such that fluid travelling through the heat transfer surface is prevented, or substantially prevented, from passing through the one or more flow-blocking zones.

According to another aspect of the present disclosure, there is provided a heat exchanger comprising a fluid inlet, a fluid outlet, at least one fluid flow passage extending between and interconnecting the fluid inlet to the fluid outlet, wherein the at least one fluid passage is defined between a pair of spaced apart walls; wherein one of the spaced apart walls defining the at least one fluid flow passage includes: a plurality of surface protrusions projecting out of the plane of the spaced apart wall and into the fluid flow passage, the plurality of surface protrusions being arranged in a pattern such that: at least one heat transfer-reducing zone is disposed in thermal contact with a portion of at least one of the spaced-apart walls of the fluid flow passage; and at least one heat transfer-augmenting zone is disposed in thermal contact with a portion of the at least one of the spaced-apart walls of the fluid flow passage; wherein: while a heat exchange fluid is flowing through the at least one fluid flow passage between the inlet and the outlet, heat transfer across the portion of the at least one of the spaced apart walls disposed in thermal contact with the at least one heat transfer-augmenting zone is increased relative to heat transfer across the portion of the at least one of the spaced apart walls disposed in thermal contact with the at least one heat transfer-reducing zone.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Reference will now be made, by way of example, to the accompanying drawings which show example embodiments of the present application, and in which:

FIG. 1 is a top perspective view of a heat exchanger according to an example embodiment of the present disclosure with electronic components mounted thereon;

FIG. 2 is a top plan view of heat exchanger of FIG. 1 showing the thermal distribution across the heat exchanger;

FIG. 3 is a top plan view of a heat exchanger according to an example embodiment of the present disclosure;

FIG. 4 is a partial cross-sectional, schematic view through the heat exchanger of FIG. 3;

FIG. 5 is a partial cross-sectional, schematic view through the heat exchanger illustrating an alternate plate structure;

FIG. 6 is a partial cross-sectional, schematic view through the heat exchanger illustrating an alternate plate structure;

FIG. 7A is a top, perspective view of an alternate embodiment of the heat transfer surface of FIG. 7 including a plurality of individual heat transfer surface portions;

FIG. 8 is a detail view of a portion of the heat transfer surface of FIG. 7;

FIG. 8A is a detail end view of a portion of the heat transfer surface of FIG. 8;

Similar reference numerals may have been used in different figures to denote similar components.

DESCRIPTION OF EXAMPLE EMBODIMENTS

Figure 1A:
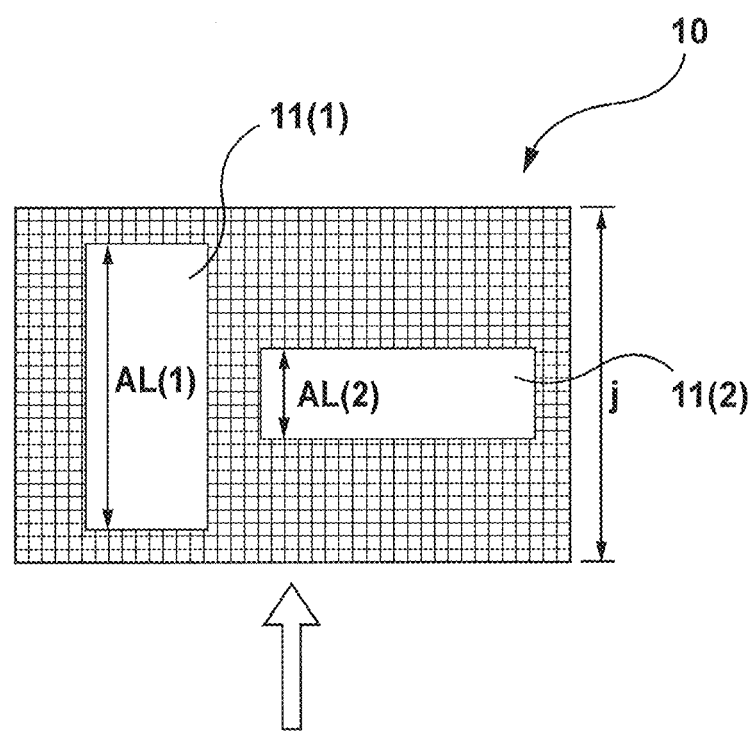
FIG. 1A is a schematic representation of an example configuration of an electronic component disposed on the heat exchanger.

The following is a description of a heat exchanger 10 incorporating a multi-zone heat transfer surface 12 according to an example embodiment of the present disclosure. In some embodiments, the heat exchanger 10 and the multi-zone heat transfer surface 12 are adapted for cooling (or heating) power electronic components or devices 11 for use in a BEV or HEV. Accordingly, it will be understood that reference to "power electronic components" or "power electronic devices" may include electronic chips such as metal-oxide-semiconductor field-effect transistors (MOSFTs), insulated-gate bipolar transistor (IGBTs), diode chips, etc. that are found in vehicles, particularly BEVs or HEVs.

It will be appreciated that the elements of the various heat exchangers and the heat transfer surfaces illustrated in the drawings are not drawn to scale. For example, the thicknesses and other dimensions of the various elements of the heat exchangers described herein, are not drawn to scale in the drawings. Also the power electronic components and their mounting to the heat exchanger are only shown schematically herein.

As shown in FIGS. 1-6, heat exchanger 10 is comprised of a fluid flow passage 14 configured for the flow of a cooling fluid therethrough, the flow passage 14 extending between a fluid inlet 16 and a fluid outlet 18. A plurality of power electronic components 11 are mounted on at least one of the outer surfaces of the heat exchanger 10. In some embodiments, for example, the power electronic components 11 each include a single electronic component or chip while in other embodiments, each power electronic component 11 may include two different chips 11(1), 11(2) arranged side-by-side and/or in combination as shown schematically in FIG. 1A. In some embodiments, for example, the power electronic components 11 include an IGBT chip 11(1) in combination with a diode chip 11(2).

In some embodiment, for example, the heat exchanger 10 comprises a first plate 20 and a second plate 22, which are disposed in facing relation to one another. The plates 20, 22 are thermally conductive and each have an inner surface facing inwardly toward the fluid flow passage 14 and an outer surface facing outwardly away from the fluid flow passage 14. In the drawings, for example, the first plate 20 has an inner surface 21 and an outer surface 23, and the second plate 22 has an inner surface 24 and an outer surface 25.

The fluid flow passage 14 is defined by a space or gap provided between the inner surfaces 21, 24 of the first and second plates 20, 22. The first and second plates 20, 22 are sealed together at their peripheral edges 17 thereby sealing the edges of the fluid flow passage 14. The areas of the first and second plates 20, 22 that are located inwardly of the peripheral edges 17 are spaced apart from each other to define the fluid flow passage 14 therebetween.

In some embodiments, for example, the first plate 20 has a generally flat, planar central area 27 surrounded on all sides by a peripheral side wall 28 extending from the central area to a peripheral flange 30 defining a sealing surface 31 on the inner surface of the first plate 20. In some embodiments, for example, the second plate 22 is similar in structure to the first plate 20 in that it too has a generally flat, planar central area 32 surrounded on all sides by a peripheral side wall 33 extending from the central area 32 to a peripheral flange 34 defining a sealing surface 35 on the inner surface of the second plate 22, the second plate 22 being disposed in opposed facing relation such that the sealing surface 31 of the peripheral flange 30 of the first plate 20 is disposed in sealing contact with the sealing surface 35 of the peripheral flange 33 of the second plate 22 such that the generally flat, planar central areas 27, 32 are disposed in spaced apart relationship.

In some embodiments, for example, the first plate 20 is substantially completely flat and planar, with the inner and outer surfaces both being flat and planar while the second plate 22 is shaped, for example by stamping or drawing or any other suitable method known in the art, such that it has a generally flat, planar central area 32 that serves as a base. The generally flat, planar central area 32 is surrounded on all sides by a raised peripheral side wall 33 extending from the base or central area 32 to a planar flange 33 that defines a sealing surface 35 on the inner surface 24 along which the planar flange 33 is sealed to a planar, peripheral sealing surface 31 on the inner surface 21 of the first plate 20, for example by brazing or welding, or any other suitable method for sealing two thermally conductive plates together thereby defining the fluid flow passage 14 therebetween.

In some embodiments, for example, the first plate 20 and the second plate 22 are both substantially completely flat and planar and are sealed together at their peripheral edges 17 by a separate sealing member 36 that spaces apart the inner surface 21 of the first plate 20 from the inner surface 24 of the second plate 22 defining the fluid flow passage therebetween.

Accordingly, it will be understood that the heat exchanger 10 may comprise various plate configurations that define the enclosed fluid flow passage 14.

In some embodiments, for example, the inlet port 16 and the outlet port 18 are provided at opposite ends of the heat exchanger 10 and comprise holes or openings disposed in the first plate 20. In some embodiments, for example, the inlet port 16 and the outlet port 18 are disposed in raised boss portions 40, 42 (see for instance FIG. 3) that protrude outwardly from or are raised with respect to the substantially planar outer surface 23 of the first plate 20. In some embodiments, for example, the inlet port is provided with a tubular inlet fitting (not shown) and the outlet port is provided with a tubular outlet fitting (not shown), the inlet and outlet fittings allowing flow communication between the fluid flow passage 14 and a fluid circulation system (not shown) within the vehicle.

In some embodiments, the cooling fluid makes a single pass along the surfaces of the plates 20, 22 through fluid flow passage 14 as it flows from the inlet 16 to the outlet 18. In some embodiments, for example, the fluid flow passage 12 may include one or more U-turns such that the heat exchange fluid will make two or more passes through the fluid flow passage 14 along the surfaces of the plates 20, 22 as it flows from the inlet 16 to the outlet 18. Therefore, depending on the configuration of the fluid flow passage, 14 the inlet and outlet 16, 18 may be located at the same or at opposite ends of the heat exchanger 10.

Figure 38:
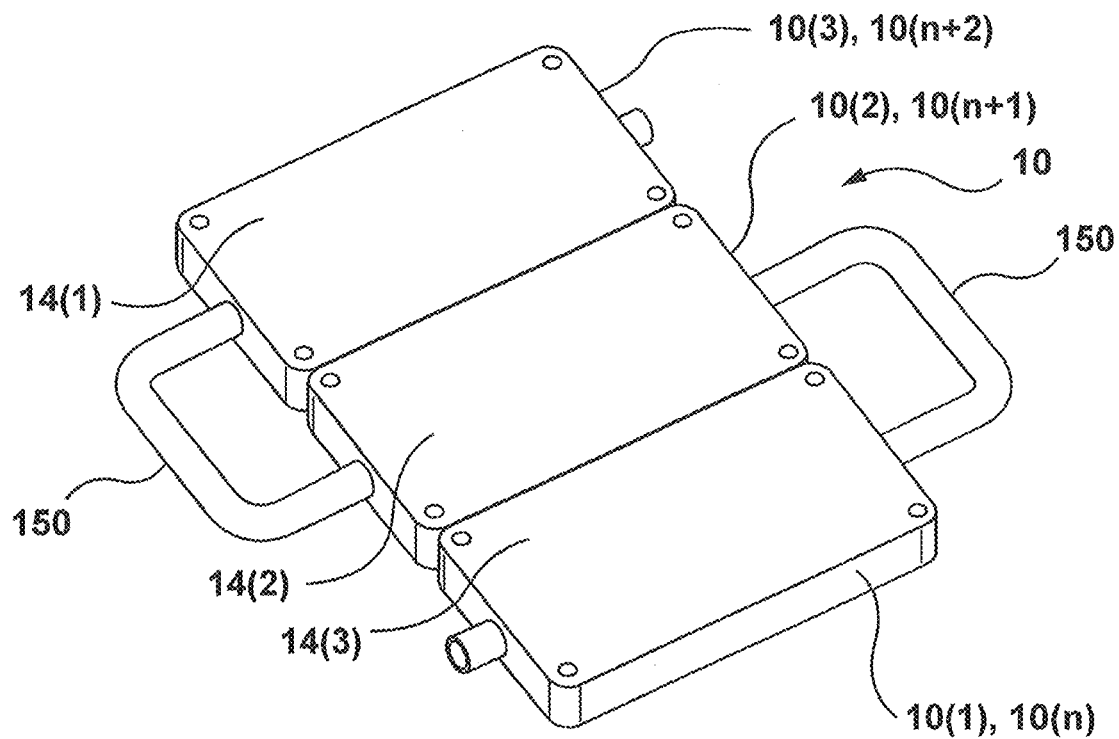
FIG. 38 is a top perspective view of a heat exchanger according to an example embodiment of the present disclosure.
Figure 39:
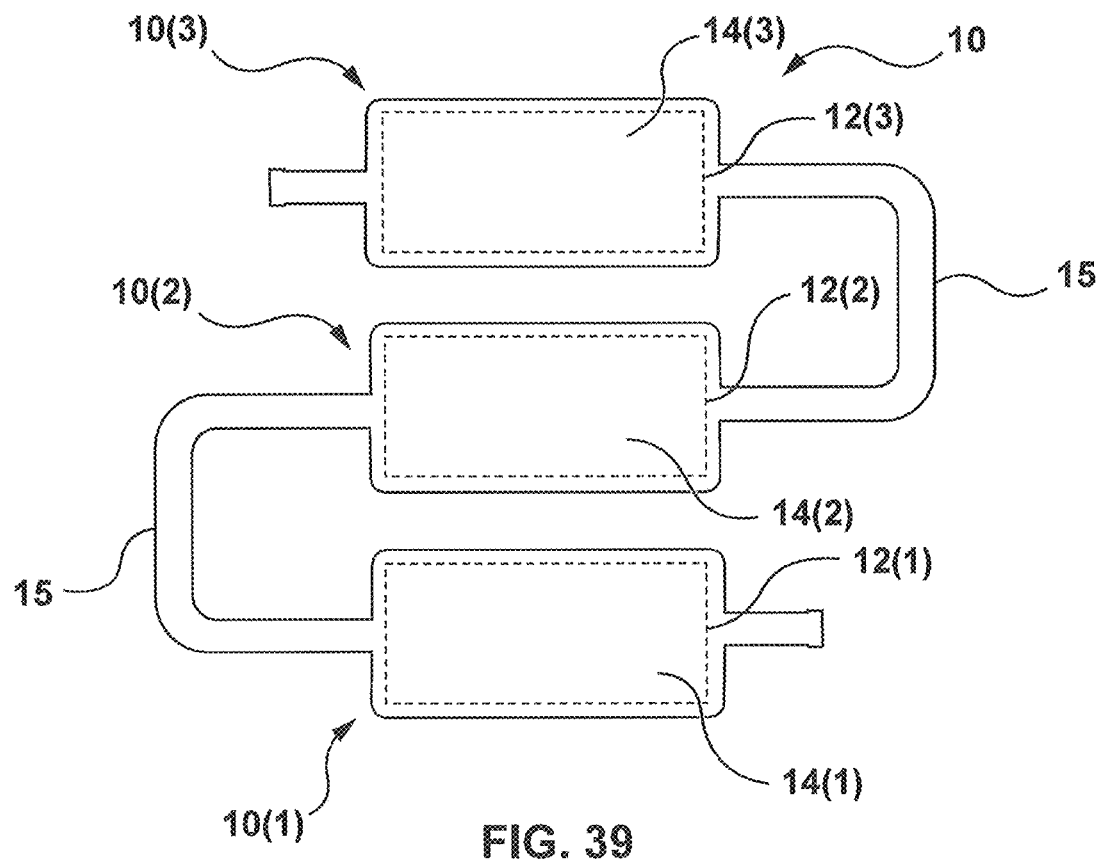
FIG. 39 is a top plan view of the heat exchanger of FIG. 38 with the top plates or cover plates removed.

Referring now to FIGS. 38 and 39, in some embodiments, for example, the heat exchanger 10 includes two or more heat exchanger portions 10(1), 10(2), . . . , 10(n) arranged adjacent to each other in side-by-side relationship. Each heat exchanger portion 10(1), etc., independently, includes a single pass fluid flow passage portion 14(n) that, together, make up the fluid flow passage 14 of the heat exchanger 10. Fluid flow passage portion connectors 150 fluidly interconnect one heat exchanger portion 10(1) to the next, adjacent heat exchanger portion 10(2), etc. such that the heat exchange fluid or cooling fluid is transferred from one fluid flow passage portion 14(1) to the next, adjacent fluid flow passage portion 14(2). In some embodiments, for example, the fluid flow passage portion connectors 15 are in the form of generally U-shaped turn portions such that each fluid flow passage portion 14(1), etc. defines a flow direction that is generally opposite to the flow direction defined by the adjacent fluid flow passage portion(s), the heat exchanger 10 therefore being a multi-pass heat exchanger. In the subject example embodiment, each heat exchanger portion may have any one of the forms described above where the heat exchanger portion is comprised of mating plate pairs defining the fluid flow passage therebetween.

Electronic components 11, including but not limited to electronic chips such as metal-oxide-semiconductor field-effect transistors (MOSFTs) and/or insulated-gate bipolar transistor (IGBTs) are disposed on the outer surface of at least one of the first and second plates 20, 22. The electronic components 11 are fixed or secured to the heat exchanger 10, in accordance with principles known in the art, in heat transfer relationship with the outer surface of the corresponding heat exchanger plate 20, 22. In the subject example embodiment, the electronic components 11 are disposed on the outer surface 23 of the first plate 20 and are spaced apart across the outer surface 23 of the first plate 20 at predetermined intervals, which may be equal or varying, depending on the particular configuration, desired placement and/or application of the electronic components 11.

In some embodiments, for example, the outer surface 23 of the heat exchanger plate 20 on which the electronic components 11 are disposed may be specifically shaped to accommodate the desired placement of the individual electronic components or electronic chips 11. For example, in some embodiments, the outer surface 23 may include slight indentations (not shown) in which the individual electronic components 11 are disposed.

Figure 44:
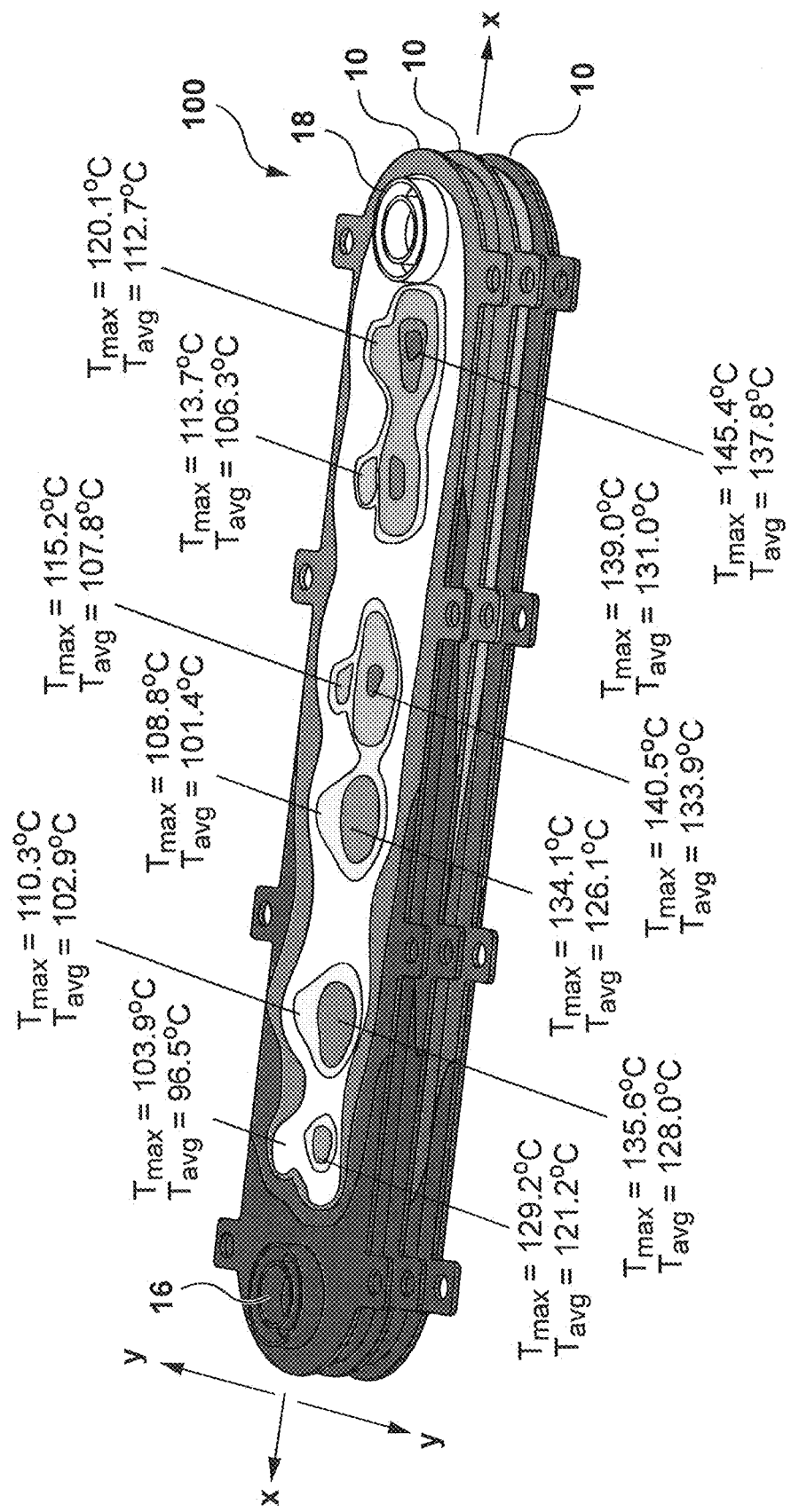
FIG. 44 is a perspective view of heat exchanger according to another example embodiment of the present disclosure illustrating an example thermal profile across the heat exchanger.

In some embodiments, for example, a plurality of heat exchangers or tubular members or sets of plate pairs 10 are disposed in a stacked or layered arrangement with the electronic components 11 disposed between the individual heat exchangers 10 to form a heat exchanger stack 100 where the inlet and outlet 16, 18 of each heat exchanger or set of plate pairs 10 within the stack is fluidly interconnected to the other heat exchangers or sets of plate pairs 10 through the aligned inlet and outlets 16, 18 which form internal manifolds such that incoming heat exchanger fluid is distributed to each of the individual heat exchangers or sets of plate pairs 10 as shown for instance in FIG. 44.

In some embodiments, for example, the heat exchanger 10, 10' includes tabs 13 that project from the peripheral edges of the heat exchanger 10 at spaced apart intervals around the perimeter of the first and second plates 20, 22 to facilitate the strapping together of multiple heat exchangers 10 to form a stacked or multi-layered heat exchanger.

Referring to FIG. 2, an example embodiment of the thermal distribution across the surface of the heat exchanger 10 relative to the placement of the electronic components 11 shown in FIG. 1 is illustrated. As shown, hot spots 15 are found in the areas directly underneath where the electronic components 11 are located, while generally cooler areas 19 are located in the areas between or that are spaced apart from the electronic components 11. In the example embodiment illustrated in FIG. 2, cooler areas 19 are generally found between the groupings of electronic components 11 disposed along the length of the heat exchanger 10, between the individual electronic components 11 as well as along the edges of the heat exchanger 10. The unequal heat distribution across the surface of the heat exchanger 10 is due to the high heat flux associated with the individual electronic components 11 creating localized hot spots on the surface of the heat exchanger 10 while the remainder of the heat exchanger surface that is not in direct, heat transfer relationship with the electronic components 11 remaining relatively cool or immune to the effects of the very localized heat generated by the electronic chips or components 11.

In order to ensure that the heat exchanger 10 provides adequate cooling to the electronic components 11, in some embodiments, a heat transfer surface 12 is disposed within fluid flow passage 14 (or in each fluid flow passage portion 14(n)) for increasing or enhancing heat transfer across the portions of the heat exchanger surface disposed in direct thermal relationship with the electronic components so as to specifically target cooling of the localized hot spots generated by the electronic components.

In some embodiments, for example, increasing or enhancing heat transfer across the portions of the heat exchanger surface disposed in direct thermal relationship with the electronic components includes increasing, or enhancing, turbulence within the heat exchange fluid as the fluid passes through a particular zone or section of the fluid flow passage 14 in order to increase or enhance heat transfer performance of the heat exchanger 10 in the specific areas or target zones associated with the positions of the electronic components disposed on the outer surface of the heat exchanger 10 known to create hot spots.

In some embodiments, for example, the heat transfer surface 12 is a turbulizer.

In some embodiments, for example, the heat transfer surface 12 is turbulizer in the form of an off-set strip fin.

Figure 40:
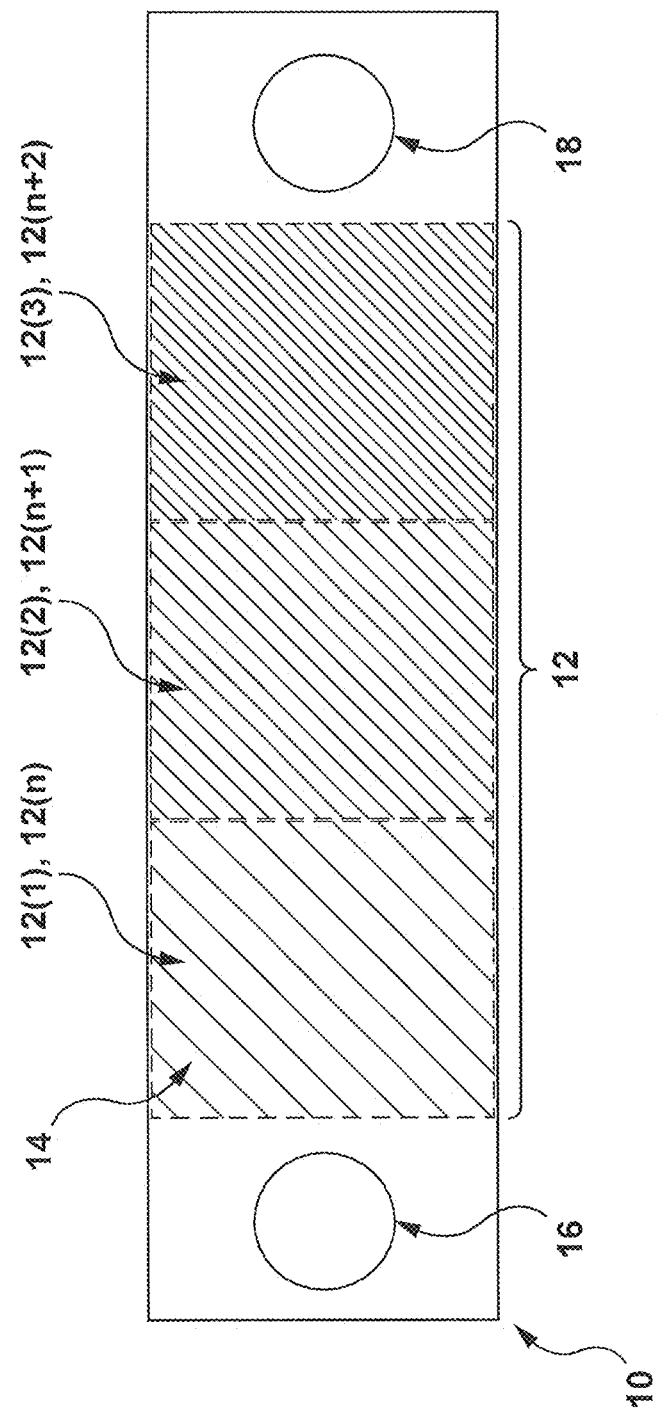
FIG. 40 is a schematic top plan view of a heat exchanger according to another example embodiment of the present disclosure.

In some embodiments, for example, the heat transfer surface 12 is a single, unitary structure, while in other embodiments, for example, the heat transfer surface 12 includes a plurality of individual heat transfer surface portions 12(n) arranged in sequence within the fluid flow passage 14, as shown schematically in FIG. 40, or within adjacent fluid flow passage portions 14(n) as shown, for instance, in FIGS. 38-39.

In general, when a heat transfer surface is disposed within an enclosed fluid flow channel or within a heat exchanger tube they are often referred to as turbulizers. When heat transfer surfaces are disposed outside or external to an enclosed fluid flow channel or are disposed between stacked heat exchanger tubes they are often referred to as fins although it is understood that the term "fin" may also be used in reference to heat transfer surfaces disposed within enclosed fluid flow channels. For the purpose of this disclosure, the term "heat transfer surface" is used and is not intended to necessarily be limited to either a turbulizer or a fin, per se.

In order to accommodate or account for the uneven heat distribution across the heat exchanger 10 as illustrated in FIG. 2, heat transfer surface 12 includes heat transfer-reducing zones 46 interposed with heat transfer-augmenting zones 48. The arrangement or configuration of the heat transfer-reducing zones 46 and the heat transfer-augmenting zones 48 within the heat transfer surface 12 is such that disposition of the heat transfer surface 12 within the enclosed fluid flow channel 14 is with effect that the heat transfer-augmenting zones 48 include portions that are disposed in parallel, or substantially parallel, relationship with and are axially aligned, or substantially axially aligned, with the electronic component(s) disposed on the outer surface of the heat exchanger 10 along an axis that extends normal to the outer surface of the heat exchanger 10 such that increased heat transfer occurs across the portion of the heat exchanger plate 20, 22 that is disposed on top of or in direct heat transfer relationship with the portion of the heat transfer-augmenting zones 48 of the heat transfer surface 12 that is underneath or in direct thermal relationship with one of the electronic components disposed on the heat exchanger 10 while the heat exchanger 10 is in use with fluid flowing through the heat exchanger 10 relative to the amount or rate of heat transfer that occurs across the portions of the heat exchanger plate 20, 22 that is/are disposed on top of or in direct heat transfer relationship with the heat transfer-reducing zones 46 of the heat transfer surface 12 while the heat exchanger 10 is in use with the fluid flowing through the heat exchanger 10.

The configuration or arrangement of the heat transfer-reducing zones 46 and the heat transfer-augmenting zones 48 in the fluid flow passage 14 is such that the electronic components 11 are disposed on the portions of the outer surface of the heat exchanger 10 associated with or that are in direct heat transfer relationship with the heat transfer-augmenting zones 48 such that each of the heat transfer-augmenting zones 48, independently, include portions disposed parallel to, or substantially parallel to and axially aligned, or substantially axially aligned, with one or more of the electronic components disposed on the outer surface of the heat exchanger 10. Similarly, the configuration or arrangement of the heat transfer-reducing zones 46 with the heat transfer-augmenting zones 48 within the fluid flow passage 14 is such that each of the heat transfer-reducing zones 46, independently, is disposed parallel to, or substantially parallel to, and axially aligned, or substantially axially aligned, with an area or portion of the outer surface of the heat exchanger 10 that is disposed between or adjacent to the electronic components disposed on the outer surface of the heat exchanger 10.

In some embodiments, for example, the heat transfer-augmenting zones 48 include portions of the heat transfer surface 12 having increased surface area while the heat transfer-reducing zones 46 include areas of the heat transfer surface 12 that have a decreased or reduced surface area relative to the heat transfer-augmenting zones 48.

In some embodiments, for example, the heat transfer-reducing zones 46 include areas of the heat transfer surface 12 associated with a decreased fluid flow rate through the heat transfer surface 12 of the heat exchanger 10 relative to the fluid flow rate through the heat transfer-augmenting zones 48 of the heat transfer surface 12 of the heat exchanger 10.

In some embodiments, for example, the heat transfer-reducing zones 46 include areas where fluid flow through the heat transfer surface 12 is prevented or substantially prevented while the heat transfer augmenting zones 48 are associated with areas of the heat transfer surface 12 where fluid flow through the heat transfer surface 12 and fluid flow passage 14 of the heat exchanger 10 is permitted.

In some embodiments, for example, heat transfer-augmenting zones 48 include portions of the heat transfer surface 12 that have increased surface area relative to the surface area of the portions of the heat transfer surface associated with the heat transfer-reducing zones 46 and increased fluid flow rate through the heat transfer surface 12 and fluid flow passage 14 of the heat exchanger 10 relative to the fluid flow rate through the heat transfer-reducing zones 46.

In some embodiments, for example, the heat transfer-reducing zones 46 include areas or portions of the heat transfer surface 12 having reduced surface area as compared to the areas or portion of the heat transfer surface 12 associated with the heat transfer-augmenting zones 48 as well as flow-blocking zones 70 that include areas or portions of the heat transfer surface 12 where fluid flow through the heat transfer surface 12 is prevented, or substantially prevented.

In some embodiments, for example, the heat transfer-reducing zones 46 include areas or portions of the flow passage 14 where there is an absence of a heat transfer surface 12 or an absence of other surface enhancement features.

Figure 7:
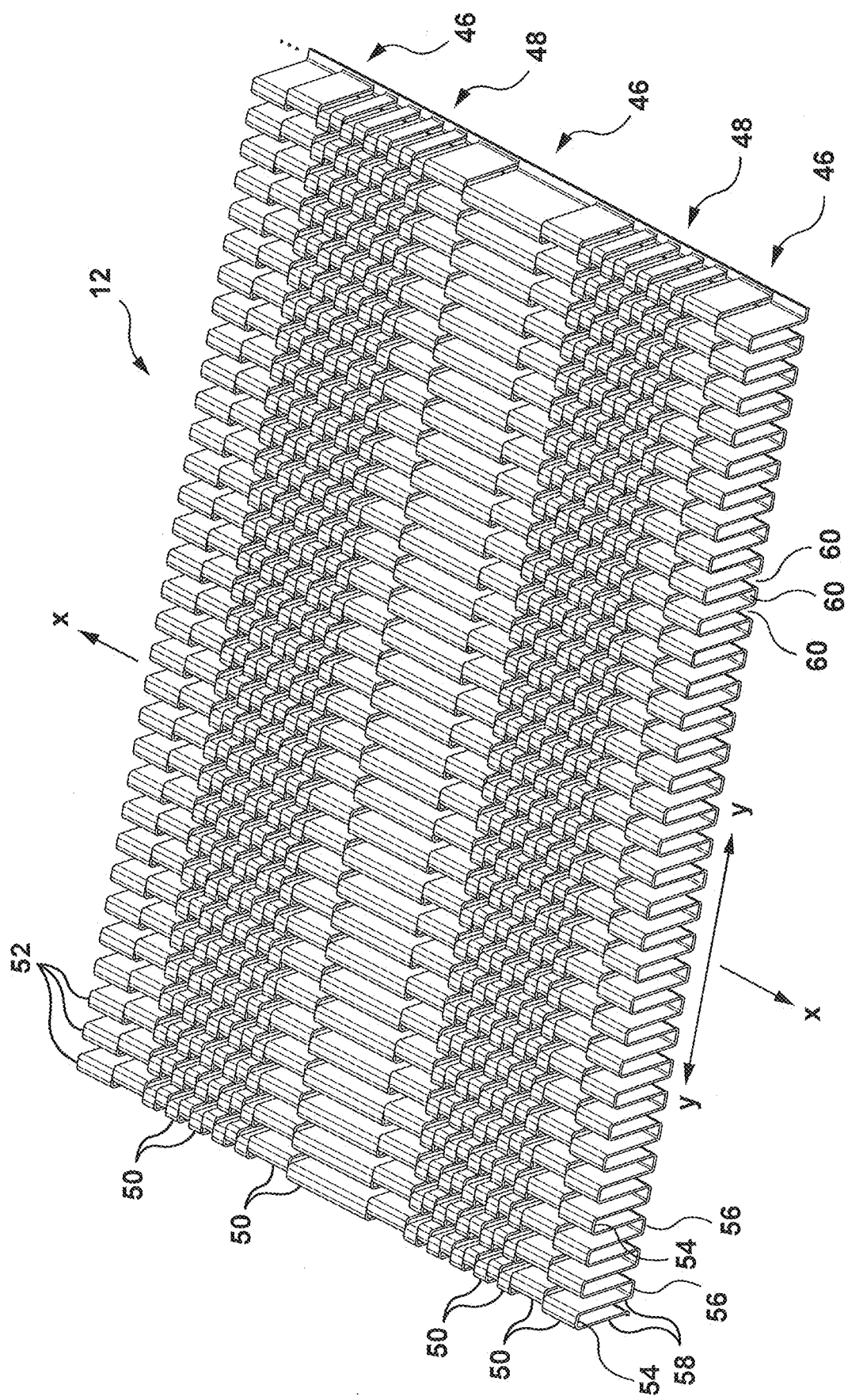
FIG. 7 is a top, perspective view of a heat transfer surface for use in the heat exchanger of FIG. 1.

Referring to FIG. 7, there is shown a heat transfer surface 12 according to an example embodiment of the present disclosure. The heat transfer surface 12 includes a plurality of rows 50 of corrugations 52. The rows 50 are disposed in series, adjacent to one another, along an axial or longitudinal direction X-X of the heat transfer surface 12.

Each row 50 includes a plurality of corrugations 52 disposed in series transversely along a transverse axis Y-Y of the heat transfer surface 12 relative to the longitudinal axis or axial direction X-X of the heat transfer surface 12. The plurality of corrugations 52 comprise spaced apart upper and lower web portions 54, 56 that are interconnected by fin surface portions 58.

The upper and lower web portions 54, 56 and the fin surface portions 58 are cooperatively configured such that an alternating series of upper and lower web portions 54, 56 interconnected by fin surface portions 58 is formed. Accordingly, in some embodiments, for example, each corrugation 52 includes an upper web portion 54 and two fin surface portions 58 extending therefrom with each corrugation 52 being connected to the adjacent corrugation or corrugations 52 by a lower web portion 56. Alternatively, in some embodiments, for example, each corrugation 52 may include a lower web portion 56 and two fin surface portions 58 extending therefrom, with each corrugation 52 being connected to the adjacent corrugation or corrugations 52 by an upper web portion 54.

Referring more specifically to FIGS. 8 and 8A, in the subject example embodiment, the plurality of rows 50(*n*) of corrugations 52 are configured such that each row 50 is offset relative to the adjacent row or rows of corrugations 52 such that the corrugations 52 in one row partially overlap the corrugations in the adjacent row. More specifically, the upper web portions 54 of the corrugations 52 in a first row 50(1) of corrugations 52 are offset relative to a central, longitudinal axis of the corrugations in the adjacent or second row 50(2) of corrugations 52 by a predetermined distance, d, while the upper web portions 54 of the subsequent row 50 of corrugations 52 are aligned, or substantially aligned with the upper web portions of the first row 50(1) of corrugations 52 or, are offset relative to the central longitudinal axis of the corrugations 50 in the previous row 50 of corrugations 52 by the predetermined distance, d, but disposed on the opposite side of the central longitudinal axis of the corrugations in the previous row 50(2). In some embodiments, for example, the predetermined distanced d is about 50% of the overall width of the corrugations 52.

The corrugations 50 each define an aperture or fluid passageway 60 opening in the longitudinal or axial direction X-X of the heat transfer surface 12. In the subject example embodiment, the heat transfer surface 12 is disposed in the fluid flow passage 14 of the heat exchanger 10 such that the apertures or fluid passageways 60 of the heat transfer surface 12 extend along the longitudinal or axial direction X-X of the heat transfer surface 10 in the direction of incoming fluid flow as illustrated by representative flow directional arrow 63 shown in FIG. 9. When the heat transfer surface 12 is disposed in this orientation relative to the direction of incoming fluid flow, each row 50 of corrugations 52 defines an end edge 62 that serves as a leading edge associated with the overall heat transfer surface 12. When the heat exchange fluid flowing through the heat exchanger 10 enters the fluid flow passage 14 with the heat transfer surface 12 disposed therein, the fluid will periodically encounter the end edge or leading edge 62 associated with each row 50 of corrugations 52 creating turbulence within the fluid stream as it passes through the heat transfer surface 12 between the inlet end and outlet end of the heat exchanger 10 which turbulence in the fluid flow helps to increase heat transfer performance of the heat exchanger 10.

In the subject example embodiment, however, since only specific areas of the heat exchanger 10 are required for heat transfer in order to account for the localized heat generated at the contact surface or interface between the heat exchanger 10 and the individual electronic components mounted or disposed on the outer surface of the heat exchanger 10, rather than a having a continuous, constant rate of heat transfer across the entire surface of heat exchanger 10, as is found in many conventional heat exchangers with traditional heat transfer applications, the heat transfer surface 12 in the subject example embodiment is configured such that increased turbulence is introduced into the fluid stream as it passes through the heat transfer-augmenting zones 48 while less or decreased turbulence, as compared to the heat transfer-augmenting zones 48, is introduced into the fluid stream as it passes through the heat transfer-reducing zones 46, as compared to the heat transfer-augmenting zones 48. Accordingly, fluid passing through the heat transfer-augmenting zones 48 encounters a more tortuous, turbulent flow path through the fluid flow passage 14 of the heat exchanger 10 as compared to the fluid passing through the heat transfer-reducing zones 46.

In order to accommodate for the difference in the amount of turbulence required, the heat transfer-reducing zones 46 each include one or more rows 50 of corrugations 52 wherein the corrugations 52 have a length, L, that extends in the axial or longitudinal direction X-X of the heat transfer surface 12 that is greater than the length, l, of the corrugations in the rows of corrugations that make-up the heat transfer augmenting zones 48. Accordingly, as the heat exchange fluid passes through the heat transfer-reducing zone 46 of the heat transfer surface 12, it will encounter fewer leading edges 62 over the same axial or longitudinal distance through the heat transfer surface 12 as compared to when the fluid travels through a heat transfer-augmenting zone 48.

The fluid travelling through the heat transfer-reducing zone 46 also travels along the inner and outer surfaces of the fin surface portions 58 associated with each of the corrugations 52 in the rows 50 of corrugations in the heat transfer-reducing zones 46 which have a greater surface area than the individual fin surface portions 58 associated with the corrugations 52 in the rows 50 of corrugations 52 found in the heat transfer-augmenting zones 48. Therefore, the fluid travelling through the heat transfer-reducing zones 46 is more likely to be subject to boundary layer growth along the fin surface portions 58 which may also contribute to the reduction in heat transfer performance through the heat transfer-reducing zones 46.

The fluid travelling through the heat transfer-reducing zone 46 may also be more likely to have a reduced or decreased pressure drop through the heat transfer-reducing zone 46 as it travels through the heat exchanger 10 due to the generally larger apertures or fluid passageways 60 provided by the larger and fewer number of corrugations 52 through the heat transfer-reducing zone 46. Any decrease in pressure drop encountered through the heat transfer-reducing zones 46 helps to offset the higher pressure drops encountered across the heat transfer-augmenting zones 48 where the density of corrugations is increased relative to the density of corrugations found in the heat transfer-reducing zones 46.

In the subject example embodiment, the heat transfer-reducing zones 46 are interposed with heat transfer-augmenting zones 48. The heat transfer-augmenting zones 48 include a plurality of rows 50 of corrugations 52 where the corrugations 52 in each row 50 have a length, l, that is less than the length, L, of the corrugations 52 found in the heat transfer-reducing zones 46. Accordingly, the heat transfer-augmenting zones 48 include a greater number of rows 50 of corrugations 52 than the heat transfer-reducing zones 46. As the heat exchange fluid passes through the heat transfer-augmenting zones 48 of the heat transfer surface 12, the fluid encounters a greater number of end edges 62 due to the greater number of the rows 50 of corrugations 52 found over the same axial or longitudinal distance through the heat transfer surface 12 as compared to when the fluid travels through a heat transfer-reducing zones 46. As well, the higher density of row of corrugations 52 found through the heat transfer-augmenting zones 48 requires the fluid to continuously switch directions as it travels through the offset rows 50 of corrugations 52 which introduces more turbulence into the fluid stream and creates a more tortuous overall flow path. Boundary layer growth is also inhibited through the heat transfer-augmenting zones 48 due to the fin surface portions 48 associated with the corrugations 52 through the heat transfer augmenting zone 48 having a smaller, overall surface area as compared to the fin surface portions 48 of the corrugations 52 through the heat transfer-reducing zones 46.

The heat transfer-augmenting zones 48, therefore, are configured such that fluid flowing through the heat transfer-augmenting zones 48 undergoes increased turbulence relative to fluid flowing though the heat transfer-reducing zones 46. The difference between the amount of turbulence generated through the heat transfer-augmenting 48 as compared to the heat transfer-reducing zones 46 is with effect that increased heat transfer and increased heat transfer performance occurs across the portion of the heat exchanger plate 20 that is disposed on top of, or in axial alignment with, or in direct relationship to the heat transfer-augmenting zones 48 of the heat transfer surface 12 disposed within the enclosed fluid flow channel 14 as compared to the amount of heat transfer that occurs across the portion of the heat exchanger plate 20 that is disposed on top of or in direct relationship with the heat transfer-reducing zones 46 of the heat transfer surface 12 disposed within the enclosed fluid flow channel 14.

Figure 9:
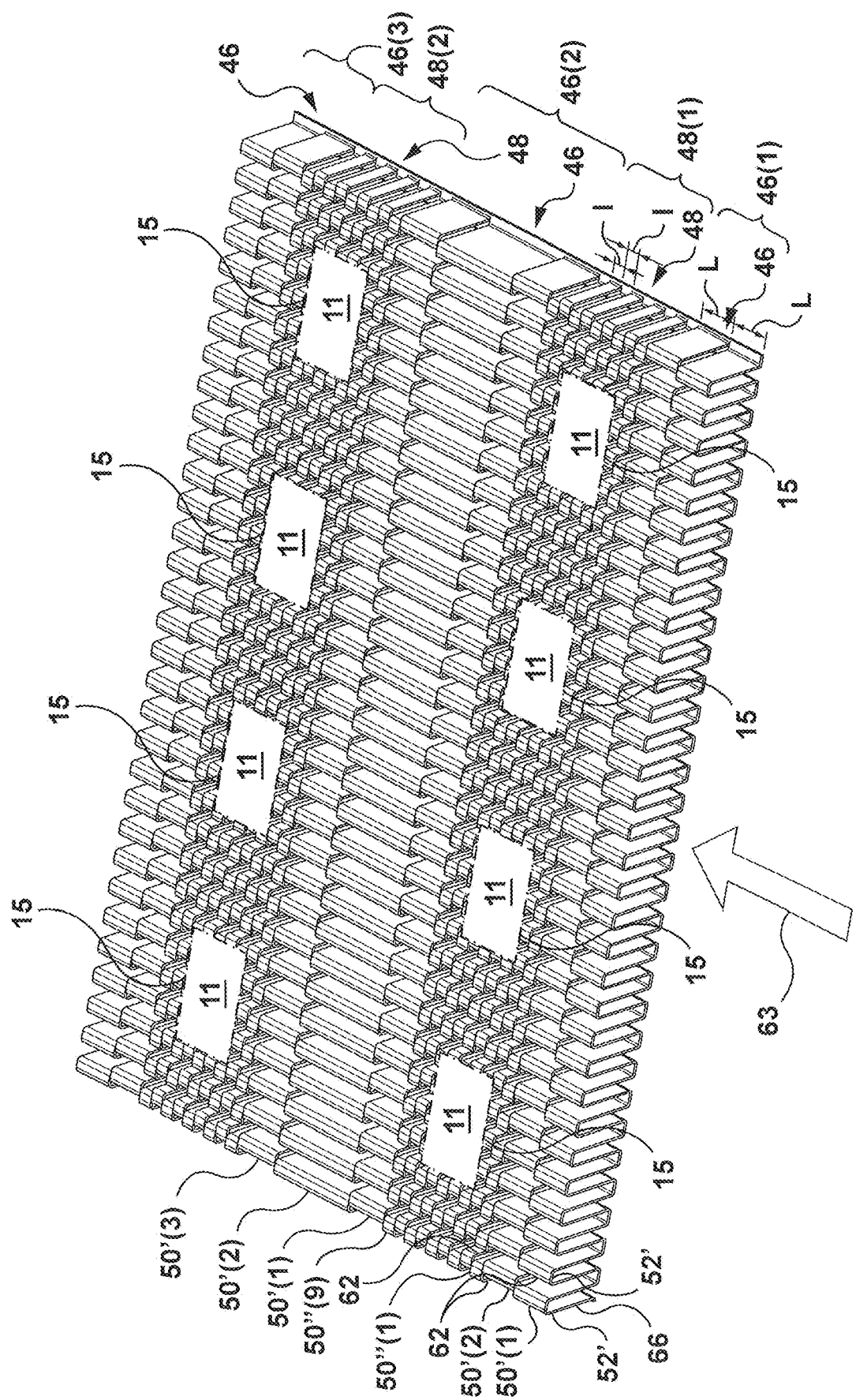
FIG. 9 is a top, perspective view of the heat transfer surface as used in the heat exchanger of FIG. 1 including schematic representations of the relative placement of the electronic components mounted on the heat exchanger.

Accordingly, in the subject example embodiment, the heat transfer surface 12 is configured so as to generally correspond to the placement of the electronic components 11 on the outer surface of the heat exchanger 10 such that while the heat transfer surface 12 is disposed in the fluid flow passage 14 and while the electronic components are mounted on or disposed on the outer surface of the heat exchanger 10, the heat transfer augmenting zones 48 include sections that are disposed in parallel, or substantially parallel, relationship with and are axially or substantially axially aligned with the electronic components while the heat transfer-reducing zones 46 are disposed in parallel, or substantially parallel, relationship with and axially or substantially axially aligned with the areas or sections of the outer surface of the heat exchanger that are disposed between or adjacent areas occupied by an electronic component, as illustrated schematically in FIG. 9.

By varying the length of the corrugations 52 across the heat transfer surface 12 and by configuring the heat transfer surface 12 such that the rows of corrugations associated with the heat transfer-reducing zones 46 are disposed in direct contact with portions of the first and second heat exchanger plates 20, 22 that are not in direct thermal heat transfer relationship with the individual electronic components mounted on the outer surface of the heat exchanger 10 while the rows of corrugations associated with the heat transfer-augmenting zones 48 are disposed in direct contact with portions of the first and second heat exchanger plates 20, 22 that are in direct thermal heat transfer relationship with the individual electronic components, the overall fluid properties of the heat exchanger fluid travelling through the heat transfer surface 12 within the enclosed fluid flow channel 14 varies, creating a mixed-flow fluid stream, which helps to provide improved, localized heat transfer in the target areas subject to hotspots 15 created by the electronic components.

In some embodiments, for example, the number of rows 50 of corrugations 52 in each heat transfer-reducing zone 46 is the same.

In some embodiments, for example, the number of rows of 50 of corrugations 52 in each heat transfer-reducing zone 46 varies, with the number of rows 50 being related to the overall size or surface area on either the first or second heat exchanger plate 20, 22 that is not subjected to the high, localized heat flux generated by the electronic components 11.

Accordingly, the heat transfer-reducing zones 46 generally correspond to the areas between and surrounding the placement of the individual electronic components 11.

In some embodiments, for example, the dimensions of the heat transfer augmenting zones 48 and the heat transfer reducing zones 46 are correlated to the dimensions of the specific electronic components 11 mounted on the outer surface of the heat exchanger 11. Accordingly, the number of rows of corrugations 50 that make up the heat transfer augmenting zones 48 is selected so as to accommodate the overall length of the electronic component, as measured along an axis parallel to, or substantially parallel to, the direction of incoming flow. In instances where two electronic components 11(1), 11(2) are present, as illustrated schematically in FIG. 1A, the overall length, j, of the heat transfer augmenting zone 48, as measured along an axis parallel to, or substantially parallel to, the direction of incoming flow, is tailored so as to accommodate the electronic component having the longer axial length, see for instance electronic component 11(1) with axial length AL1 as shown schematically in FIG. 1A. Therefore, in some embodiments, for example, the heat transfer augmenting zones 48 can extend beyond the footprint of some of the electronic components, for instance electronic component 11(2) with axial length AL2 shown schematically in FIG. 1A so as to accommodate the other electronic components 11 disposed with a group.

In some example embodiments, for example, the heat transfer surface 12 is formed from a thin sheet of metal, such as aluminum, that is engaged between a set of dies that cuts and displaces portions of the sheet of metal to form the corrugated heat transfer surface 10. A first set of dies is used for forming the cuts or slits associated with the heat transfer-reducing zones 46 while a second set of dies is used for forming the cuts or slits associated with the heat-transfer augmenting zones 48 in order to account for the different lengths associated with the corrugations in the heat transfer-reducing zones 46 as compared to the heat transfer-augmenting zones 48. For example, with reference to the schematic illustration in FIG. 9A, the heat transfer reducing zone 46 associated with the inlet end of the heat exchanger, for instance heat transfer reducing zone 46(1) in FIG. 9A with axial length, k, the lances or slits used for forming the offset corrugations in the heat transfer surface 12 may range from at least 1.3 mm to 10 mm, or preferably 3 mm with the total axial length, k, of the zone 46(1) ranging from about the same axial length y as the corresponding electronic component 11 or example heat source to about 6 times the axial length y. In some embodiments the axial length k is about 2.1y.

Figure 9A:
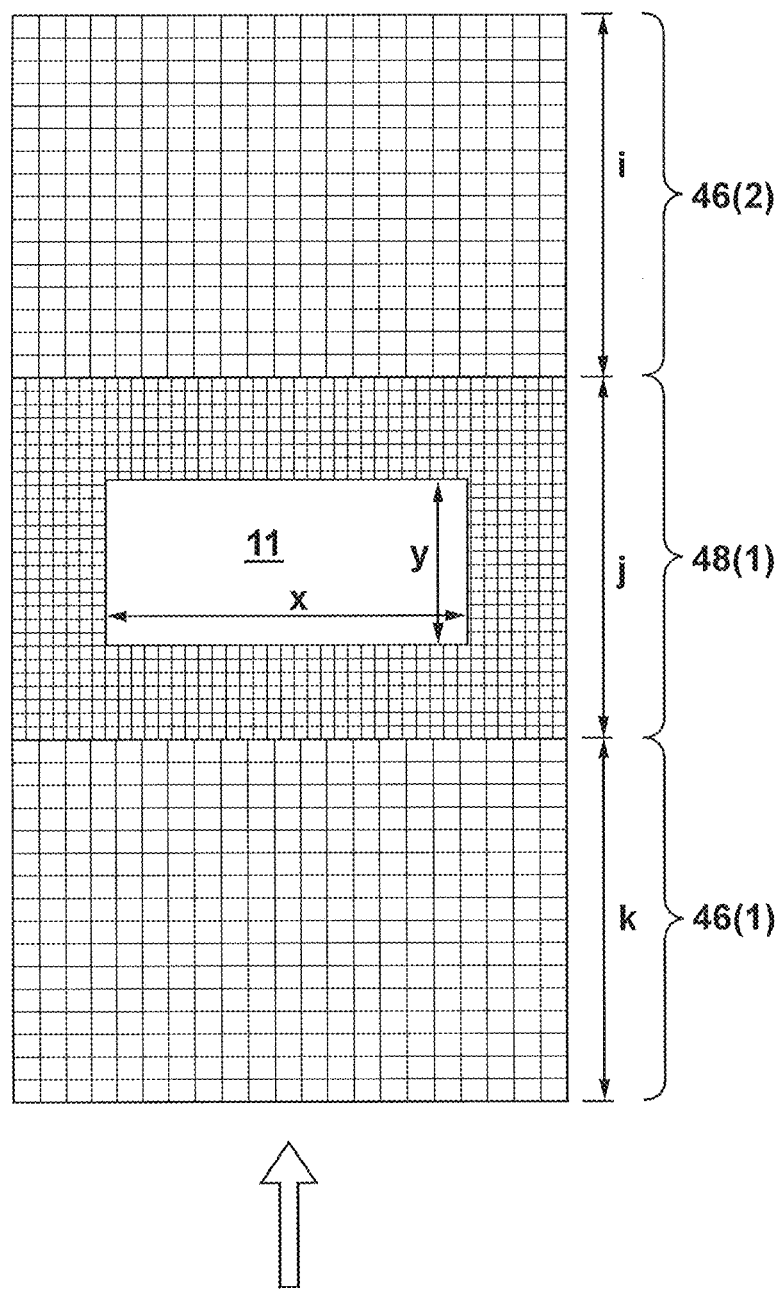
FIG. 9A is a schematic illustration of the relationship between the dimensions of the electronic components mounted on the heat exchanger and the dimensions of the corrugations of the heat transfer surface according to various example embodiments of the present disclosure.
Figure 10:
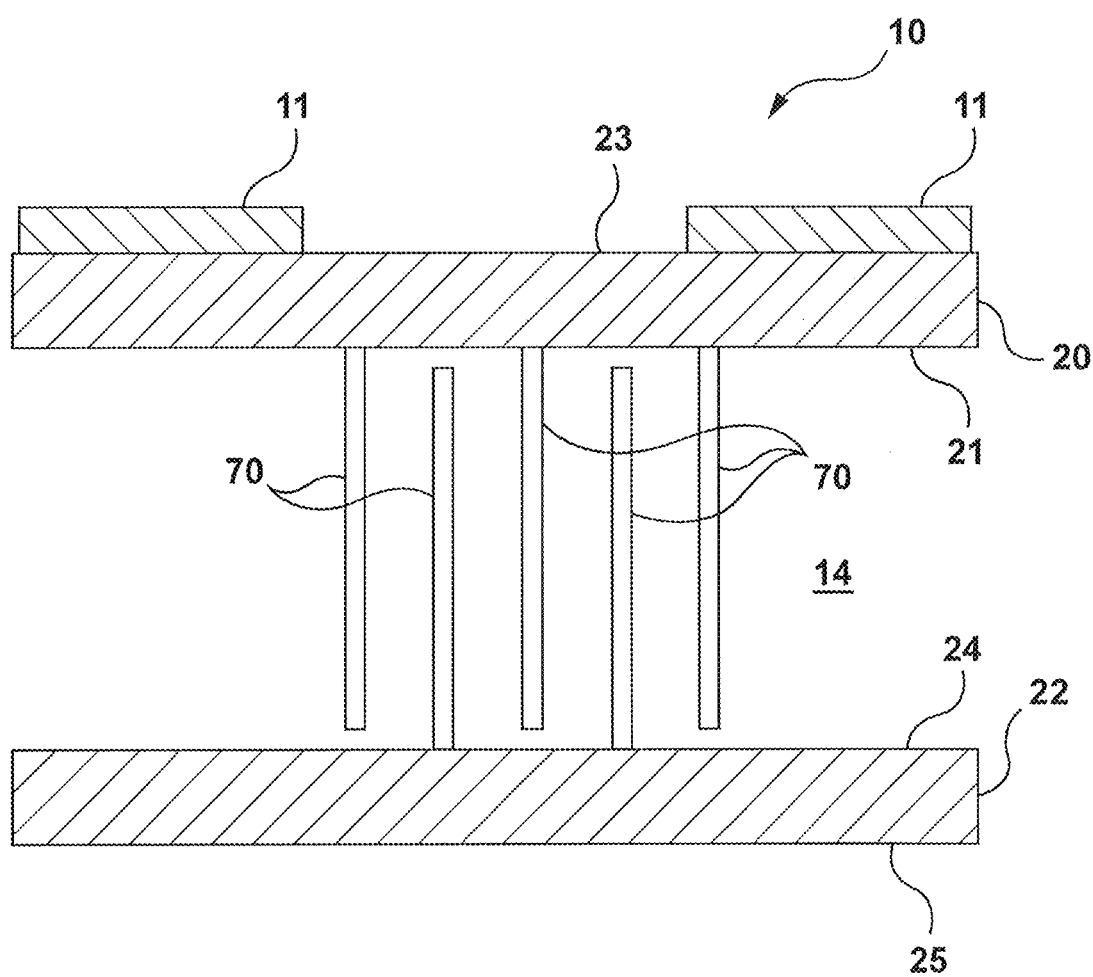
FIG. 10 is a schematic, partial cross-sectional view of a portion of a heat exchanger according an example embodiment of the present disclosure with the heat transfer surface removed for ease of illustration.
Figure 11:
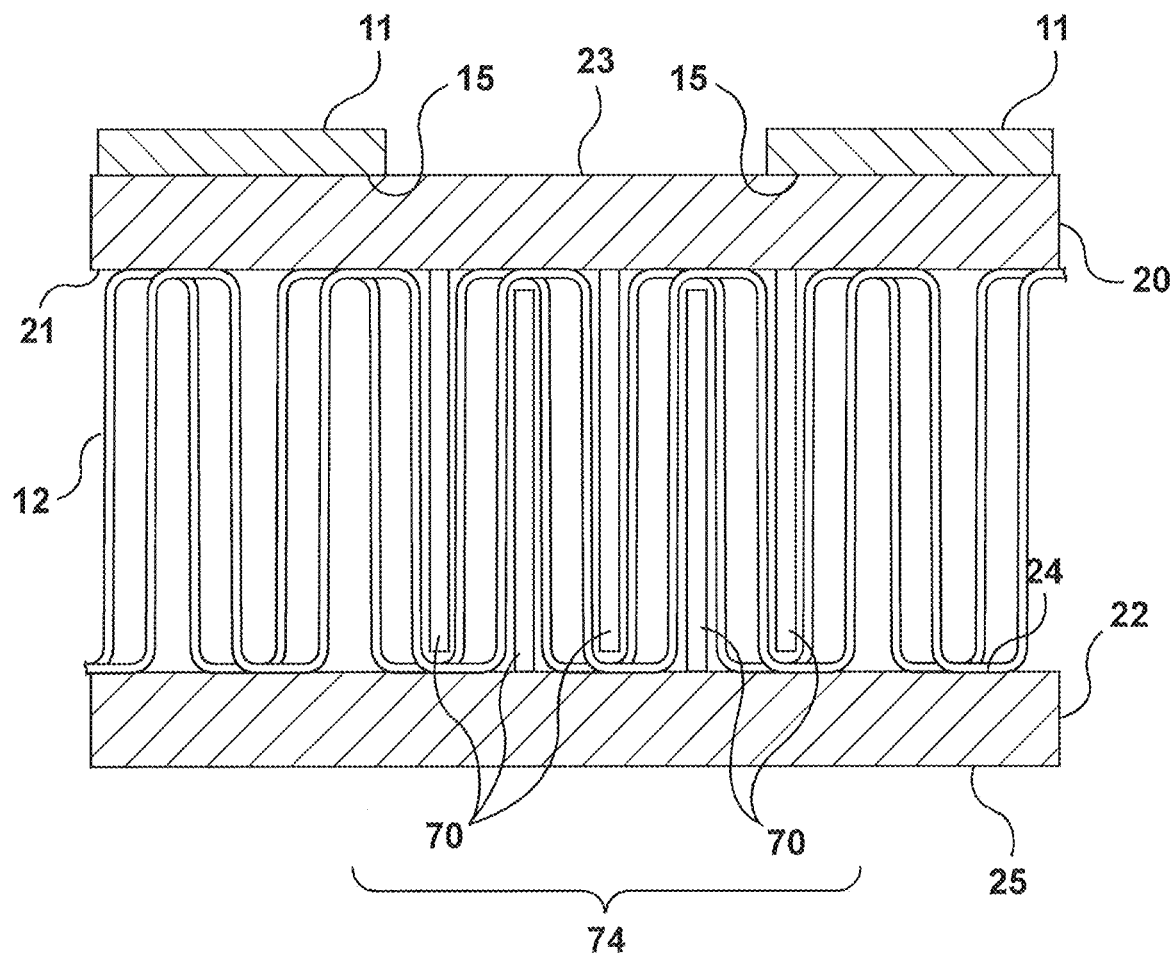
FIG. 11 is a schematic, partial cross-sectional view of the portion of the heat exchanger of FIG. 10 incorporating the heat transfer surface.

Turning now to the example heat transfer augmenting zone illustrated schematically in FIG. 9a, the lances or slits used for forming the offset corrugations in the heat transfer surface 12 may range from at least 0.5 mm to about 1.3 mm, or preferably 0.7 mm, with the total axial length, j, of the zone 48(1) ranging from about the same axial length, y, as the corresponding electronic component 11 or example heat source shown in FIG. 9A to about 2.5 times the axial length y. In some embodiments the axial length, j, is about 2.1y, and has the same axial length and the heat transfer reducing zone 46(1).

Turning now to the example heat transfer reducing zone 46(2) illustrated schematically in FIG. 9A that is associated with the outlet zone or outlet region of the heat exchanger 10, the lances or slits used for forming the offset corrugations in the heat transfer surface 12 may range from at least 1.3 mm to 10 mm, or preferably a combination of 3 mm lances and 7 mm lances with the total axial length, i, of the zone 46(2) ranging from about the same axial length y as the corresponding electronic component 11 or example heat source to about 6 times the axial length y (i.e. 6y). In some embodiments the axial length, i, is about 2.1y.

While various example dimensions for the lances or slits for forming the heat transfer surface are described in reference to the schematic illustration in FIG. 9A, it will be understood that the exact dimensions may vary depending on the manufacturing technique used and the overall thickness of the materials used.

In the specific, non-limiting, example embodiment illustrated in FIG. 9, the heat transfer surface 12 includes a first heat transfer reducing zone 46(1) that includes two rows of corrugations 50'(1), 50'(2) wherein the corrugations 52' have a first, predetermined length. In some embodiments, for example, the first predetermined length is about two to three times the length of the corrugations 52" in the heat transfer-augmenting zones 48.

The first heat transfer-reducing zone 46(1) is followed by a first heat transfer-augmenting zone 48(1) that includes nine rows of corrugations 50"(1)-50"(9) wherein the corrugations 52" have a second, predetermined length that is less than the first predetermined length. The first heat transfer-augmenting zone 48(1) is followed by a second heat transfer-reducing zone 46(2) that includes three rows of corrugations 50'(1), 50'(2), 50'(3) wherein the first and third rows of corrugations each have the same first predetermined length of the rows of corrugations found in the first heat transfer-reducing zone 46(1) while the second row of corrugations 50'(2) in the second heat transfer reducing zone 46(2) has a second predetermined length that is greater than the first predetermined length. In some embodiments, for example, the second predetermined length of the second row of corrugations 50'(2) in the second heat transfer-reducing zone is about twice the length of the first predetermined length of the corrugations in the first and third rows of the second heat transfer-reducing zone 46(2). The second heat transfer-reducing zone 46(2) is followed by a second heat transfer-augmenting zone 48(2) which has the same structure as the first heat transfer-augmenting zone 48(1), the second heat transfer augmenting zone 48(2) followed by a third heat transfer-reducing zone 46(3) which has the same structure as the first heat transfer reducing zone 46(1).

While a specific example embodiment of the heat transfer surface has been described, it will be understood that the number of heat transfer-reducing zones 46(i) and the number of heat transfer augmenting zones 48(i) and the number of rows 50'(i), 50"(i) of corrugations in each of the various zones as well as the length of the various rows 50 of corrugations 52 in each of the zones 46, 48 will depend on the specific configuration of electronic components 11 mounted in conjunction with the heat exchanger 10 for a particular application and the particular thermal profile generated by the electronic components 11 across the surface of the heat exchanger 10.

In some embodiments, for example, in order to further enhance the heat transfer properties in the areas of the heat exchanger 10 associated with the hotspots 15 generated by the electronic components 11, the heat exchanger 10 includes flow directing features for directing the incoming coolant flow to regions of the fluid flow passage 14 within the heat exchanger 10 that are directly underneath the hotspots 15 associated with the placement of the electronic components 11 on the outer surface of the heat exchanger 10. The flow directing features may also serve to direct fluid away from regions of the fluid flow passage 14 within the heat exchanger 10 that are associated with regions between the hotspots 15 or regions that are removed from the locations of the hotspots 15 where high heat transfer performance is not necessarily required.

In some embodiments, for example, the flow directing features include flow-blocking inserts 70 that are disposed within the fluid flow passage 14 to prevent, or substantially prevent, incoming heat exchange fluid from travelling through specific regions of the fluid flow passage 14.

In some embodiments, for example, the flow-blocking inserts 70 include one or more groupings of pin fins that extend from the inner surfaces 21, 24 of the first and second heat exchanger plates 20, 22 and that are configured to align with specific ones of the individual apertures or fluid passageways 60 formed by the individual corrugations 52 in the rows of corrugations 50 of the heat transfer surface 12 when the heat transfer surface 12 is disposed between the first and second heat exchanger plates 20, 22. The flow-blocking inserts 70, therefore extend from the inner surfaces 21, 23 of the first and second plates 20, 22 to a point just slightly spaced apart from either the upper or lower web portion 54, 56 of the corresponding corrugation 52. The pin fins or flow-blocking inserts 70, therefore, effectively block or occupy a significant portion of the apertures or fluid passageways 60 defined by the corrugations 52 within which they are positioned with the effect that incoming fluid is directed away, or substantially directed away, from these areas or from the apertures or fluid passageways 60 of the heat transfer surface 12 due to the significant. increase in flow resistance encountered by the fluid entering the fluid flow passage 14 of the heat exchanger 10. In some embodiments, the pin fins or flow-blocking inserts 70 effectively block or occupy a significant portion of the apertures or fluid passageways 60 defined by the corrugations 52 within which they are positioned with the effect that fluid flow through the apertures or fluid passageways 60 defined by the corrugations 52 within which they are positioned is prevented, or substantially prevented, through these areas of the heat transfer surface 12.

In other embodiments, for example, the flow blocking inserts 70 include separate or individual inserts that are inserted or positioned within the apertures or fluid passageways 60 defined by the corrugations 52 of the heat transfer surface 12 associated with low heat transfer requirements. In some embodiments, for example, the flow-blocking inserts are rectangular, cladded inserts that are placed or strategically positioned within portions of the heat transfer surface 12 associated with low heat transfer requirements, the rectangular, cladded inserts being secured or fixed into position when the heat exchanger plates 20, 22 and the heat transfer surface 12 are brazed or otherwise secured together to form the heat exchanger 10.

In some embodiments, for example, the flow-blocking inserts 70 are cooperatively configured with the heat transfer surface 12 so as to provide flow-blocking zones 74 within the enclosed fluid flow passage 14 defined by the first and second heat exchanger plates 20, 22 wherein incoming fluid is prevented, or substantially prevented from flowing due to the increased flow resistance encountered in these areas with the effect that the incoming fluid is directed towards areas that are free from the fluid-blocking inserts 70 or towards flow-permitting zones 76.

Figure 12:
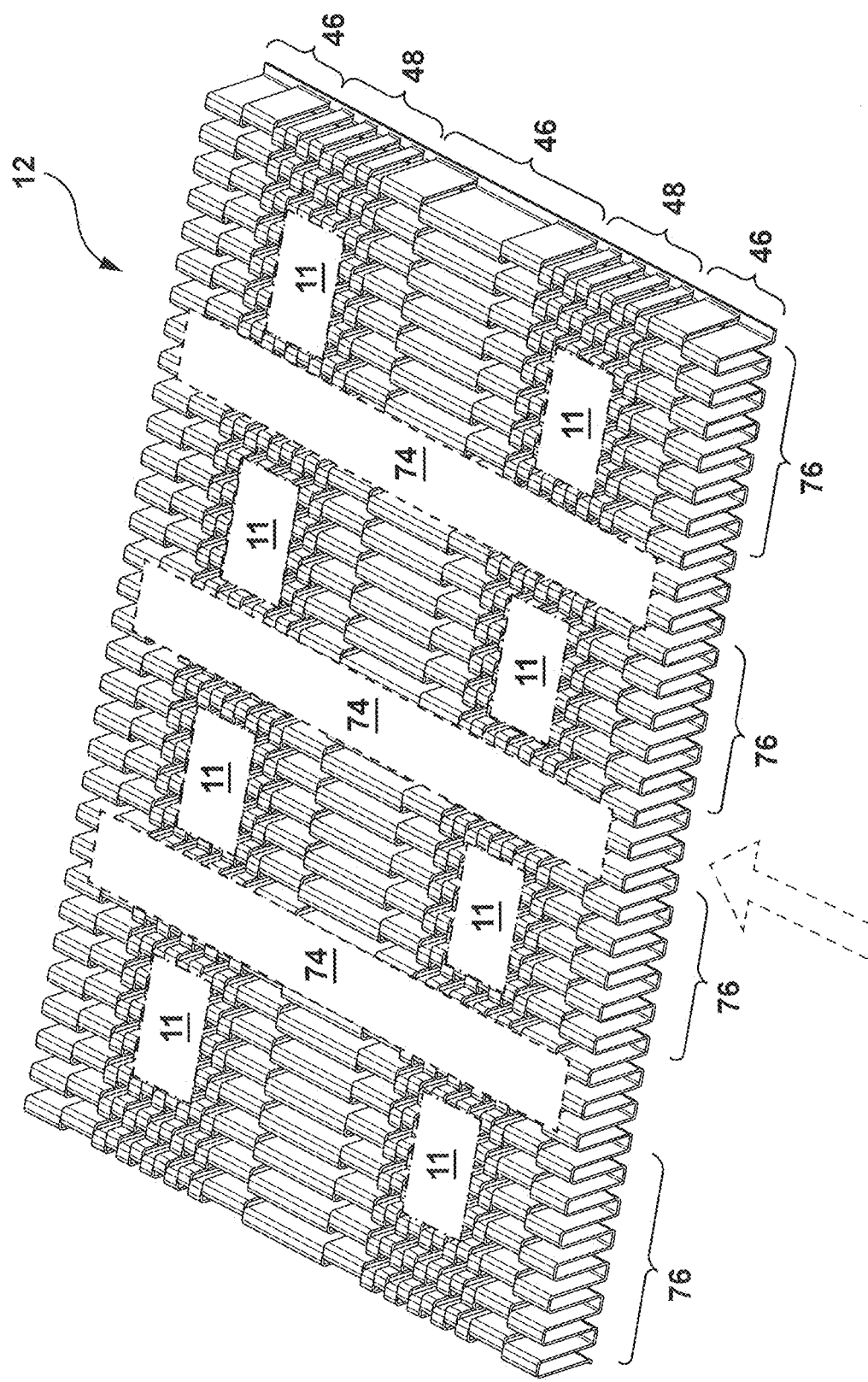
FIG. 12 is a top, perspective view of and embodiment of the heat transfer surface including schematic representations of intended flow-blocking zones according to an example embodiment of the present disclosure.
Figure 13:
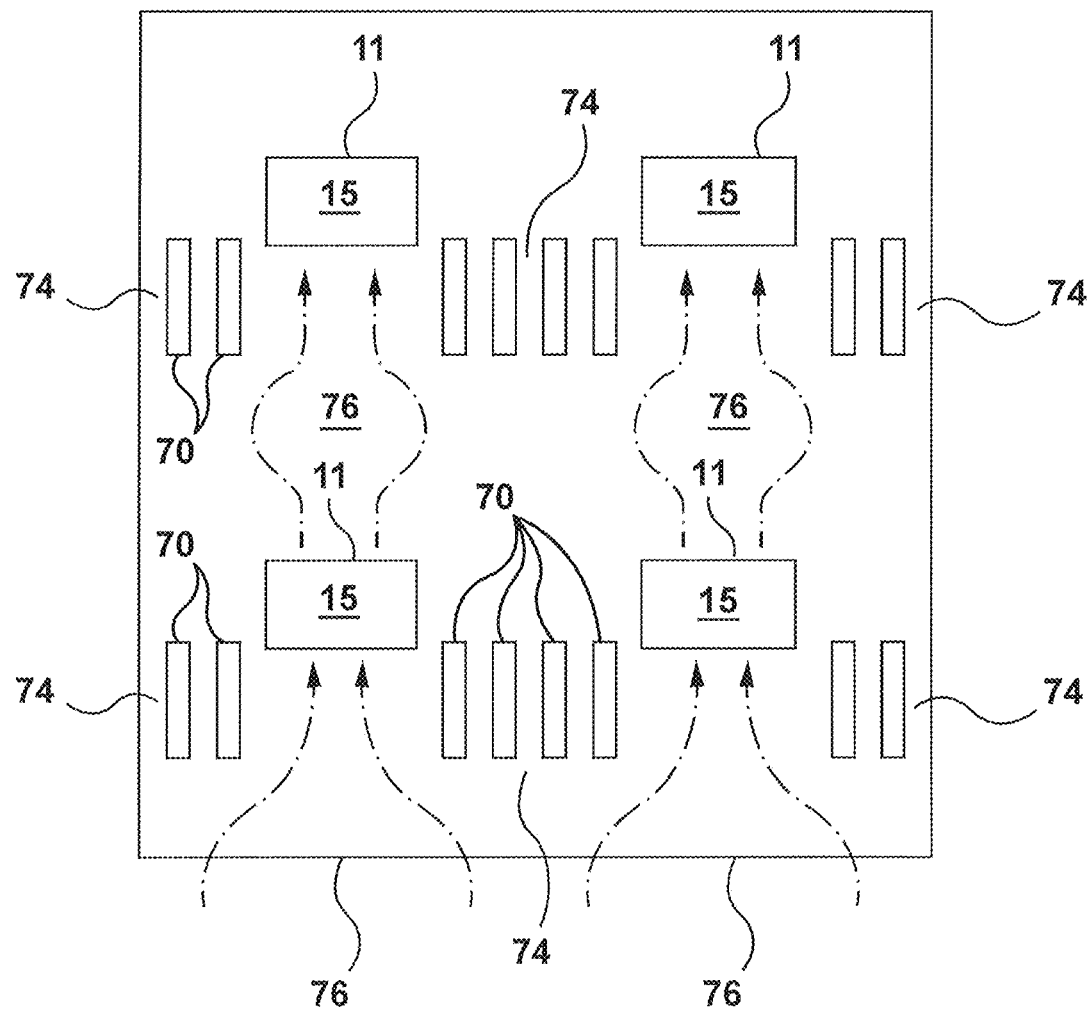
FIG. 13 is a schematic illustration of a top view of the fluid flow path through the heat exchanger according to an example embodiment of the present disclosure.
Figure 14:
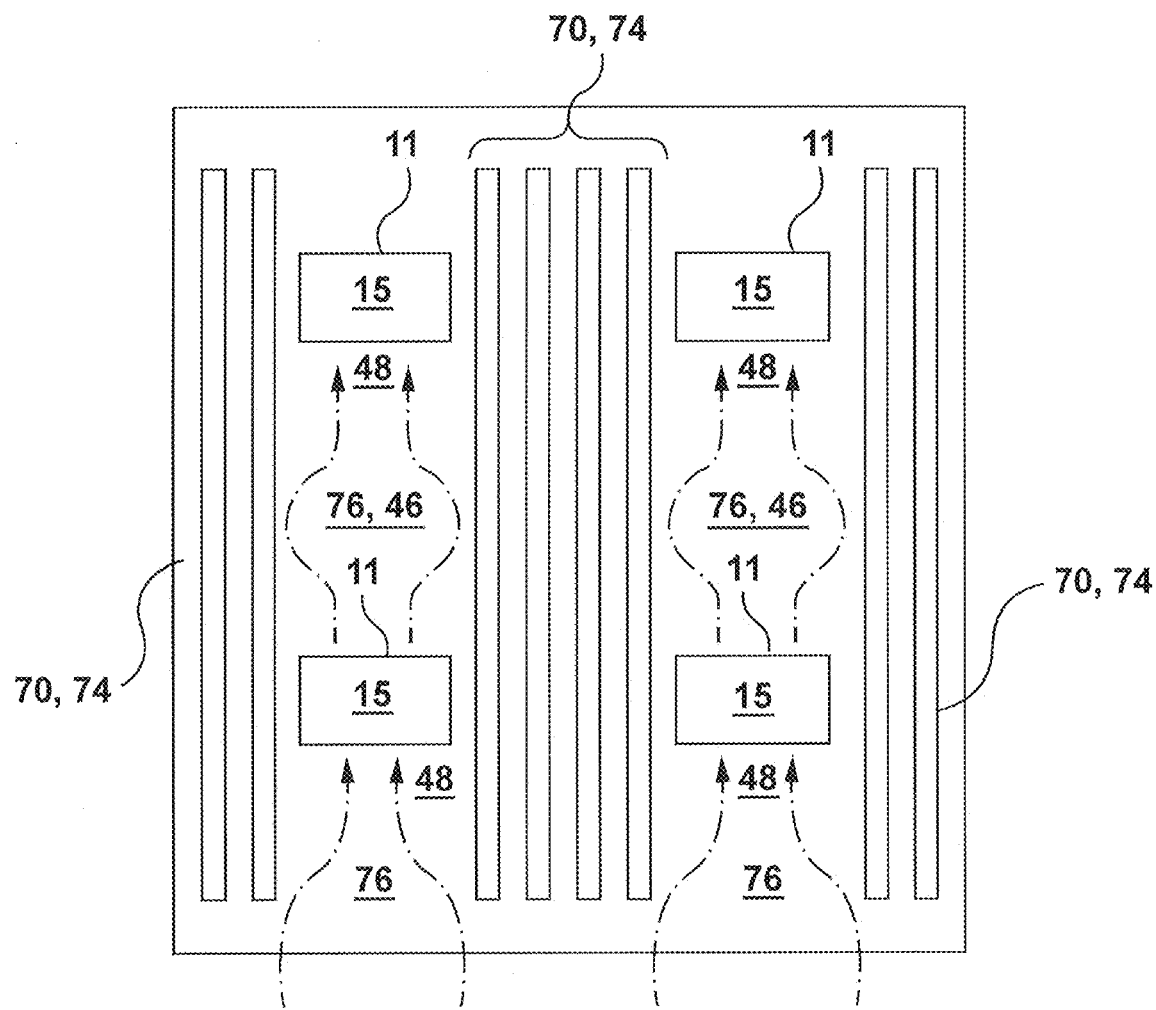
FIG. 14 is a schematic illustration of a top view of the fluid flow path through the heat exchanger according to an example embodiment of the present disclosure.

In some embodiments, for example, the flow-blocking zones 74 occupy discrete areas and comprise a width extending in the transverse direction Y-Y that generally corresponds to the number of corrugations 52 within a single row 50 in which a flow-blocking insert or pin fin 70 is inserted, and a length generally corresponding to the number of rows 50 of the heat transfer surface 52 along which the insert or pin fins 70 extend in the axial or longitudinal direction X-X as shown schematically in FIG. 13. In some embodiments, the individual flow-blocking zones 74 each have a length that corresponds to the length of the heat transfer-reducing zones 46. In some embodiments, the flow blocking zones 70 extend the entire length of the heat transfer surface 12, extending through both the heat transfer-reducing zones 46 as well as portions of the heat transfer augmenting zones 48 that are not in direction axial alignment, or substantially axial alignment with the electronic component as shown schematically in FIGS. 12 and 14.

In some embodiments, for example, the flow blocking zones 74 are spaced apart across the width or transverse axis Y-Y of the heat transfer surface 12.

In some embodiments, the flow permitting zones 76 include portions of the heat transfer-reducing zones 46 and portions of the heat transfer augmenting zones 48.

In some embodiments, for example, the heat transfer-reducing zones 46, the heat transfer-augmenting zones 48 and the flow-blocking zones 74 are cooperatively configured such that incoming fluid flow is distributed across the fluid flow passage 14 to promote heat transfer in areas in direct heat transfer relationship with the electronic components mounted on the outer surface of the heat exchanger so as to promote effective cooling of the hotspots created by the electronic components.

Figure 15:
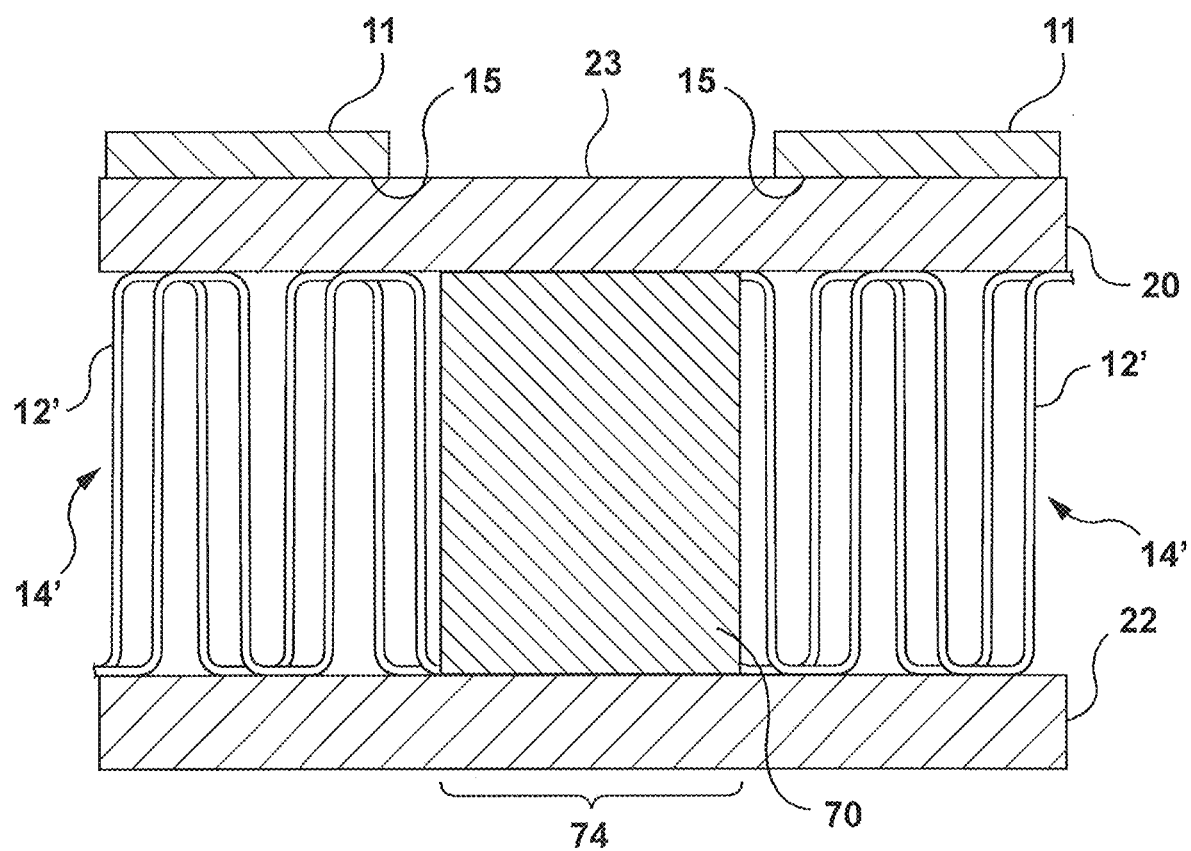
FIG. 15 is a schematic, partial cross-sectional view of a portion of a heat exchanger according an example embodiment of the present disclosure.
Figure 16:
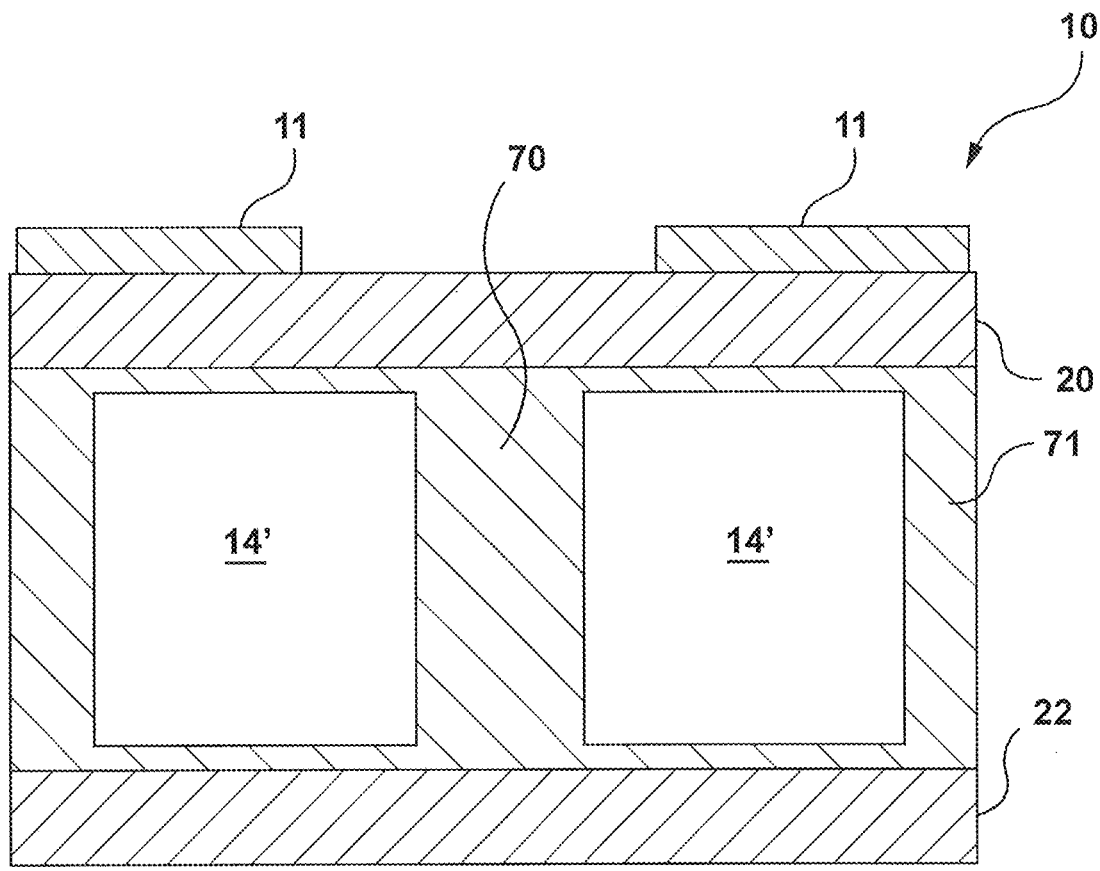
FIG. 16 is a schematic, partial cross-sectional view of a portion of a heat exchanger according an example embodiment of the present disclosure.
Figure 17:
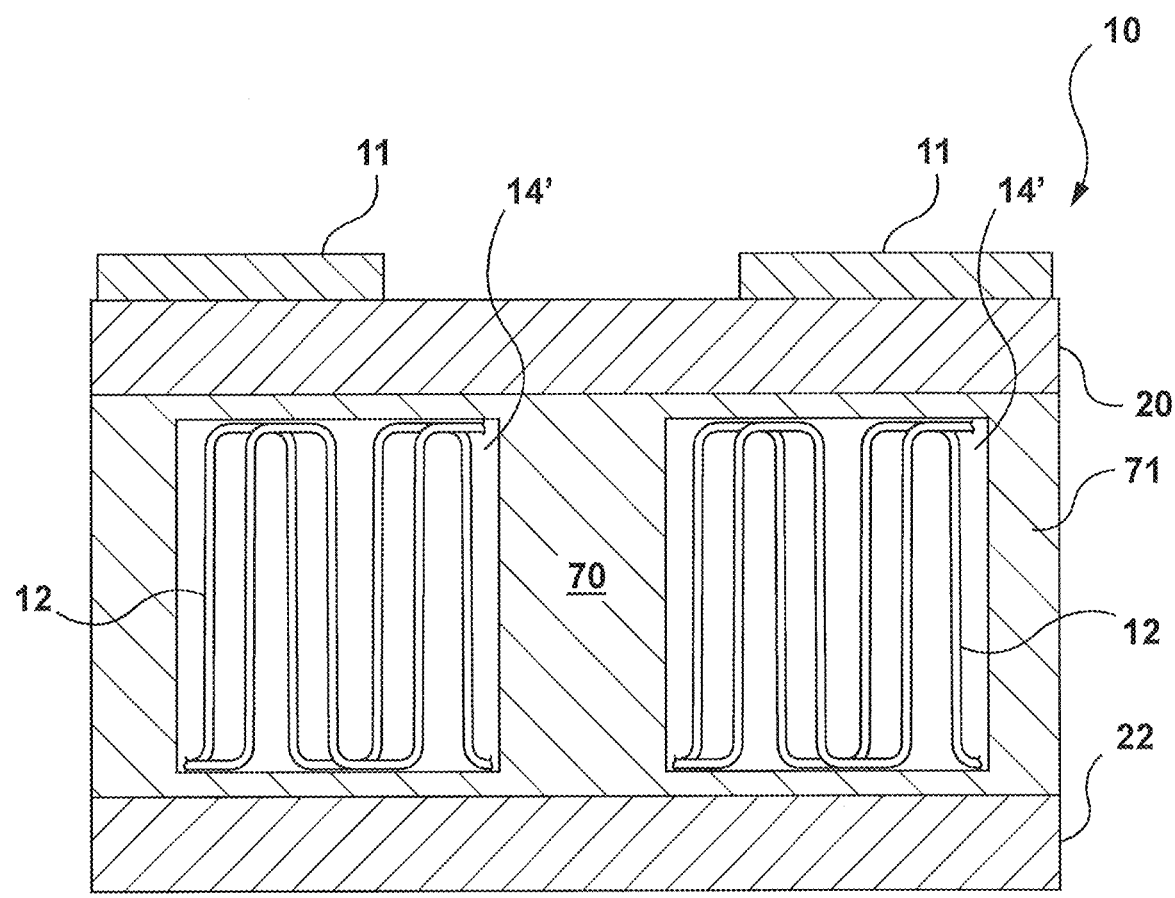
FIG. 17 is a schematic, partial cross-sectional view of a portion of the heat exchanger of FIG. 16 with heat transfer surface portions disposed within the fluid flow passage.
Figure 18:
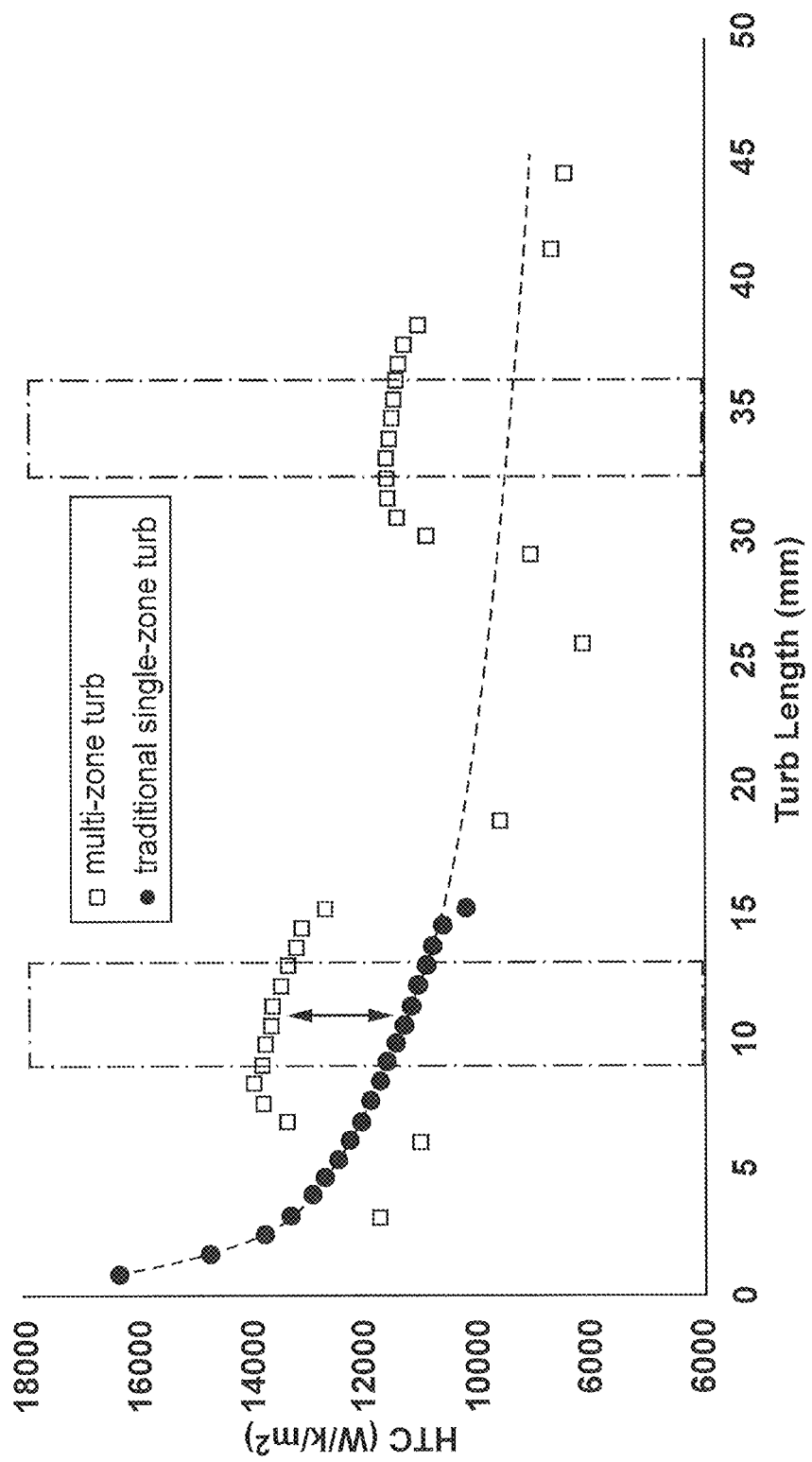
FIG. 18 illustrates performance test data for a heat exchanger incorporating a multi-zone heat transfer according to an example embodiment of the present disclosure.

In some embodiments, for example, the fluid flow passage 14 is divided into a plurality of fluid passage portions 14' by flow-blocking inserts 70 that extend along the length of the first and second heat exchanger plates 20, 22 with individual heat transfer surfaces 12' being disposed within each of the fluid passage portions 14' as shown schematically in FIG. 15. In some embodiments, for example, the flow-blocking inserts 70 are part of a unitary structure 71 disposed between the first and second plates 20, 22 which structure 71 defines the individual fluid flow passage portions 14' within which individual heat transfer surfaces 12' are inserted, as illustrated schematically in FIGS. 16 and 17. In some embodiments, for example, the fluid flow passage 14 includes manifold regions (not shown) at the inlet and outlet ends of the fluid flow passage 14 interconnecting the fluid passage portions 14' with the inlet and outlet of the heat exchanger 10.

Referring now to FIGS. 19-28, there is shown a heat transfer surface 12 according to another example embodiment of the present disclosure. In the subject example embodiment, the heat transfer surface 12 includes a corrugated member 79 having a plurality of corrugations 80 disposed in series transversely along the transverse axis Y-Y of the heat transfer surface 12 relative to the longitudinal axis or axial direction X-X of the heat transfer surface 12, each corrugation 80 extending longitudinally along axis X-X, the corrugations 80 therefore defining the length of the heat transfer surface 12. The corrugated member 79, therefore, comprises spaced apart upper and lower web portions 82, 84 that are interconnected by fin surface portions 86. The upper and lower web portions 82, 84 and the fin surface portions 86 are cooperatively configured such that an alternating series of upper and lower web portions 82, 84 interconnected by fin surface portions 86 is formed. Accordingly, in some embodiments, for example, each corrugation 80 includes an upper web portion 82 and two fin surface portions 86 extending therefrom with each corrugation 80 being connected to the adjacent corrugation or corrugations 80 by a lower web portion 84. Alternatively, in some embodiments, for example, each corrugation 80 may include a lower web portion 84 and two fin surface portions 86 extending therefrom, with each corrugation 80 being connected to the adjacent corrugation or corrugations 80 by an upper web portion 82.

In some embodiments, for example, the upper and lower web portions 82, 84 are curved or rounded while in other embodiments, the upper and lower web portions 82, 84 may provide flat or generally flat surfaces. The fin surface portions 86 are generally planar surface portions that, in some embodiments, are disposed at an angle relative to one another such that the fin surface portions 86 expand away from one another as they extend from either the corresponding upper web portion 82 or lower web portion 84. In other embodiments, for example, the fin surface portions 86 are disposed parallel or generally parallel relative to one another while being spaced apart from each other by the corresponding upper or lower web portion 82, 84. The fin surface portions 86, therefore, each provide a surface that extends along the direction of incoming flow when the heat transfer surface 12 is disposed within the fluid flow passage 14 of the heat exchanger 10.

In the subject example embodiment, the heat transfer surface 12 is disposed within the fluid flow passage such that the longitudinal axis X-X of the heat transfer surface 12 aligns with or is disposed in parallel alignment with the longitudinal axis of the fluid flow passage 14 of the heat exchanger 10. Accordingly, each corrugation 80 defines an aperture or fluid passageway 85 opening in the longitudinal or axial direction X-X of the heat transfer surface 12. In the subject example embodiment, the heat transfer surface 12 is disposed in the fluid flow passage 14 of the heat exchanger 10 such that the apertures or fluid passageways 85 of the heat transfer surface 12 extend along the longitudinal or axial direction X-X of the heat transfer surface 12 in the direction of incoming fluid flow.

A plurality of louvers 88 are disposed within the fin surface portions 86 of each of the corrugations 80. The louvers 88 are formed integrally and seamlessly by cutting and raising small sections of the fins surface portions 86 out of the surface of the fin surface portions 86 thereby forming a plurality of spaced apart slits or gaps within the fin surface portions 86 that define louver flow passages 90. The plurality of louvers 88 include an upstream group of louvers 89 and downstream group of louvres 91 wherein, in the upstream group of louvers 89, the louvers 88 are raised out of the plane of the fin surface portions 86 such that they have a leading edge 92 disposed in the direction of incoming flow and a downstream edge 94 directed away from the direction of incoming flow. In the downstream group of louvers 91, the louvers 88 are oriented such that their leading edge 92 is disposed on the opposite side of the plane of the fin surface portion 86 with the down steam edge 94 also disposed opposite to the downstream edge 94 of the upstream group of louvers 89. The upstream group 89 of louvers 88 is separated or spaced apart from the downstream group 91 of louvers 88 by a planar, or substantially planar, portion 96 of the fin surface portion.

In the subject example embodiment, the heat transfer-reducing zones 46 of the heat transfer surface 12 are defined by groups of heat transfer-reducing louvers 97 while the heat transfer-augmenting zones 48 of the heat transfer surface 12 are defined by groups of heat transfer-augmenting louvers 98. Heat transfer-augmenting louvers 98 and heat transfer-reducing louvers 97 are disposed in both the upstream group of louvers 89 and the downstream group of louvers 91. In the subject example embodiment, the groups of heat transfer-reducing louvers 97 and the groups of heat transfer-augmenting louvers 98 are arranged in a repeating pattern of a first group of heat transfer-reducing louvers 97(1) followed by a first group of heat transfer-augmenting louvers 98(1), which together form the upstream group of louvers 89. The first group of heat transfer-augmenting louvers 98(1) is followed by a second group of heat transfer-augmenting louvers 98(2) which group is followed by a second group of heat transfer-reducing louvers 97(2). The second group of heat transfer-augmenting louvers 98(2) and the second group of heat transfer-reducing louvers 97(2) together form the downstream group of louvers 91 with the first group of heat transfer-augmenting louvers 98(1) being separated or spaced apart from the second group of heat transfer-augmenting louvers 98(2) by planar, or substantially planar, portion 96 which is free of louvers 88.

The heat transfer-reducing louvers 97 are defined by louvers 88 having a length that is less than the length of the louvers 88 forming the heat transfer-augmenting louvers 98. Therefore, the heat transfer-reducing louvers 97 are defined by louvers 88 having a first length, $l$, taken along the overall height, $H$, of the fin surface portion 86. The heat transfer-augmenting louvers 98 are defined by louvers having a second length, $L$, taken along the overall height, $H$, of the fin surface portion 86, wherein the first length, $l$, is less than the second length. Therefore, in some embodiments, the heat transfer reducing louvers 97 are referred to as short louvers while the heat transfer augmenting louvers 98 are referred to as long louvers.

The heat transfer reducing louvers 97 define louver flow passages 90 that are generally considered to be smaller than the louver flow passages 90 defined by the heat transfer-augmenting louvers 98. The smaller, louver flow passages 90 provide for less efficient heat transfer in the associated heat transfer-reducing zone 46 as the short or heat transfer-reducing louvers create less optimized flow through the heat transfer surface 12 when disposed within the fluid flow passage 14, including, perhaps, increased boundary layer growth along the fin surface portion 86 within the heat transfer reducing zones 46. This less-optimized flow contributes to reduced overall heat transfer performance across the outer surface of the heat exchanger 10 in the regions associated with or in direct heat transfer relationship with the heat transfer reducing zones 46 which, generally correspond to the regions on the outer surface of the heat exchanger 10 that are disposed between and/or adjacent to the areas occupied by the electronic components which are known to be the target, hotspot areas of the heat exchanger 10.

The long louvers or heat transfer-augmenting louvers 98 define louver flow passages 90 that are larger than the louver flow passages 90 provided by the heat transfer-augmenting louvers due to the greater length of the slit or gap formed in the fin surface portion 86 by the heat transfer-reducing louvers 98 and serve to increase turbulence and prevent or disrupt boundary layer growth in the fluid flowing through the heat transfer surface 12 within the heat transfer-augmenting zones 48 which, in turn, serves to increase or promote heat transfer performance across the outer surface of the heat exchanger 10 that is associated with or in direct thermal transfer relationship with the heat transfer-augmenting zones 48 of the heat transfer surface 12.

Depending upon the particular application of the heat exchanger 10 and the particular heat transfer profile that is desired across the surface of the heat exchanger 10, the number of heat transfer-reducing louvers 97 in each of the groups of heat transfer-reducing louvers 97 within the heat transfer reducing zones 48 may be the same, or may differ from zone to zone. Similarly, the number of heat transfer-augmenting louvers 98 provided in each of the groups of heat transfer-augmenting zones 48 may be the same or may differ from zone to zone. As well, the number of heat transfer-augmenting louvers 98 in one or more of the groups of heat transfer-augmenting louvers 98 that define the heat transfer augmenting zones 48 may be the same as the number of heat transfer reducing louvers 46 in each of the groups of heat transfer-reducing louvers 97 that define the heat transfer reducing zones 46, or, the number may be different.

In some embodiments, for example, as shown for instance in FIGS. 21-25, the long louvers or the heat transfer-augmenting louvers 98 may extend the entire height, H, or substantially the entire height defined by the fin surface portion 86 of the corrugations 80 that form the heat transfer surface 12. For instance, in one non-limiting example embodiment, the overall height, h1, defined by the corrugation 80 taken along an axis that extends normal to the surface on which the heat transfer surface 12 is disposed is about 11±0.1 mm, the height, h1, corresponding to the vertical or substantially vertical distance between the upper web portion 82 and the lower web portion 84. The fin surface portions 86 each define a surface that extends between the upper web portion 82 and lower web portion 84 that has a height taken along an axis generally perpendicular to the longitudinal axis of the fin surface portion 86. In the subject, non-limiting example embodiment, the height, h2, is about 9.68 mm taken along an axis that extends generally perpendicular to the longitudinal axis of the fin surface portion 86, which, in the subject example embodiment, corresponds to the length, L, of the heat transfer augmenting louvers 98, while the length, l, of the heat transfer reducing louvers 97 is about 8.26 mm, as taken along an axis that extends along the plane of the fin surface portion 86 transverse to the longitudinal axis of the fin surface portion 86. In the subject, non-limiting, example embodiment the heat transfer surface 12 includes a corrugated member having about 14 fpi (fins per inch) with the angle of both the heat transfer augmenting louvers 98 and the heat transfer reducing louvers 97, relative the plane of the fin surface portion 86, being about 30°±5°.

Figure 26:
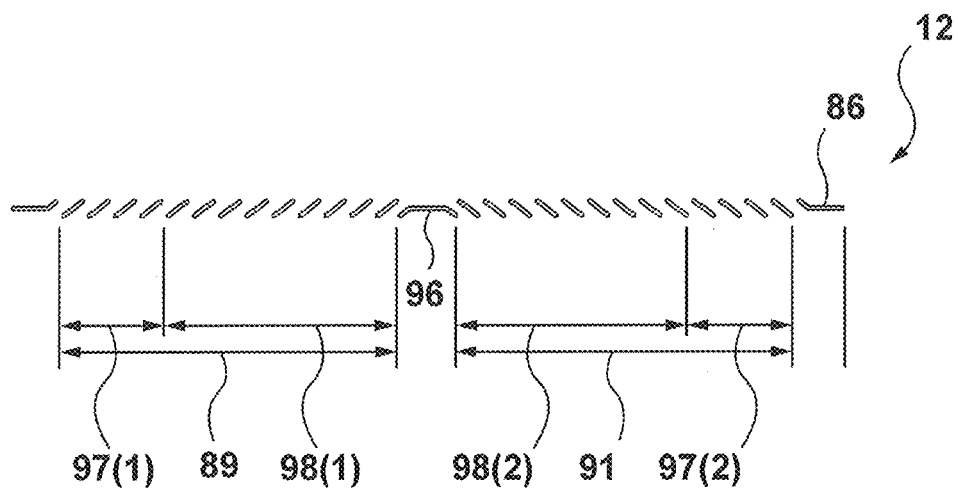
FIG. 26 is a section view of a heat transfer surface according to another example embodiment of the present disclosure similar to the view shown in FIG. 23.
Figures 27, 28:
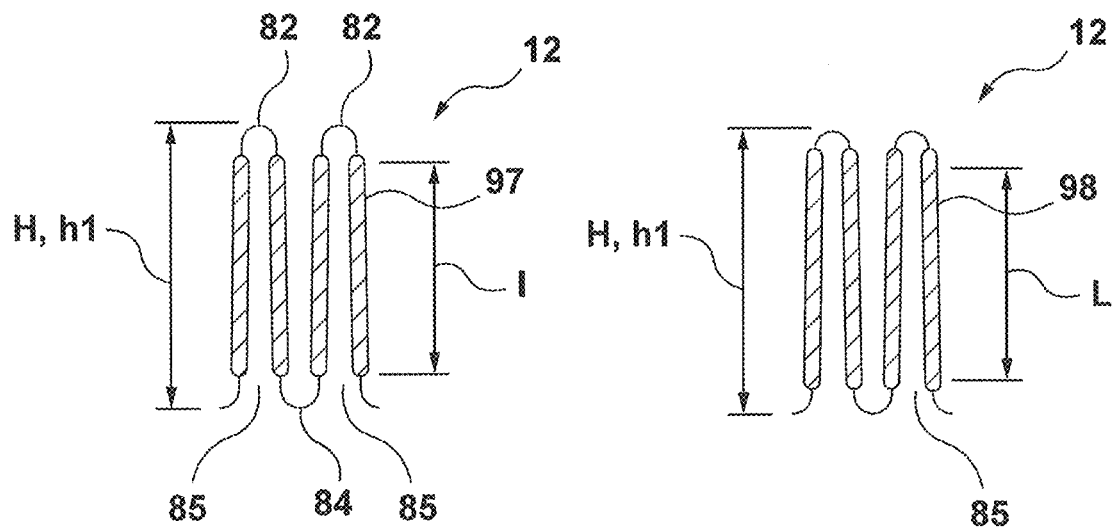
FIG. 27 is an end view of a portion of the heat transfer surface of FIG. 26 showing the heat transfer augmenting louvers.
FIG. 28 is an end view of a portion of the heat transfer surface of FIG. 26 showing the heat transfer reducing louvers.

In another, non-limiting example embodiment, for instance as shown in FIGS. 26-28, the overall height, h1, defined by the corrugation 80 taken along an axis that extends normal to the surface on which the heat transfer surface 12 is disposed is about 11.00±0.05 mm, the height, h1, corresponding to the vertical or substantially vertical distance between the upper web portion 82 and the lower web portion 84 with the length, L, of the long louvers or the heat transfer augmenting louvers 98 being about 9.00 mm and the length, l, of the short louvers or the heat transfer reducing louvers 97 being about 8.30 mm. In the subject, non-limiting example embodiment the heat transfer surface 12 includes a corrugated member having about 17 fpi (fins per inch) with the angle of both the heat transfer augmenting louvers 98 and the heat transfer reducing louvers 97 relative the plane of the fin surface portion 86 being about 33°+0°−3°.

In any of the above described example embodiments, it will be understood that the heat transfer surface 12 may include a single heat transfer surface that occupies the fluid flow passage 14, or each individual fluid flow passage portion 14(n), of the heat exchanger 10 with the heat transfer augmenting zones 48 and the heat transfer reducing zones 46 being integrally formed within the single heat transfer surface 12. In other example embodiments, rather than providing a single heat transfer surface 12 that includes both heat transfer augmenting zones 48 and heat transfer reducing zones 46, whether those be in the form of more aggressive corrugated regions interposed with less aggressive corrugated regions as shown in FIG. 7, or whether those be in the form of a louvered heat transfer surface with both short louvers and long louvers, as shown for instance in FIGS. 19-28, the heat transfer surface may also be in the form of heat transfer surface portions 12(n) that are arranged in series along the longitudinal axis X-X of the fluid flow passage 14 (or fluid passage portions 14(n)) as shown schematically in FIG. 40. Therefore, in some example embodiments, the heat transfer surface 12 includes a plurality of heat transfer surface portions 12 that include aggressive or heat transfer-augmenting heat transfer surface portions 12' interposed with non-aggressive or heat transfer-reducing heat transfer surface portions 12". Accordingly, when referring to the example embodiment of FIGS. 7 and 7A, for example, it will be understood that rather than providing a single heat transfer surface, independent strips or independent heat transfer surface portions 12(n) may be disposed in series wherein aggressive or heat transfer-augmenting heat transfer surface portions 12' alternate with non-aggressive or heat transfer-reducing heat transfer surface portions 12". In some embodiments, for example, each of the aggressive or heat transfer-augmenting heat transfer surface portions 12' may be the same, while each of the non-aggressive or heat transfer-reducing heat transfer surface portions 12" are also the same. In other embodiments, for example, each of the aggressive or heat transfer-augmenting heat transfer surface portions 12' may be different or specifically customized for a particular application or a particular desired heat transfer profile for the heat exchanger 10. For instance, as illustrated schematically in FIG. 7A, the first heat transfer surface portion 12(1) is a non-aggressive or heat transfer-reducing heat transfer surface portion 12" having two rows of larger, non-aggressive corrugations. The first heat transfer surface portions 12(1) is followed by a separate, independent, second heat transfer surface portion 12(2) that is an aggressive or heat transfer-augmenting heat transfer surface portion 12' having a plurality of rows of smaller, more aggressive corrugations. A third heat transfer surface portion 12(3), which is a non-aggressive heat transfer surface portion 12", includes three rows of differently sized, but overall larger corrugations, as compared to the aggressive or heat transfer-augmenting heat transfer surface portion 12', which is followed by a fourth heat transfer surface portion 12(4) that is another aggressive or heat transfer augmenting heat transfer surface portion 12' that is the same as the second heat transfer surface portion 12(2). A fifth heat transfer surface portion 12(5) is disposed adjacent the fourth heat transfer surface portion 12(4), the fifth heat transfer surface portion 12(5) being another non-aggressive or heat transfer-reducing zone 12".

In some embodiments, for example, it will be understood that the aggressive or heat transfer augmenting zones 48, whether they be part of a heat transfer surface 12 that is a unitary one-piece construction (as shown in FIG. 7 for example) or be in the form of separate or individual heat transfer surface portions 12', each heat transfer surface portion 12' may be different such that each subsequent heat transfer augmenting zone becomes more aggressive. Therefore, each heat transfer augmenting zone 48, for example, may include a different number of rows of corrugations having different lengths so as to provide more targeted heat transfer in regions associated with hotspots.

In some embodiments, for example, the heat transfer surface may also be in the form of heat transfer surface portions 12(n) that are spaced apart from each other as they are disposed along the length of the fluid flow passage 14 providing areas within the fluid flow passage that are free of heat transfer surface which provide heat transfer reducing zones 46. In some embodiments, for example, the heat transfer surface portions 12(n) may not necessarily extend across the entire width of the fluid flow passage 14 and may, instead, be sized so as to specifically target the hotspots 15 created by the electronic components 11 or heat source that is disposed on the outer surface of the heat exchanger.

Figure 19:
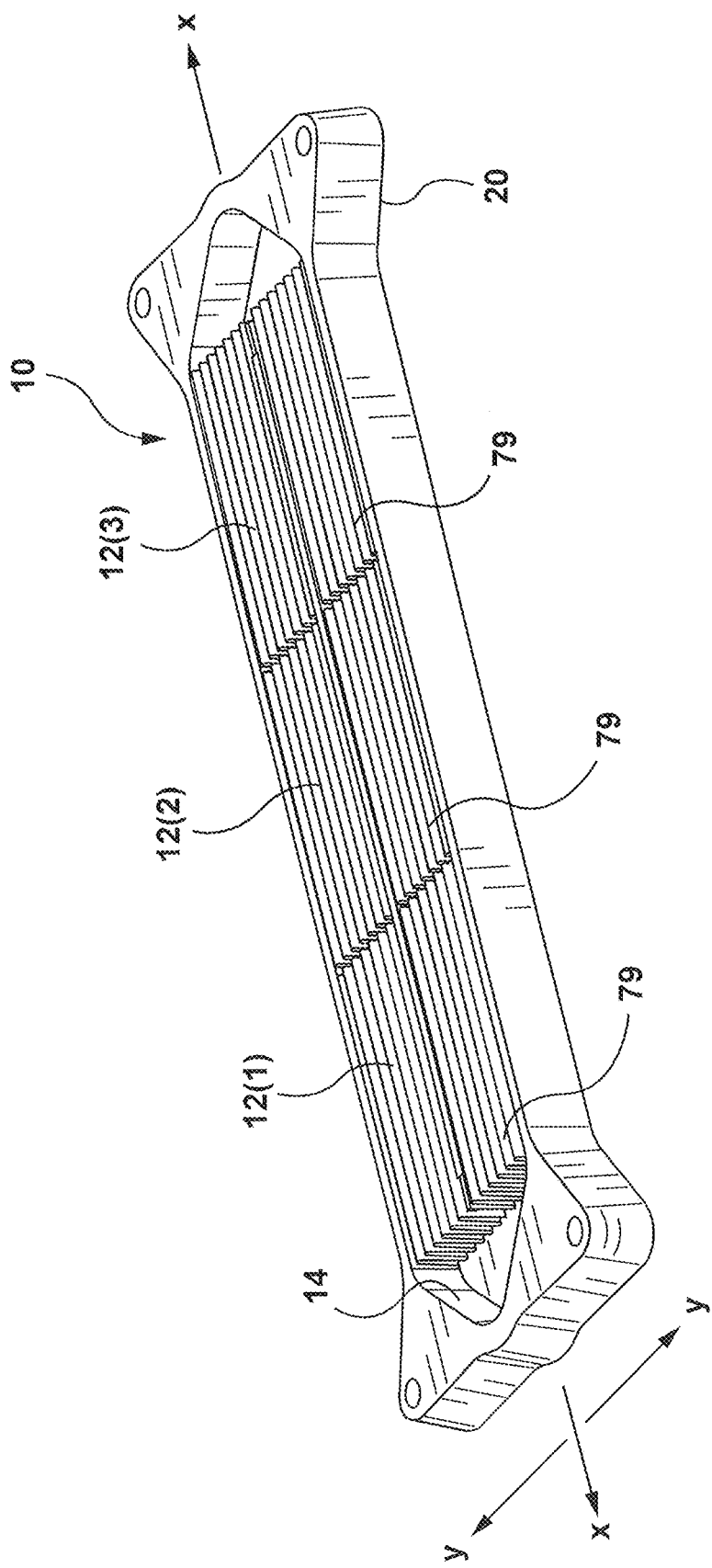
FIG. 19 is a top perspective view of a heat exchanger according to an example embodiment of the present disclosure with the top plate removed.
Figure 20:
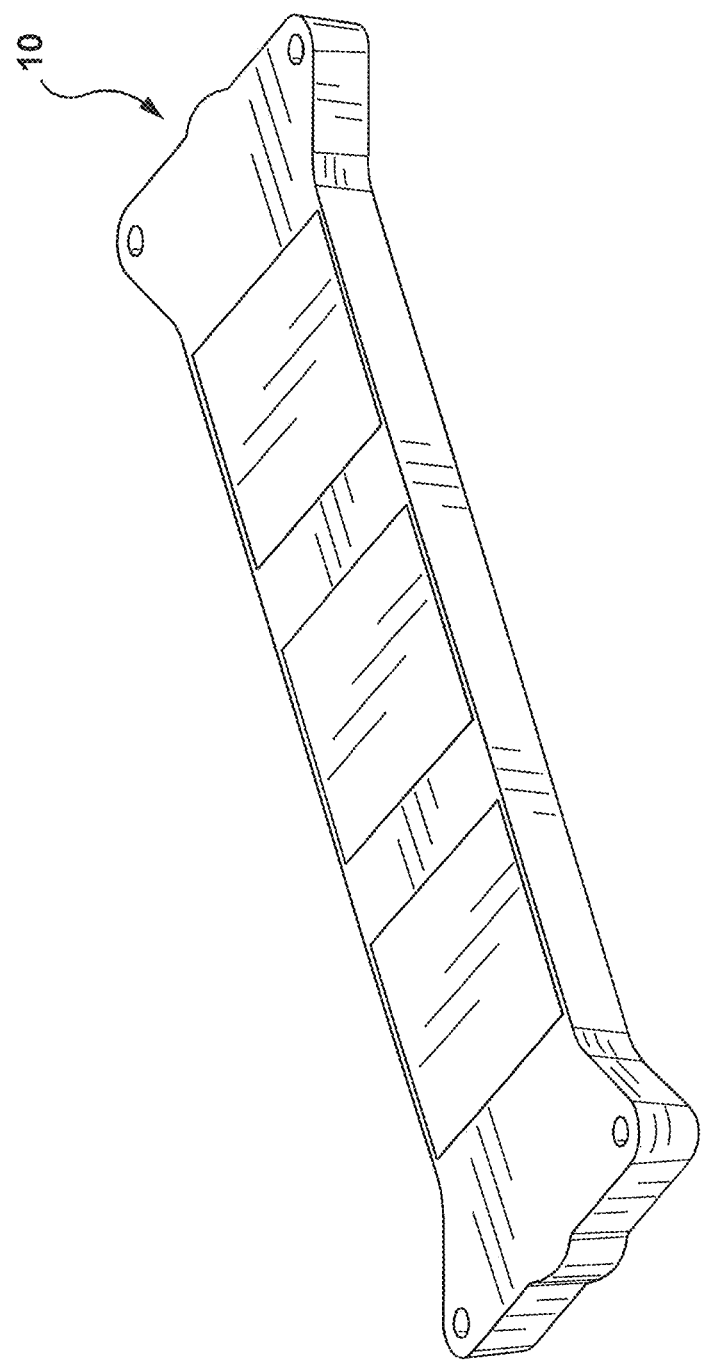
FIG. 20 is a top perspective view of the heat exchanger of FIG. 19 with the top plate mounted thereon with a schematic representation of the areas in which the electronic components are mounted thereon.
Figure 21:
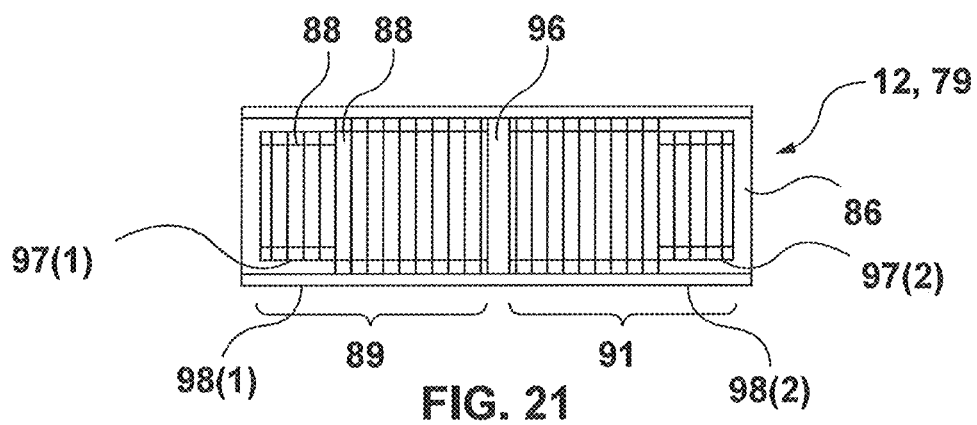
FIG. 21 is a side view of a portion of a heat transfer surface according to another example embodiment of the present disclosure.
Figure 22:
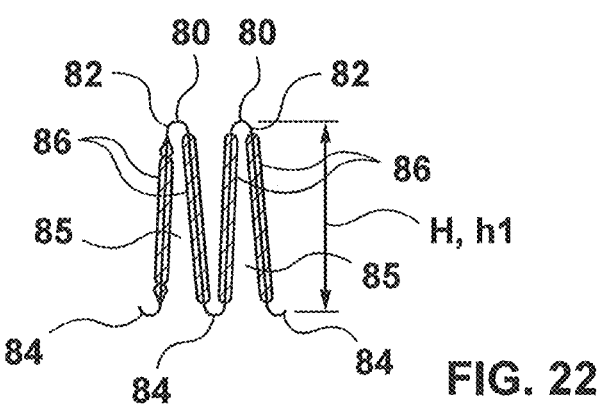
FIG. 22 is an end view of a portion of the heat transfer surface of FIG. 21.
Figure 23:
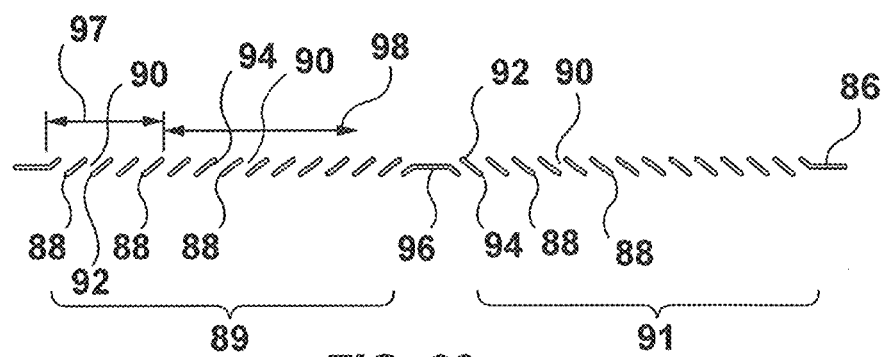
FIG. 23 is a section view of the heat transfer surface of FIG. 21 taken along section line A-A of FIG. 22.
Figure 24:
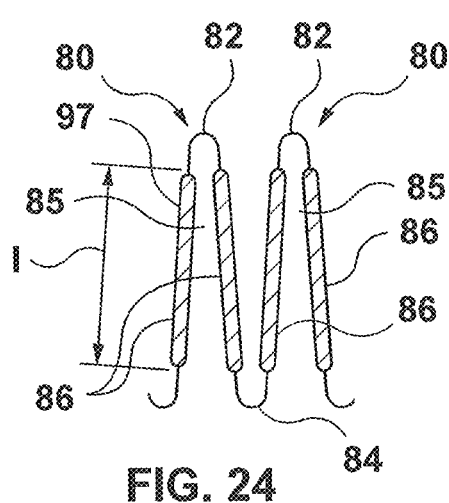
FIG. 24 is a section view of the heat transfer surface of FIG. 21 taken along section line B-B.
Figure 25:
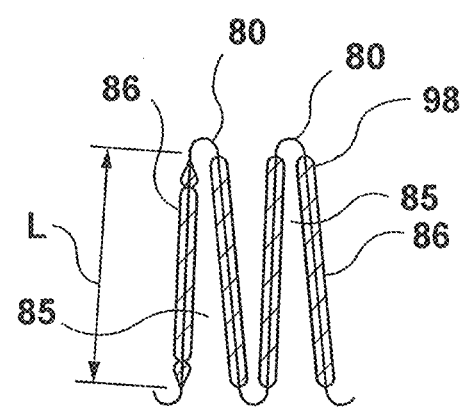
FIG. 25 is a detail end view of the heat transfer surface of FIG. 22.

Referring now to FIG. 19, there is shown an example embodiment of the louvered heat transfer surface disposed within a bottom plate of a heat exchanger 10 wherein different louvered heat transfer surfaces 12 are arranged in series within the fluid flow passage 14. For example, a less aggressive, or non-aggressive heat transfer surface portion 12(1) is disposed at the inlet end of the heat exchanger 10 while two, more aggressive or heat transfer-augmenting heat transfer surface portions 12(2), 12(3) are disposed in sequence after the first heat transfer surface portion 12(1). In the subject example embodiment, each heat transfer surface portion 12(1), 12(2), 12(3) includes both short louvers and long louvers, or heat transfer-reducing louvers 97 and heat transfer-augmenting louvers 98, although the number of overall corrugations or fins per inch (fpi) is greater in the second and third heat transfer surface passage portions 12(2), 12(3) with the dimensions and/or configurations of the heat transfer-augmenting louvers 97 and heat transfer-reducing louvers 98 also being varied to achieve the desired heat transfer profile across the heat exchanger 10.

In other embodiments, for example, the individual, separate heat transfer surface portions 12(n) include non-aggressive or heat transfer-reducing heat transfer surface portions that include only short or heat transfer-augmenting louvers 97 that are interposed with heat transfer surface portions 12(n) that include only long or more aggressive heat transfer-augmenting louvers 98 along the fluid flow passage portion 14 (or fluid flow passage portions 14(n)) which heat transfer surface portions 12(n) are arranged in a particular order in order to target the hotspots created by the electronic components disposed on the outer surface of the heat exchanger 10.

In embodiments where individual, separate heat transfer surface portions 12(n) are used, rather than a single heat transfer surface 12 that occupies the fluid flow passage of the heat exchanger 10 as well as in embodiments where a single heat transfer surface 12 is used, the heat exchanger 10 may further comprise heat transfer surface retaining features for locating, positioning and/or retaining the heat transfer surface 12 or the heat transfer surface portions 12(n) within the fluid flow passage 14 (or fluid flow passage portions 14(n)) of the heat exchanger 10 as illustrated, for example, in FIGS. 32-37. In some embodiments, the heat transfer surface retaining features include locating projections 110 that project out of the surface of the upper and/or lower first and second plates 20, 22 that form the fluid flow passage 14. The locating projections 110 project into the fluid flow passage 14 and serve as a stop against which the ends of the heat transfer surface 12 of heat transfer surface portions 12(n) abut. In some embodiments, only one of the upper and lower or only one of the first and second plates 20, 22 include locating projections 110.

Figure 29:
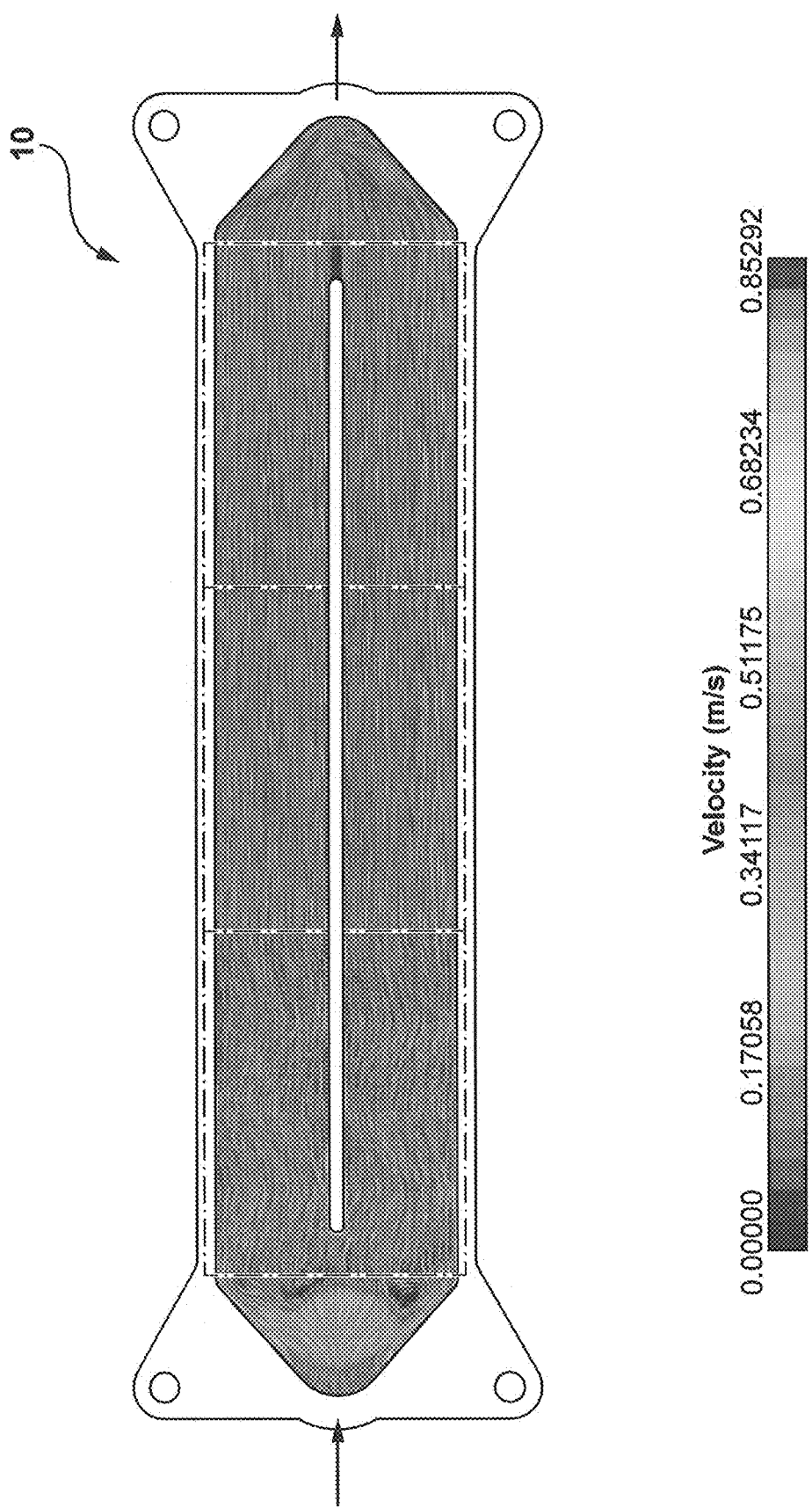
FIG. 29 is a top plan view of the heat exchanger of FIG. 19 illustrating the results of a flow distribution model for an example embodiment of the present disclosure.
Figure 30:
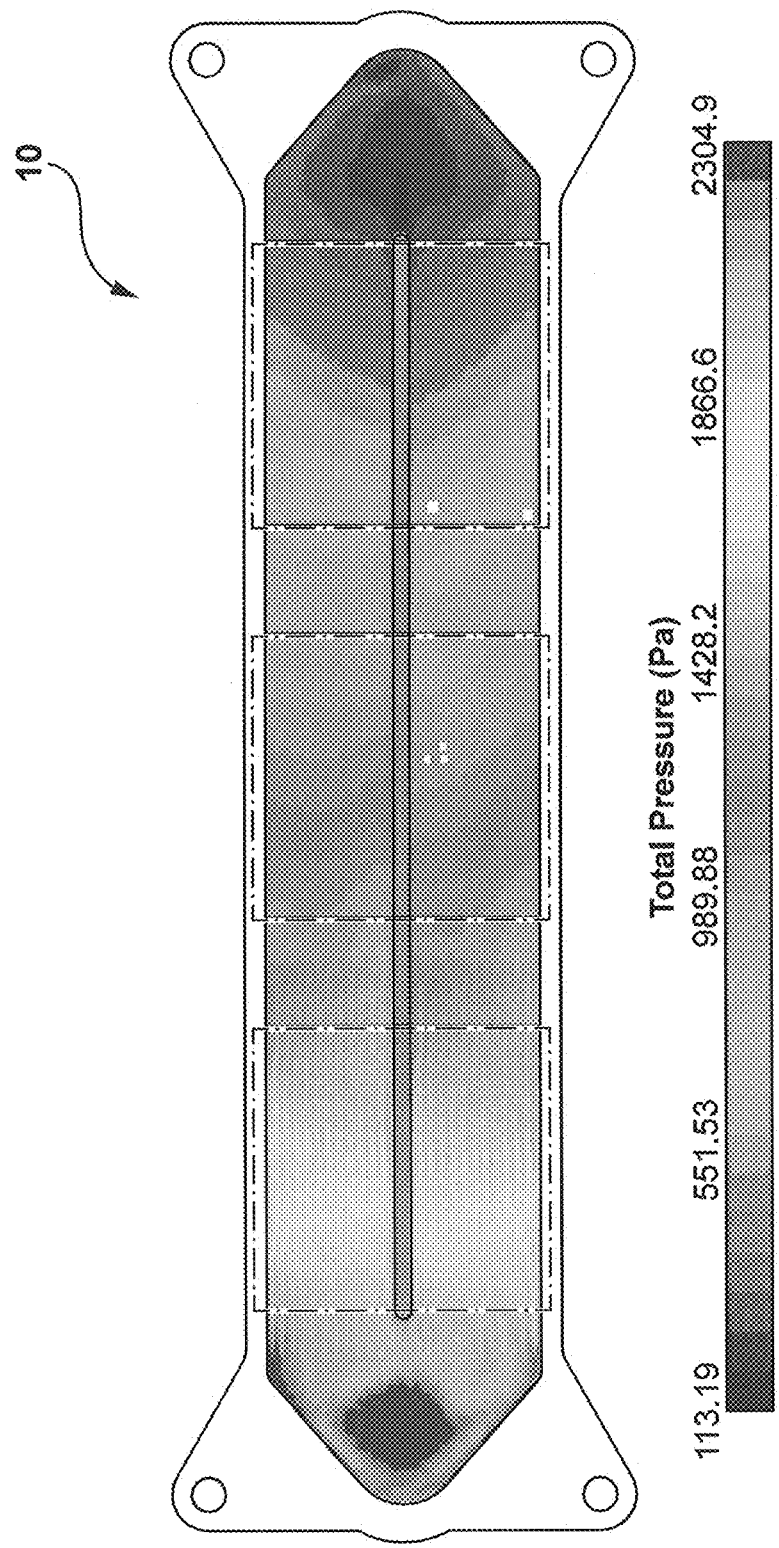
FIG. 30 is a top plan view of the heat exchanger of FIG. 19 illustrating the results of a pressure drop model for an example embodiment of the present disclosure.
Figure 31:
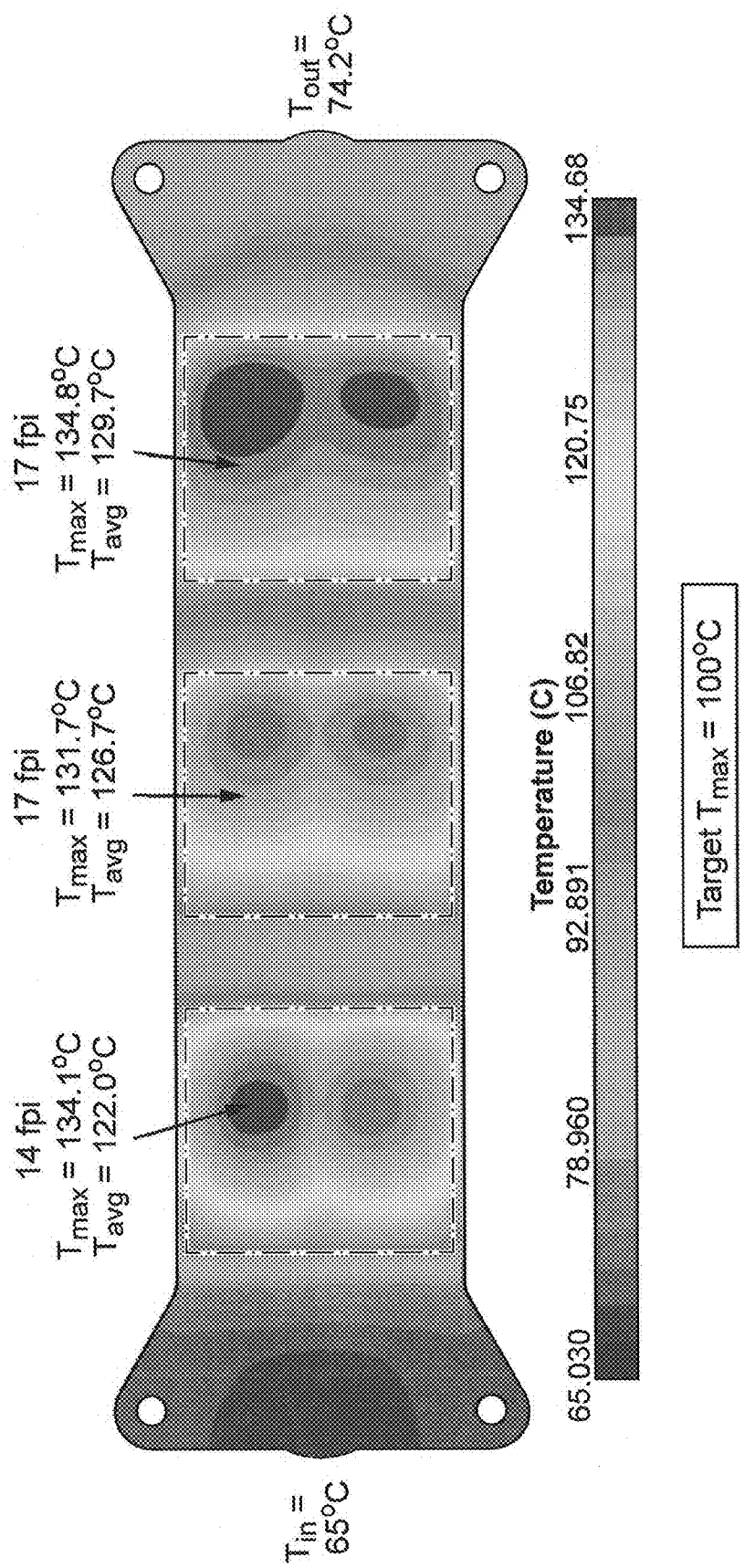
FIG. 31 is a top plan view of the heat exchanger of FIGS. 19 illustrating the results of a heat transfer profile across the top surface of the heat exchanger for an example embodiment of the present disclosure.
Figure 32:
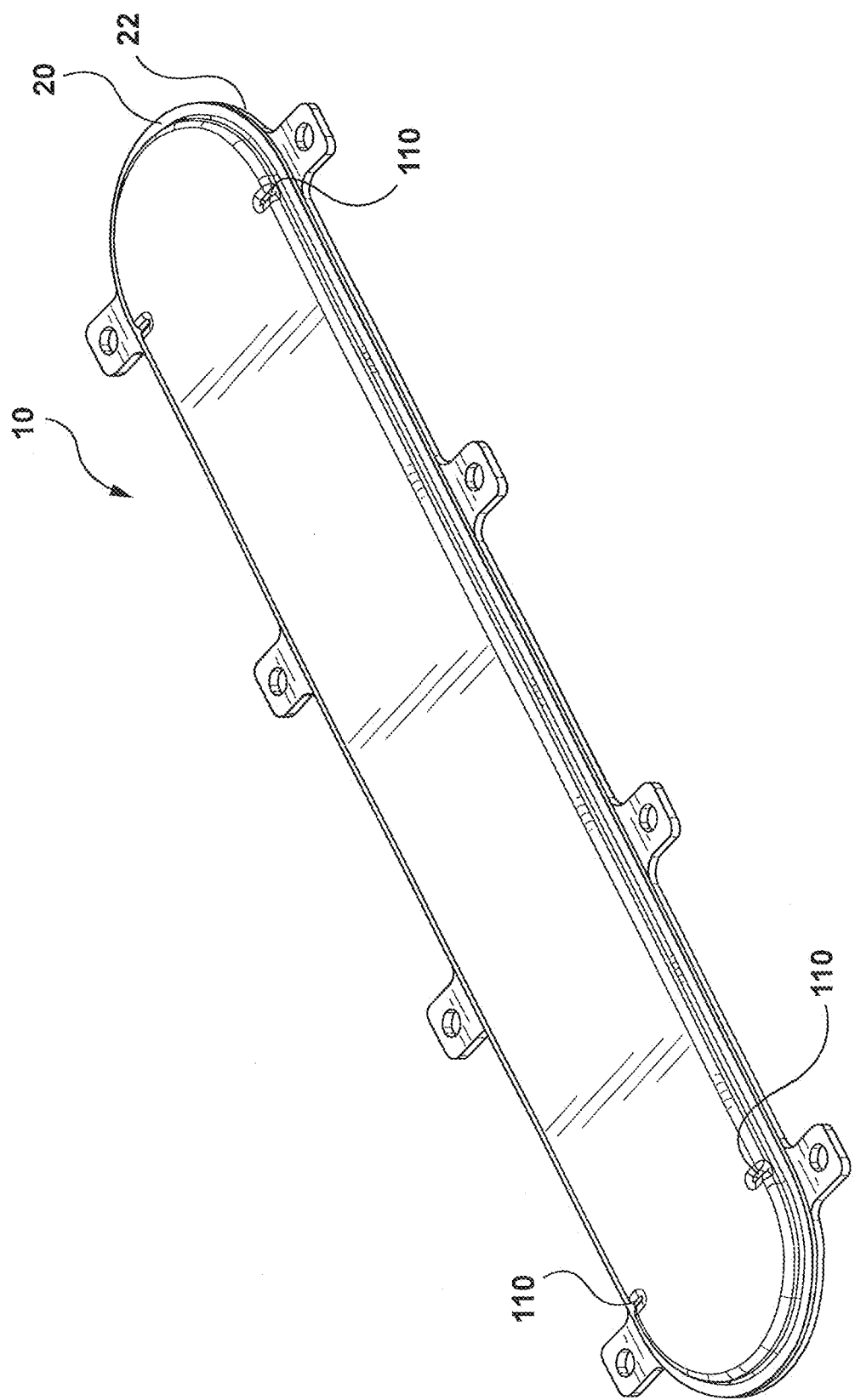
FIG. 32 is a top perspective view of a heat exchanger according to another example embodiment of the present disclosure.
Figure 33:
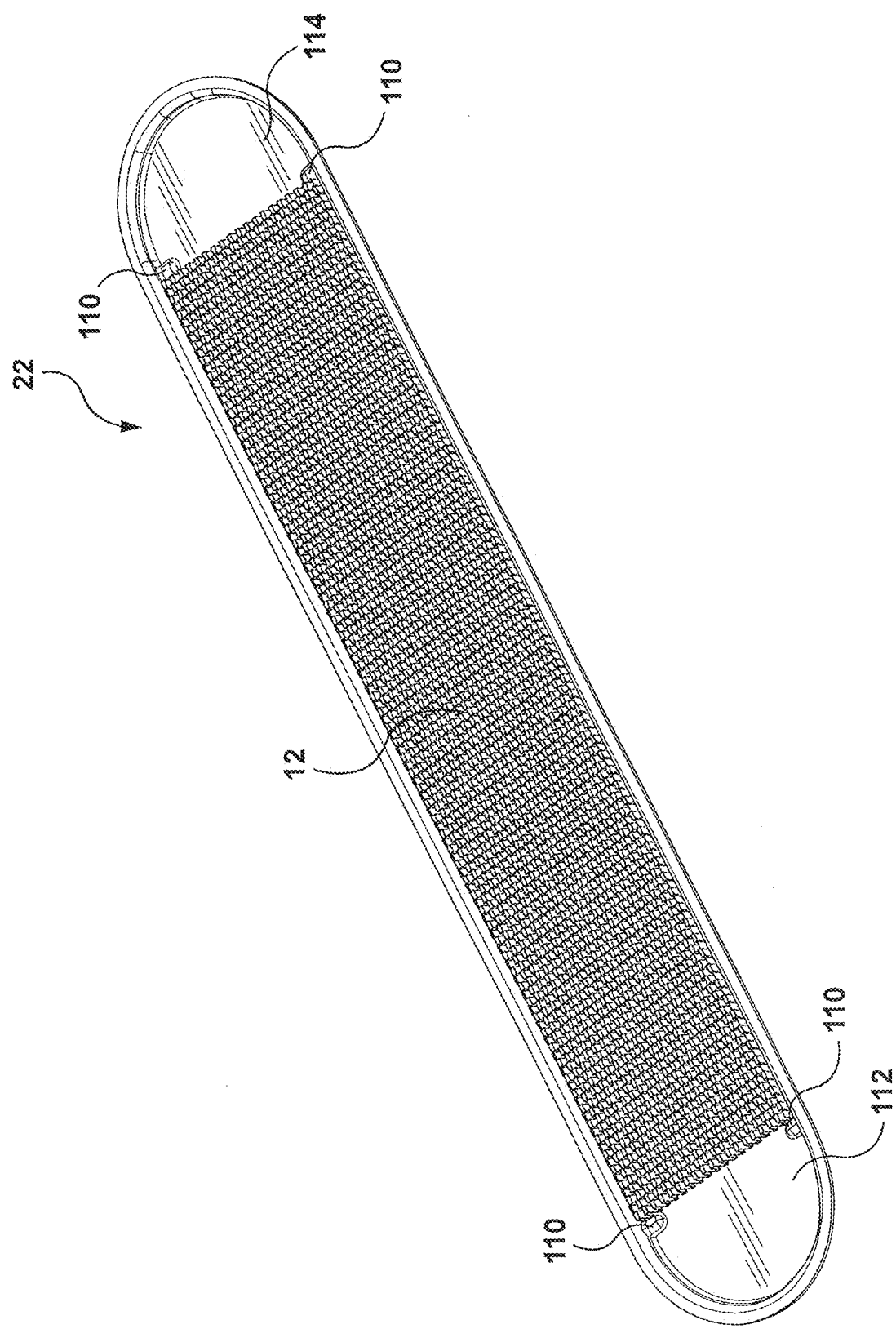
FIG. 33 is a top perspective of the heat exchanger of FIG. 32 with the top plate removed.

Referring now to FIG. 29, there is shown an example embodiment wherein corresponding pairs of locating projections 110 are disposed at respective ends of the 112, 114 of the heat exchanger 10, each locating projection 110 defining a contact surface 116 against which a portion of an end edge of the heat transfer surface 12 abuts when the heat transfer surface 12 is disposed within the fluid flow passage 14 and enclosed between the corresponding first and second plates 20, 22.

Figure 34:
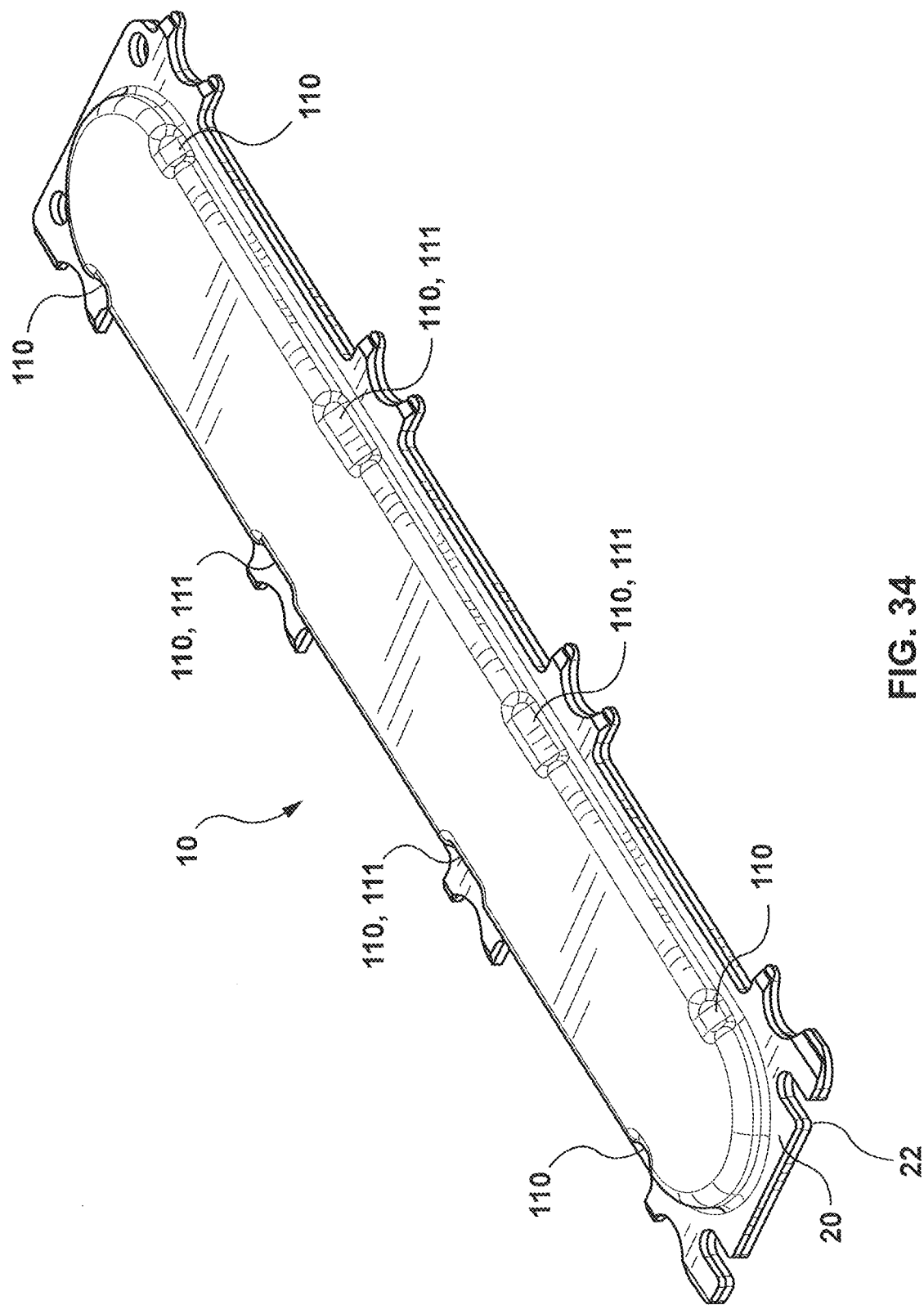
FIG. 34 is a top perspective view of a heat exchanger according to another example embodiment of the present disclosure.
Figure 35:
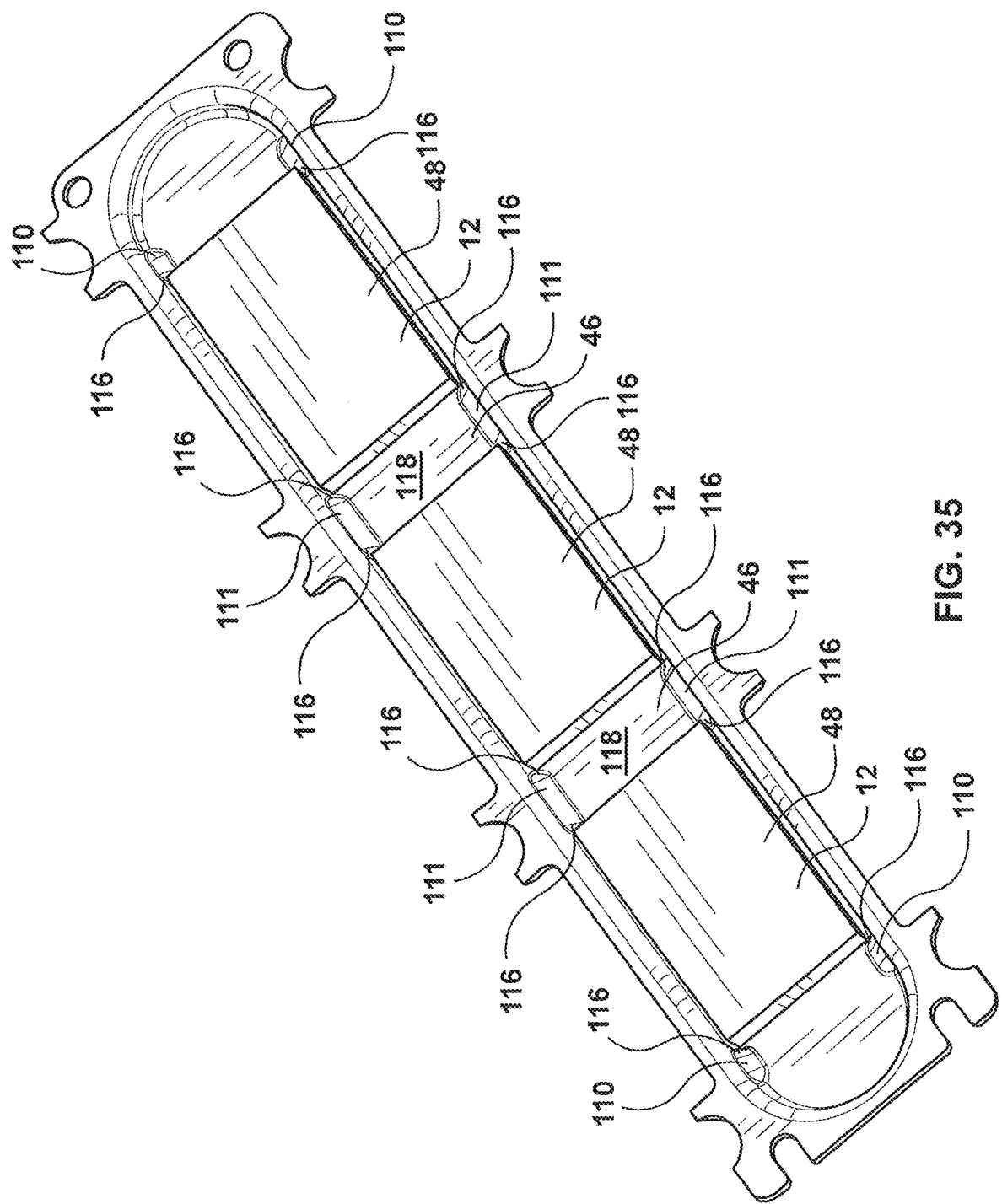
FIG. 35 is a top perspective of the heat exchanger of FIG. 32 with the top plate removed.
Figure 36:
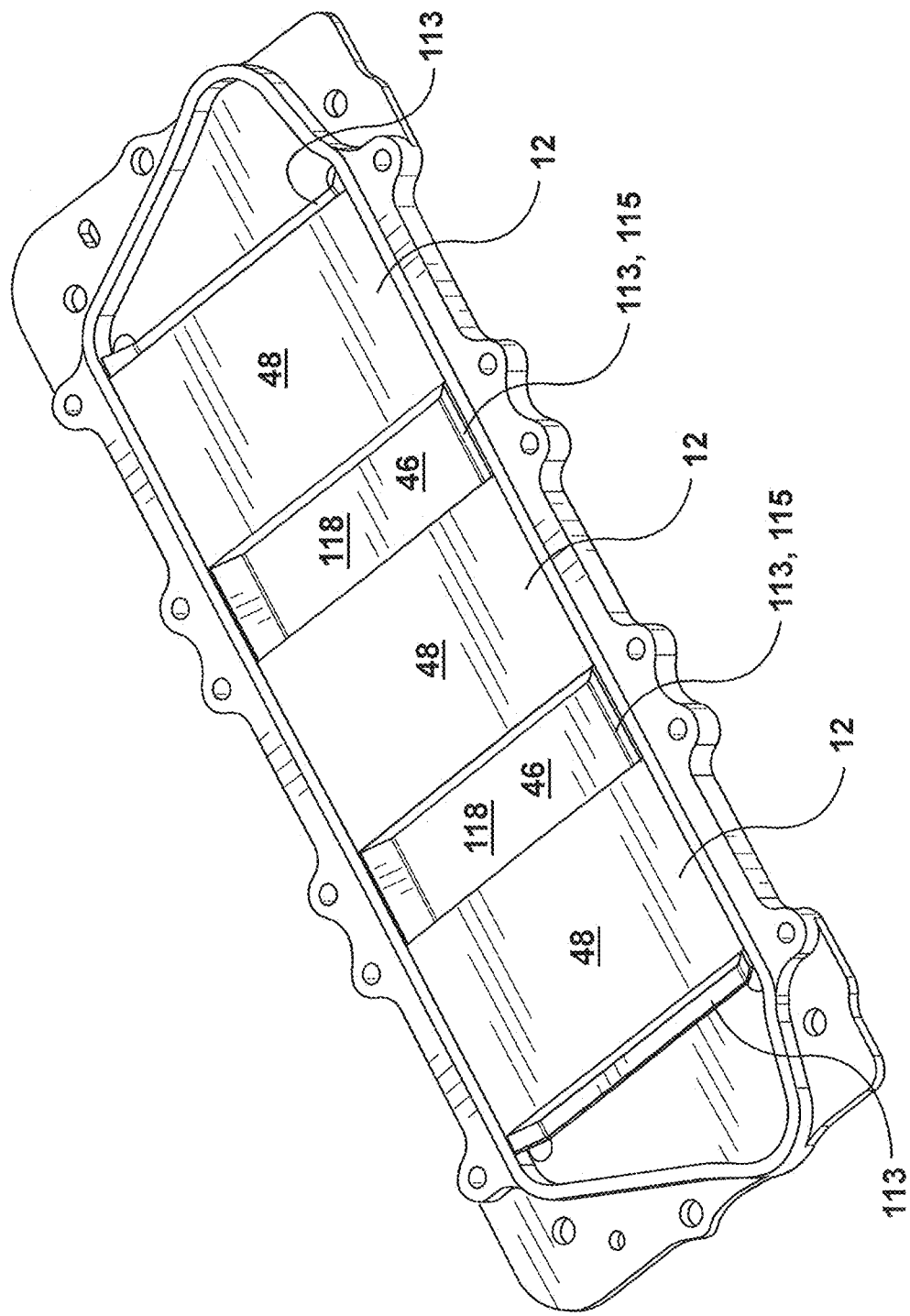
FIG. 36 is a top perspective view of a heat exchanger according to another example embodiment of the present disclosure with the top plate removed.
Figure 37:
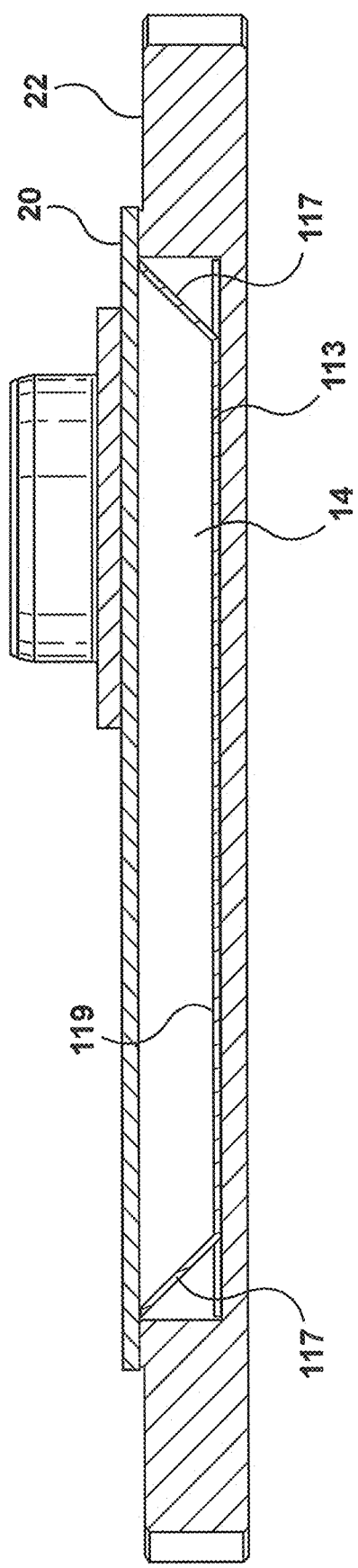
FIG. 37 is a cross-sectional view of the assembled heat exchanger of FIG. 36, with top plate taken along a transverse axis of the heat exchanger.

Referring now to FIG. 34, there is shown an example embodiment wherein a plurality of corresponding pairs of locating projections 110 are disposed at spaced apart intervals along the fluid flow passage 14 defined by the first and second plates 20, 22. In the subject example embodiments, the corresponding pairs of locating projections 110 that are disposed at opposite ends 112, 114 of the heat exchanger 10 each define a contact surface 116 against which a portion of an end edge of respective first and last heat transfer surface portions 12 abut when they are disposed in the corresponding end section of the fluid flow passage portion 14. The corresponding pairs of locating projections 111 that are disposed intermediate the end pairs of locating projections 110 each define two contact surfaces 116 against which a corresponding portion of an end edge of the corresponding heat transfer surface portion 12(n) abuts when disposed within the intermediate regions of the fluid flow passage portion 14.

In some embodiments, the length, as measured along the longitudinal axis of the fluid flow passage 14, of the locating projections 110, 111 varies between corresponding pairs of locating projections 110, 111. For instance, in the example embodiment illustrated in FIGS. 34-35, the intermediate pairs of locating projections 111 each have a length that is greater than the length of the corresponding end pairs of locating projections 110.

In some embodiments, for example, the locating projections 111 define low pressure drop zones 118 within the fluid flow passage 14 that are not occupied by or remain free of a heat transfer surface portion 12(n). Accordingly, in some embodiments, for example, the heat transfer surface portions 12(n) together with the locating projections 111 and low pressure drop zones 118 define the heat transfer augmenting zones 48 and heat transfer reducing zones 46 of the heat exchanger 10.

In some embodiments, for example, the locating features include two or more locating inserts 113 that are disposed within the fluid flow passage 14 which serve to locate the heat transfer surface 12 or heat transfer surface portions 12(n) that are disposed within the fluid flow passage 14. In the subject example embodiment, illustrated schematically in FIG. 33, the locating inserts 113 extend across the width of the fluid flow passage portion at spaced apart intervals along the fluid flow passage 14. The locating inserts 113 include angled end portions 117 interconnected by a base portion 119, the angled end portions defining contact surfaces 116 in a plane generally perpendicular to plane of the central planar area of the plate 22 against which the corresponding end edges of the heat transfer surface 12 or heat transfer surface portion 12(n) abuts. In some embodiments, for example, the angled end portions 117 extend from an upper edge of the peripheral sidewall 33 to the point on the inner surface 24 of the central planar portion 32 that is inwardly disposed relative to the peripheral sidewall 33. In some embodiments, for example, the locating inserts 113 disposed at the opposite ends 112, 114 of the heat exchanger may have different lengths, as measured along the longitudinal axis of the fluid flow passage, than the locating inserts 115 that are disposed intermediate the end locating inserts 113. As in the previously described embodiment, the intermediate locating inserts 115 may serve to define low pressure drop zones within the fluid flow passage 14 which function as the heat transfer-reducing zones 46. Therefore, it will be understood that heat transfer surfaces 12, in combination with low pressure drop zones 118, may also serve to define the heat transfer augmenting zones 48 and heat transfer reducing zones 46 so as to effect increased heat transfer across the surface of the heat exchanger 10 in contact of direct heat transfer relationship with the electronic components 11 disposed or mounted on the heat exchanger 10.

In some embodiments, for example, the retaining features 110 are cooperatively configured such that when the first and second plates 20, 22 are disposed in mating face-to-face relationship to form the fluid flow passage 14, the retaining features or projections 110 on the first plate 20 are disposed in surface-to-surface contact with the retaining features of projections 110 on the second plate 22 which provides a stiffening or strengthening effect on the heat exchanger 10, especially in response to application of external compressive forces.

Figure 41:
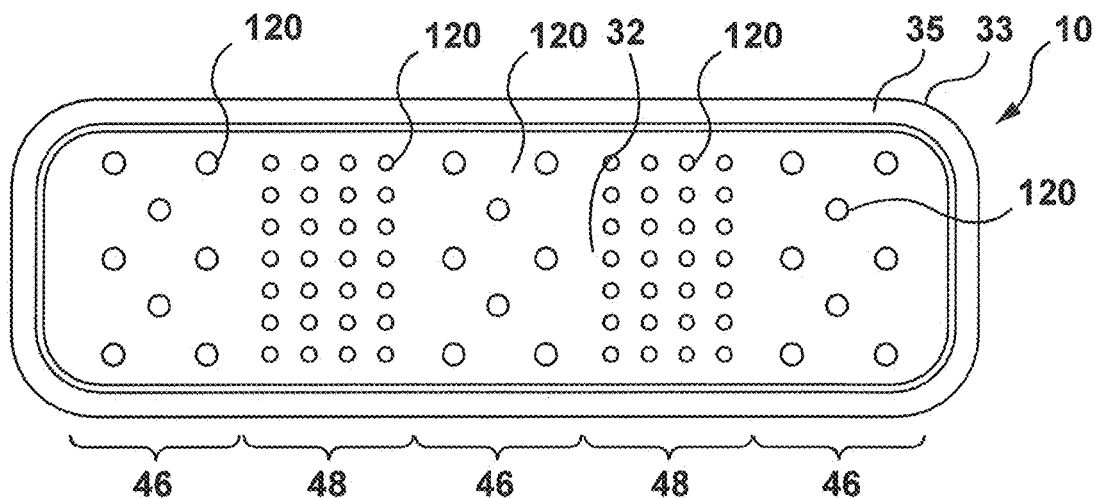
FIG. 41 is a top plan view of an example embodiment of a core plate of a heat exchanger according to another example embodiment of the present disclosure.
Figure 42:
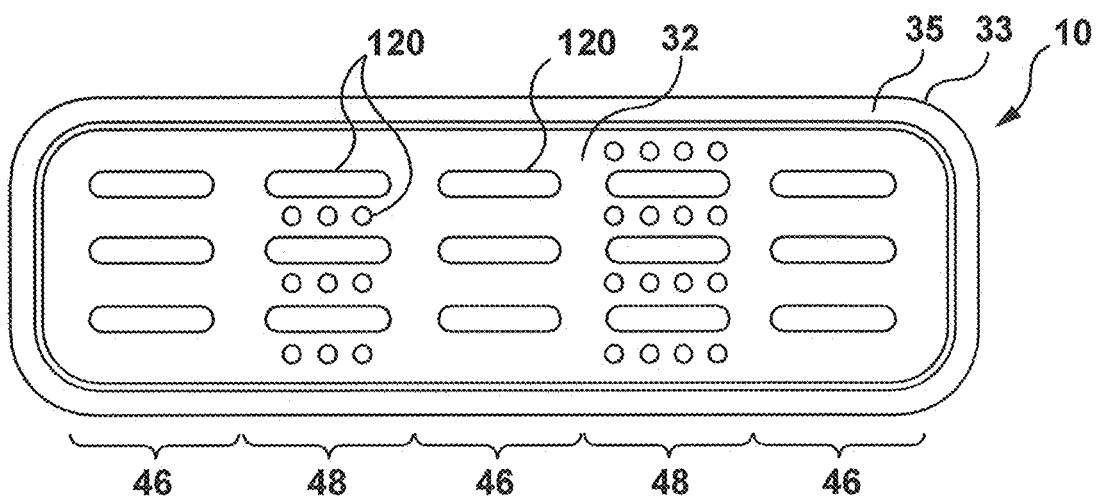
FIG. 42 is a top plan view of an example embodiment of a core plate of a heat exchanger according to another example embodiment of the present disclosure.

Referring now to FIG. 41, there is shown another example embodiment of a heat exchanger 10 having a multi-zone heat transfer surface. In this example embodiment, however, rather than having a separate heat transfer surface 12 disposed within the fluid flow channel 14, the first plate 20 or bottom plate or core plate of the heat exchanger or tubular member 10 includes a pattern of surface protrusions 120 disposed within the central, generally planar areas of the plate 20. In some embodiments, for example, both the first and second plates 20, 22 may include the surface protrusions 120 while in other embodiments it may just be the base or first plate 20 or the second plate 22. In some embodiments, for example, the surface protrusions include dimples, ribs, or triangular-shaped protrusions or any combination thereof. In such embodiments, the pattern of surface protrusions and the particular protrusions used will help to customize the fluid flow path through the fluid flow passage 14 by creating different flow dynamics within the fluid flow channel 14 thereby creating non-aggressive (or less aggressive) heat transfer reducing zones 46 interposed with more aggressive, heat transfer-augmenting zones 48 so as to target the hotspots by allowing increased heat transfer to occur in the regions directly below the electronic components 11 mounted on top of the heat exchanger 10. For instance, the less aggressive or heat transfer reducing zones 46 may include larger, more spaced-apart pattern of surface protrusions 120 while the more aggressive or heat transfer-augmenting zones 48 may include smaller, more densely arranged pattern of surface protrusions 120. In some embodiments, for example, the various heat transfer zones 46, 48 may comprise different patterns of dimples formed within the surface of the plate 20 while in other embodiments the various heat transfer zones 120 may include a pattern of spaced apart ribs within the heat transfer reducing zones 46 while the heat transfer augmenting zones include a more densely arranged pattern of a combination of dimples and ribs. As well, each heat transfer-augmenting zone may include a more densely arranged pattern of surface protrusions in order to further increase the heat transfer performance within these areas of the fluid flow channel so as to more effectively target hot spots located further downstream relative to the flow path of the heat exchanger 10. In such embodiments, the pattern of surface protrusions 120 may also serve to improve or enhance the overall stiffness and, perhaps, overall strength of the heat exchanger due to the additional points of contact between the surface protrusions 120 and the underside of the top plate 22 or between the surface projections of one plate and the corresponding surface protrusions formed on the second plate 22. The contact between the surface protrusions 120 on second plate 22 and the inner surface of the first plate or top plate 20 is also with effect that the surface protrusions 120 resist deformation of the heat exchanger 10 in response to compressive forces applied to the heat exchanger 10, as illustrated schematically in FIG. 43. The pattern in which the surface protrusions 120 are disposed across the central planar portion 32 of the heat exchanger plate may also contribute to the overall strength and stiffness of the heat exchanger 10 and its ability to withstand compressive forces applied externally to the heat exchanger 10.

Figure 43:
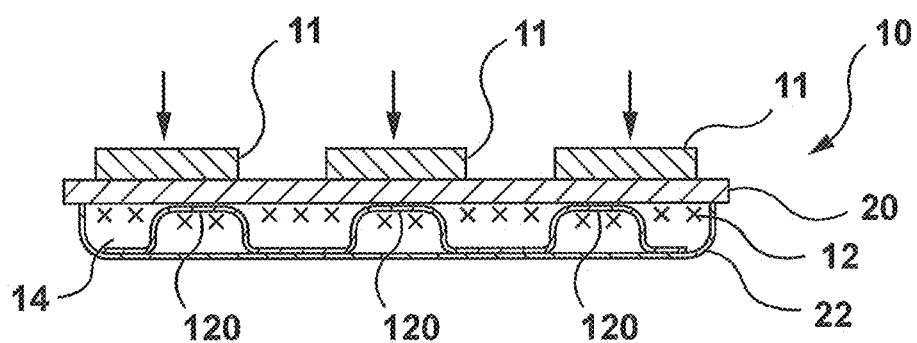
FIG. 43 is a schematic cross-sectional view taken along an axis that extends transvers to the central longitudinal axis of the heat exchanger according to another example embodiment of the present disclosure.

In some embodiments, for example, the heat exchanger 10 includes both a heat transfer surface 12 disposed within the fluid flow passage 14 formed between the mating first and second plates 20, 22 as well as surface protrusions formed along the central planar portion of the bottom or second core plate 22 as illustrated schematically in FIG. 43. In such an embodiment, the heat transfer surface 12 may have openings formed therein so that the heat transfer surface 12 can be placed over top of the surface protrusions 120 when the heat transfer surface 14 is disposed within the channel with the protrusions extending through the heat transfer surface 12. This provides another degree of variation by which the heat transfer performance within a specific region of the fluid flow channel can be varied so as to specifically target the hotspots associated with the locations of the electronic components 11 mounted on the outer surface of the heat exchanger 10.

Therefore, while various embodiments of the heat exchanger 10, and heat transfer surfaces 12 have been described, it will be understood that certain adaptations and modifications of the described embodiments can be made. Therefore, the above discussed embodiments are considered to be illustrative and not restrictive.

What is claimed is:

1. A heat exchanger, comprising:
    a fluid inlet;
    a fluid outlet
    at least one fluid flow passage defined between a pair of spaced apart walls and extending between and interconnecting the fluid inlet to the fluid outlet, the at least one fluid flow passage extending in an axial direction;
    a heat transfer surface disposed within the at least one fluid flow passage and extending in the axial direction the heat transfer surface comprising:
        a plurality of transverse rows of corrugations, each transverse row extending along an axis that extends transverse to the axial direction of the at least one fluid flow passage;
        the plurality of transverse rows arranged adjacent to one another and disposed in series, the series of the plurality of transverse rows extending in the axial direction;
        each transverse row of corrugations in the series of the plurality of transverse rows of corrugations is disposed offset relative to an adjacent transverse row of corrugations, or relative to adjacent transverse rows of corrugations, along the axis that extends transverse to the axial direction, the series of the plurality of transverse rows of corrugations therefore comprising an alternating series of offset transverse rows of corrugations;
        at least one heat transfer-reducing zone disposed in thermal contact with a portion of at least one of the spaced-apart walls of the fluid flow passage; and at least one heat transfer-augmenting zone disposed in thermal contact with a portion of the at least one of the spaced-apart walls of the fluid flow passage;

wherein:
the at least one heat transfer-reducing zone includes one or more adjacent rows of the plurality of transverse rows of corrugations;

the at least one heat transfer-augmenting zone includes one or more adjacent rows of the plurality of transverse rows of corrugation; and the corrugations in the one or more rows of the at least one heat transfer-reducing zone each have a length extending in the axial direction that is greater than a length of each of the corrugations in the one or more rows of the at least one heat transfer-augmenting zones; and while a heat exchange fluid is flowing through the at least one fluid flow passage between the inlet and the outlet, heat transfer across the portion of the at least one of the spaced apart walls disposed in thermal contact with the at least one heat transfer-augmenting zone is increased relative to heat transfer across the portion of the at least one of the spaced apart walls disposed in thermal contact with the at least one heat transfer-reducing zone.

2. The heat exchanger as claimed in claim 1, wherein:
the at least one heat transfer-reducing zone includes a plurality of heat transfer-reducing zones; and
the at least one heat transfer-augmenting zones includes a plurality of heat transfer-augmenting zones;
wherein the plurality of heat transfer-reducing zones and the plurality of heat transfer-augmenting zones are disposed in an alternating series that extends in the axial direction along the length of the at least one fluid flow passage.

3. The heat exchanger as claimed in claim 1, wherein:
the length of the corrugations in each row of the one or more rows of the plurality of transverse rows of corrugations of the at least one heat transfer-reducing zone is the same for each of the corrugations in a respective row and is also the same as the length of each of the corrugations in each other one of the one or more rows of the plurality of transverse rows of corrugations of the at least one heat transfer reducing zone.

4. The heat exchanger as claimed in claim 1, wherein:
the at least one heat transfer-reducing zone includes a plurality of transverse rows of corrugations;
for each row of the plurality of transverse rows, the length of each of the corrugations is the same for each corrugation in a respective row; and
the length of the corrugations in at least one of the plurality of transverse rows of the at least one heat transfer-reducing zone is different than the length of the corrugations in other ones of the plurality of transverse rows of the at least one heat transfer-reducing zone.

5. The heat exchanger as claimed in claim 1, wherein:
each heat transfer-augmenting zone has a number of transverse rows of corrugation; and
the length of each of the corrugations in each of the number of transverse rows of corrugations of each heat transfer-augmenting zone is the same.

6. The heat exchanger as claimed in claim 1, wherein:
each heat transfer-augmenting zone has a number of transverse rows of corrugations; and the number of transverse rows in one heat transfer-augmenting zone is different than the number of rows of corrugations in another one of the heat transfer-augmenting zones.

7. The heat exchanger as claimed in claim 6, wherein the length of each of the corrugations in each of the number of transverse rows of corrugations of each heat transfer-augmenting zone is the same.

8. The heat exchanger as claimed in claim 6, wherein the length of each of the corrugations in each of the number of transverse rows of corrugations in one heat transfer-augmenting zone is different than the length of the each of the corrugations in each of the number of rows of corrugations in another one of the heat transfer-augmenting zones.

9. The heat exchanger as claimed in claim 1, further comprising:
flow blocking zones disposed within the fluid flow passage in mating relationship with the heat transfer surface such that while a heat exchange fluid is flowing through the at least one fluid flow passage between the inlet and the outlet through the heat transfer surface, fluid flow through the flow-blocking zones is prevented, or substantially prevented.

10. The heat exchanger as claimed in claim 9, wherein:
the flow-blocking zones are spaced apart from each other transversely across the heat transfer surface and extend along the axial length of the heat transfer surface.

11. The heat exchanger as claimed in claim 10, wherein:
the flow-blocking zones include flow-blocking inserts disposed within the at least one fluid flow passage such that the flow blocking inserts are disposed within apertures defined by the corrugations of the heat transfer surface.

12. The heat exchanger as claimed in claim 11, wherein:
the flow-blocking inserts include pin fins extending from an inner surface of each of the first and second walls defining the at least one fluid flow passage.

13. The heat exchanger as claimed in claim 1, wherein the heat transfer surface comprises:
a plurality of corrugations disposed adjacent to one another in series along an axis that is parallel or substantially parallel to a transverse axis of the heat transfer surface, each corrugation extending longitudinally along an axis parallel, or substantially parallel, to a longitudinal axis of the heat transfer surface, each corrugation having a web portion and a pair of fin surface portions each of which defines a generally planar surface;
a plurality of louvers disposed within each fin surface portion of each corrugation;
wherein:
the at least one heat transfer-augmenting zone includes a group of heat transfer-augmenting louvers of the plurality of louvers, wherein the heat transfer-augmenting louvers are disposed in series, each of which has a first length defined along the plane of the fin surface portion along an axis that extends perpendicular or substantially perpendicular to the longitudinal axis of the fin surface portion;
the at least one heat transfer-reducing zone includes a group of heat transfer-reducing louvers of the plurality of louvers disposed in series, each of which has a second length defined along the plane of the fin surface portion along an axis that extends perpendicular or substantially perpendicular to the longitudinal axis of the fin surface portion;
wherein the second length is greater than the first length.

14. The heat exchanger as claimed in claim 13, wherein: the first length is at least about 80% to at least about of 90% of the second length.

15. The heat exchanger as claimed in claim 13, wherein the heat transfer surface includes:
a plurality of heat transfer augmenting zones; and
a plurality of heat transfer-reducing zones;
wherein:
the group of heat transfer-augmenting louvers in each of the heat transfer augmenting zones includes a number of heat transfer-augmenting louvers, the number of heat transfer-augmenting louvers in each group being the same; and
the group of heat transfer-reducing louvers in each of the heat transfer-reducing zones includes a number of heat transfer-reducing louvers, the number of heat transfer-reducing louvers in each group being the same;
wherein the number of heat transfer-augmenting louvers in each group of heat transfer-augmenting louvers is different than the number of heat transfer-reducing louvers in each group of heat transfer reducing louvers.

16. The heat exchanger as claimed in claim 15, wherein the number of heat transfer-augmenting louvers in each group of heat transfer-augmenting louvers is less than the number of heat transfer-reducing louvers in each group of heat transfer reducing louvers.

17. The heat exchanger as claimed in 15 wherein:
each corrugation defines a flow passage, and the heat transfer surface is disposed within the fluid flow passage such that the flow passage of each corrugation extends parallel, or substantially parallel, to a longitudinal axis of the heat exchanger.

18. The heat exchanger as claimed in claim 1, wherein the heat exchanger includes:
a plurality of heat exchanger portions arranged in side-by-side relation, each heat exchanger portion defining a single-pass, fluid flow passage portion;
wherein:
each heat exchanger portion is fluidly connected to at least an adjacent heat exchanger portion by a fluid flow passage portion connector;
the heat transfer surface includes a plurality of heat transfer surface portions such that one heat transfer surface portion is disposed in each heat exchanger portion; and
each heat transfer surface portion includes:
at least one heat transfer-reducing zone disposed in thermal contact with a portion of at least one of the spaced-apart walls of the fluid flow passage; and
at least one heat transfer-augmenting zone disposed in thermal contact with a portion of the at least one of the spaced-apart walls of the fluid flow passage.

19. The heat exchanger as claimed in claim 1, wherein the heat transfer surface includes a plurality of heat transfer surface portions disposed in series within the fluid flow passage wherein one or more of the plurality of heat transfer surface portions each define a heat transfer-reducing zone, and one or more of the plurality of heat transfer surface portions each define a heat transfer-augmenting zone, the one or more of the plurality of heat transfer surface portions that each define a heat transfer-reducing zone and the one or more of the plurality of heat transfer surface portions that each define a heat transfer-augmenting zone are disposed in an alternating series such that a heat transfer surface portion that defines a heat transfer-reducing zone is disposed adjacent to and in contact with a heat transfer surface portion that defines a heat transfer-augmenting zone.

20. The heat exchanger as claimed in claim 19, wherein the plurality of heat transfer surface portions disposed in series but are spaced apart from each other within the fluid flow passage.

21. The heat exchanger as claimed in claim 19, wherein the fluid flow passage includes heat transfer surface retaining features for locating and retaining the heat transfer surface within the fluid flow passage.

22. The heat exchanger as claimed in claim 21, wherein the heat transfer surface retaining features include corresponding pairs of projections extending into the fluid flow passage portions, each projection defining a contact surface against which a corresponding portion of an end edge of the heat transfer surface abuts while the heat transfer surface is disposed within the fluid flow passage.

23. The heat exchanger as claimed in claim 22, wherein the corresponding pairs of projections include:
a first pair of end projections disposed at one end of the fluid flow passage;
a second pair of end projections disposed at an opposite end of the fluid flow passage portion; and
corresponding pairs of intermediate projections disposed at spaced apart intervals along the length of the fluid flow passage between the first and second pairs of end projections.

24. The heat exchanger as claimed in claim 21, wherein the heat transfer surface retaining features include at least two inserts disposed within the fluid flow passageway spaced apart from each other, each insert defining a contact surface against which a corresponding portion of an end edge of the heat transfer surface abuts.

* * * * *